US008400806B2

United States Patent
Sasaki et al.

(10) Patent No.: US 8,400,806 B2
(45) Date of Patent: *Mar. 19, 2013

(54) SEMICONDUCTOR DEVICE

(75) Inventors: Toshio Sasaki, Tokyo (JP); Yoshihiko Yasu, Tokyo (JP); Takashi Kuraishi, Tokyo (JP); Ryo Mori, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/972,238

(22) Filed: Dec. 17, 2010

(65) Prior Publication Data

US 2011/0085400 A1    Apr. 14, 2011

Related U.S. Application Data

(63) Continuation of application No. 12/580,964, filed on Oct. 16, 2009, now Pat. No. 7,872,891, which is a continuation of application No. 12/016,201, filed on Jan. 17, 2008, now Pat. No. 7,623,364.

(30) Foreign Application Priority Data

Mar. 30, 2007    (JP) ................................ 2007-091365

(51) Int. Cl.
  *G11C 5/02* (2006.01)
(52) U.S. Cl. ............ 365/51; 365/63; 365/226; 257/499; 257/723
(58) Field of Classification Search .................... 365/51, 365/63, 226; 257/499, 723
  See application file for complete search history.

(56) References Cited

U.S. PATENT DOCUMENTS 5,283,717 A    2/1994    Hundt
5,693,973 A    12/1997    Nakano et al.
(Continued)

FOREIGN PATENT DOCUMENTS

JP    5-82735    4/1993
JP    6-216297    8/1994
(Continued)

OTHER PUBLICATIONS

Office Action issued Oct. 23, 2012 in Japanese Patent Application No. 2007-091365.

*Primary Examiner* — Toan Le
(74) *Attorney, Agent, or Firm* — Miles and Stockbridge P.C.

(57) ABSTRACT

A technology that makes it possible to reduce fluctuation in operating voltage for operating the circuits formed in the core region of a semiconductor device is provided. This semiconductor device is so arranged that the core region is divided into multiple functional blocks and power can be supplied and this power supply can be interrupted with respect to each of the divided functional blocks. The core region formed in the semiconductor chip is divided into multiple functional blocks. A power switch row in which multiple power switches are arranged is disposed in the boundaries between the divided functional blocks. These power switches have a function of controlling the supply of reference potential to each of functional blocks and the interruption of this supply. A feature of the invention is that reference pads are disposed directly above the power switch rows. This shortens the wires coupling together the reference pads and the power switches.

20 Claims, 39 Drawing Sheets

U.S. PATENT DOCUMENTS

| | | |
|---|---|---|
| 5,926,431 A | 7/1999 | Toda |
| 5,943,285 A | 8/1999 | Kohno |
| 6,208,546 B1 * | 3/2001 | Ikeda ............................ 365/51 |
| 6,785,143 B2 | 8/2004 | Nakaoka |
| 6,798,679 B2 | 9/2004 | Matsumoto et al. |
| 6,873,563 B2 | 3/2005 | Suwa et al. |
| 6,900,478 B2 | 5/2005 | Miyagi |
| 7,138,814 B2 | 11/2006 | Gabara et al. |
| 7,495,943 B2 * | 2/2009 | Takemura et al. ............ 365/51 |
| 7,623,364 B2 * | 11/2009 | Sasaki et al. .................... 365/51 |
| 7,872,891 B2 * | 1/2011 | Sasaki et al. .................... 365/51 |
| 2004/0246780 A1 | 12/2004 | Kawahara et al. |
| 2005/0105316 A1 | 5/2005 | Okuno |
| 2005/0200383 A1 | 9/2005 | Ogata |
| 2005/0218959 A1 | 10/2005 | Yamawaki et al. |
| 2006/0028852 A1 | 2/2006 | Satomi |
| 2007/0109831 A1 | 5/2007 | RaghuRam |
| 2009/0079465 A1 | 3/2009 | Sasaki et al. |

FOREIGN PATENT DOCUMENTS

| | | |
|---|---|---|
| JP | 8-148650 | 6/1996 |
| JP | 11-87520 A | 3/1999 |
| JP | 2003-158189 A | 5/2003 |
| JP | 2005-159348 A | 6/2005 |
| JP | 2005-259879 A | 9/2005 |
| JP | 2005-268695 A | 9/2005 |
| JP | 2005-286082 A | 10/2005 |
| JP | WO2006/114875 A1 | 11/2006 |
| JP | 2006-339252 A | 12/2006 |

* cited by examiner

US 8,400,806 B2

SEMICONDUCTOR DEVICE

CROSS-REFERENCE TO RELATED APPLICATIONS

This application is a continuation of Application Ser. No. 12/580,964 filed Oct. 16, 2009 now U.S Pat. No. 7,872,891, which is a continuation of Application Ser. No. 12/016,201 filed Jan. 17, 2008 (now U.S. Pat. No. 7,623,364). The disclosure of Japanese Patent Application No. 2007-91365 filed on Mar. 30, 2007 including the specification, drawings and abstract is incorporated herein by reference in its entirety.

BACKGROUND OF THE INVENTION

The present invention relates to semiconductor devices and in particular to a technology effectively applicable to semiconductor devices such as SOC (System On Chip).

Japanese Unexamined Patent Publication No. 2005-259879 (Patent Document 1) discloses a technique wherein the following can be implemented: a burden on layout design can be reduced when a switch is placed in a power supply line for leakage current prevention and the influence of voltage drop that occurs in the switch on signal delay can be reduced.

More specific description will be given. Multiple power supply line groups are disposed in a stripe pattern, and power is supplied to a circuit cell by multiple branch line groups branched from the power supply line groups. Power supply to the circuit cell is interrupted by a power switch cell placed in the branch line groups. For this reason, it is possible to dispersedly dispose power switch cells throughout a region where circuit cells can be disposed and elaborately carryout the interruption of power supply by a power switch cell with respect to each relatively small number of circuit cells.

Japanese Unexamined Patent Publication No. 2005-268695 (Patent Document 2) discloses a technique that provides a function of interrupting power supply to a circuit cell and yet makes it possible to make design more efficient.

More specific description will be given. Multiple power supply line groups are disposed in a vertically-striped pattern at intervals equal to or smaller than a predetermined maximum interval. Multiple branch line groups are branched from the power supply line groups and are disposed in a horizontally-striped pattern within a range from a power supply line group from which they are branched to the next power supply line group. A power switch cell for interrupting power supply from the power supply line groups to the branch line groups is disposed at branch points between the power supply line groups and the branch line groups. Circuit cells supplied with power from the branch line groups are disposed along the branch line groups.

Japanese Unexamined Patent Publication No. 2005-286082 (Patent Document 3) discloses a semiconductor chip in which a power switch controller, a switch cell, a power supply wire, a GND wire, and the like are dispersedly disposed.

Japanese Unexamined Patent Publication No. 2005-159348 (Patent Document 4) and Japanese Unexamined Patent Publication No. Hei 11 (1999)-87520 (Patent Document 5) disclose techniques for disposing a pad in a core region of a semiconductor chip.

[Patent Document 1]
Japanese Unexamined Patent Publication No. 2005-259879
[Patent Document 2]
Japanese Unexamined Patent Publication No. 2005-268695
[Patent Document 3]
Japanese Unexamined Patent Publication No. 2005-286082
[Patent Document 4]
Japanese Unexamined Patent Publication No. 2005-159348
[Patent Document 5]
Japanese Unexamined Patent Publication No. Hei 11 (1999)-87520

SUMMARY OF THE INVENTION

As one of semiconductor devices, there are those designated as SOC (System On Chip). The SOC is a semiconductor device obtained by forming a system comprised of a central processing unit (CPU), a memory, and the like over one semiconductor chip. Conventionally, system functions used to be implemented by combining multiple semiconductor chips. An implementation of system functions by one semiconductor chip is designated as SOC. The SOC is used for, for example, mobile devices. As mobile devices are evolved, reduction of the power consumption of SOCs has been increasingly demanded. To achieve reduction of the power consumption of SOCs, a technique for interrupting power supply to an unnecessary circuit has been adopted. More specific description will be given. In the SOC (semiconductor chip), a power switch is provided for each of functional blocks such as CPU and memory. Power supply to each functional block and interruption of this power supply are controlled by turning on/off these power switches. For example, when CPU is required and a memory is not, a power switch coupled to the CPU is turned on to supply power to the CPU. At the same time, a power switch coupled to the memory is turned off to interrupt power supply to the memory. By supplying power only to a required functional block and interrupting power supply to an unnecessary functional block, as mentioned above, the power consumption of the entire SOC, can be reduced. If power is supplied to an unnecessary functional block as well, a leakage current or the like, for example, is passed and power is consumed even when the functional block is not in operation. Therefore, when power supply to an unnecessary functional block is interrupted by a power switch, a leakage current or the like is not produced, and as a result, the power consumption can be reduced.

FIG. 54 is a top view illustrating a SOC (semiconductor chip), which is a technology discussed by the present inventors. In FIG. 54, the semiconductor chip CHP is rectangular, and a core region CR is formed in the central part. An I/O region IOR is formed outside the core region CR. As illustrated in FIG. 54, the core region CR is divided into, for example, a functional block A to a functional block F. For example, CPU is formed in the functional block A, and a memory is formed in the functional block B. In the boundaries between adjacent ones of the functional block A to the functional block F, there are provided power switch rows SWL comprised of multiple power switches SW. Each of the functional block A to the functional block F can be independently supplied with power by turning on the power switches SW. Power supply to each of the functional block A to the functional block F can be individually interrupted by turning off the power switches SW.

The power switches SW are coupled to either a power supply wire required for operating the CPU or the memory formed in functional blocks or a reference wire. More specific description will be given. To operate the CPU or the memory formed in the core region CR, a power supply wire for supplying power supply potential and a reference wire for supplying GND potential (reference potential) are required. By providing a power switch SW in either wire, power can be supplied to a functional block formed in the core region CR and this power supply can be interrupted.

One of common methods for supplying power supply potential or reference potential to the SOC (semiconductor chip) is as follows: externally supplied power supply potential or reference potential is supplied to the core region CR through a power supply pad VDDPD or a reference pad VSSPD provided in the semiconductor chip CHP. As illustrated in FIG. 54, power supply pads VDDPD and reference pads VSSPD are usually disposed in an I/O region IOR provided in the peripheral area of a semiconductor chip CHP. For this reason, to supply power to a functional block D, for example, it is required to couple together a reference pad VSSPD disposed in the I/O region IOR and a power switch SW formed in the functional block D through a wire. In the example illustrated in FIG. 54, a reference pad VSSPD (point P) disposed in the I/O region IOR and a power switch SW (point Q) formed in the functional block D in the core region CR are coupled together through a wire. This example is on the assumption that the power switch SW is coupled to a wire (reference wire) for supplying reference potential.

FIG. 55 is a sectional schematic diagram illustrating a section of the area between point P and point Q in FIG. 54. As illustrated in FIG. 55, the reference pad VSSPD and the functional block D are coupled together through a wire, and the power switch SW is provided in proximity to a boundary of the functional block D. The wiring resistance of a wire coupling the reference pad VSSPD (point P) to the upper part (point Q) of the power switch SW will be taken as resistance R0, and the wiring resistance of a wire coupling the point Q to the power switch SW in the vertical direction will be taken as resistance R2. Further, the wiring resistance of a wire coupling the power switch SW to the central part of the functional block D will be taken as resistance R1. At this time, the resistance R0 is higher than the resistance R1 and the resistance R2. More specific description will be given. Since the distance between the reference pad VSSPD (point P) positioned in the peripheral area of the semiconductor chip CHP and the upper part (point Q) of the power switch SW positioned in the central part of the semiconductor chip CHP is larger, the resistance R0 is higher.

When the resistance R0 becomes higher, a voltage drop (power supply drop) that occurs when reference potential is supplied to the functional block D poses a problem. As an example, it will be assumed that the size of the semiconductor chip CHP is approximately 10 mm square. The distance between the reference pad VSSPD (point P) disposed in the peripheral area (I/O region IOR) of the semiconductor chip CHP and the power switch SW (point Q) disposed in the central area (core region CR) of the semiconductor chip CHP is larger. Therefore, the resistance R0 of the wire is, for example, approximately 200 mΩ. If the current passed between power supply potential and reference potential in the functional block D in operation is 100 mA, the voltage drop that occurs when reference potential is supplied to the functional block D is approximately 20 mV. The functional block D is also supplied with power supply potential, and the wire for supplying power supply potential is also drawn from the I/O region IOR of the semiconductor chip CHP. Therefore, the resistance of the wire for supplying power supply potential takes substantially the same value as the above-mentioned resistance R0. In the functional block D, consequently, a voltage drop (approximately 20 mV) arising from the wiring for supplying reference potential and a voltage drop (approximately 20 mV) arising from the wire for supplying power supply potential occur. Thus, a voltage drop of approximately 40 mV in total occurs. The power supply voltage, which is the difference between power supply potential and reference potential, is approximately 1.2V. The circuits formed in the core region CR operate on this power supply voltage of approximately 1.2V. A certain margin is allowed for coping with fluctuation in power supply voltage, and ±0.1V of power supply voltage of approximately 1.2V is established as an allowable range. As mentioned above, the voltage drop arising from the wire between the functional block D and the I/O region IOR is as large as approximately 40 mV, and it accounts for as much as 40% of the allowable margin (±0.1V). Since voltage fluctuation is also caused by any other phenomenon than mentioned above, a voltage drop counting for 40% is problematic. More specific description will be given. If voltage fluctuation exceeds the allowable range, operation failure of a circuit formed in the functional block D is incurred and this degrades the reliability of the semiconductor device. Especially, the operating voltages of the circuits formed in the core region CR tend to drop. When operating voltage drops, the influence of voltage fluctuation due to the above-mentioned voltage drop is increased.

It is an object of the invention to provide a technology with which fluctuation in operating voltage for operating the circuits formed in a core region can be reduced in the following semiconductor device: a semiconductor device in which the core region is divided into multiple functional blocks and reduction of power consumption can be achieved by supplying power and interrupting this power supply with respect to each of the divided functional blocks.

The above and further objects and novel features of the invention will appear from the description in this specification and the accompanying drawings.

The following is a brief description of the gist of the representative elements of the invention laid open in this application.

A semiconductor device of the invention includes a semiconductor chip having a core region and an input/output region formed outside the core region. In the core region, there are formed at least an operation part and a memory for holding data from the operation part. In the input/output region, there is formed an input/output circuit for inputting/outputting data between the operation part or the memory formed in the core region and an external source. The semiconductor chip includes: (a) a first wire for supplying power supply potential to the operation part and the memory; (b) a second wire for supplying a potential lower than the power supply potential to the operation part; (c) a third wire for supplying a potential lower than the power supply potential to the memory; and (d) a reference wire for supplying reference potential. Further, it includes: (e) a first switch for electrically coupling and decoupling the second wire and the reference wire; (f) a second switch for electrically coupling and decoupling the third wire and the reference wire; (g) multiple first pads electrically coupled with the first wire; and (h) multiple second pads electrically coupled with the reference wire. The first pads and the second pads are formed in the core region, and the first switch and the second switch are also formed in the core region.

The following is a brief description of the gist of the effects obtained by the representative elements of the invention laid open in this application.

Power supply pads for supplying power supply potential and reference pads for supplying reference potential are formed in a core region of a semiconductor chip. The core region is divided into multiple functional blocks, and power switches are provided for supplying power to each of the divided functional blocks and interrupting this power supply. These power switches are also formed in the core region. For example, the reference pads for supplying reference potential and the power switches are electrically coupled together. Since both the reference pads and the power switches are disposed in the core region, the resistance of wires coupling the reference pads and the power switches can be reduced. Since the resistance of the wires coupling the reference pads and the power switches can be reduced, a voltage drop that occurs between the reference pads and the power switches can be reduced. Therefore, fluctuation in the operating voltage of the semiconductor chip can be reduced, and thus the reliability of the semiconductor chip can be enhanced.

DETAILED DESCRIPTION OF THE PREFERRED EMBODIMENTS

In the following description, each embodiment will be divided into multiple sections or embodiments if necessary for the sake of convenience. Unless explicitly stated otherwise, they are not unrelated to one another, and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies, and the number may be above or below that specific number.

In the following description of embodiments, needless to add, their constituent elements (including elemental steps and the like) are not always indispensable unless explicitly stated otherwise or they are obviously indispensable in principle.

Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

In every drawing for explaining embodiments of the invention, identical members will be marked with identical numerals or codes, and the repetitive description thereof will be omitted. The drawings may be hatched to make them more understandable even though they are plan views.

(First Embodiment)

Description will be given to a semiconductor device in a first embodiment with reference to drawings. The semiconductor device in the first embodiment is SOC (System On Chip) obtained by forming a system in one semiconductor chip.

Figure 1:
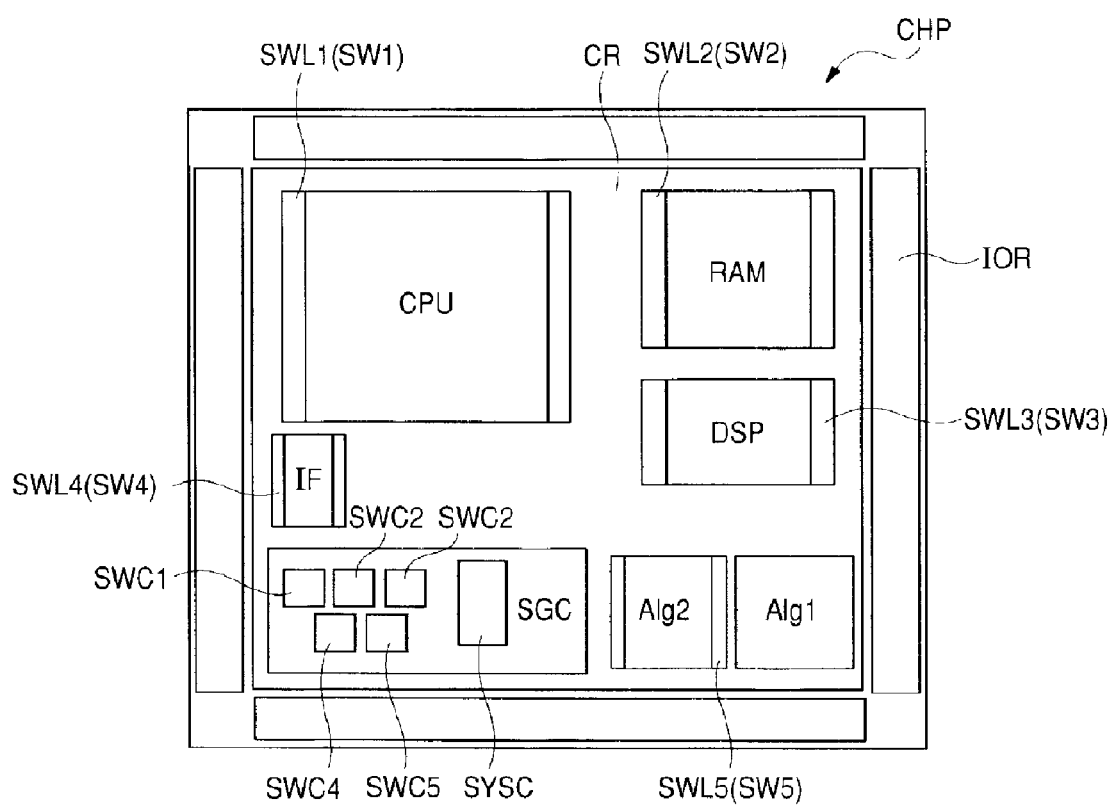
FIG. 1 is a drawing illustrating the blocks in a semiconductor chip of the invention.

FIG. 1 illustrates blocks in the semiconductor chip CHP as SOC. As illustrated in FIG. 1, the semiconductor chip CHP is rectangular, and has an I/O region IOR formed in its peripheral area and a core region CR formed inside the I/O region IOR.

In the I/O region IOR, the following are formed: an input/output circuit for exchanging data between the circuits formed in the core region CR and a source external to the semiconductor chip CHP; a level shifter circuit for conversion between 3.3V-power supply (VCC power supply) and 1.2V-power supply (VDD power supply); and the like. The input/output circuit operates on, for example, 3.3V-power supply, and the level shifter circuit is configured to use 3.3V-power supply and 1.2V-power supply.

In the core region CR, there are arranged circuits forming a system. As illustrated in FIG. 1, for example, the following are formed in the core region CR: an operation part CPU, a memory RAM, a processor DSP, an interface circuit IF, a non-blocked circuit SGC, a system controller SYSC, power switch controllers SWC1 to SWC5, analog circuits Alg1, Alg2, and the like. Of the circuits formed in the core region CR, the operation part CPU, memory RAM, processor DSP, interface circuit IF, non-blocked circuit SGC, and the like operate on 1.2V-power supply. The system controller SYSC, power switch controllers SWC1 to SWC5, analog circuits Alg1, Alg2, and the like formed in the core region CR operate on 3.3V-power supply.

In the core region CR, the functional blocks for the operation part CPU, memory RAM, processor DSP, interface circuit IF, non-blocked circuit SGC, system controller SYSC, power switch controllers SWC1 to SWC5, analog circuits Alg1, Alg2, and the like are formed in different regions. A system is formed by combining these functional blocks. The functional blocks forming the system are classified into functional blocks that need be constantly operated and functional blocks that need not be constantly operated. The functional blocks that need not be constantly operated are provided with power switches SW1 to SW5 for supplying power and interrupting this power supply. For example, a functional block forming the operation part CPU is provided with a power switch SW1, and a functional block forming the memory RAM is provided with a power switch SW2. Further, a functional block forming the processor DSP is provided with a power switch SW3, and a functional block forming the interface circuit IF is provided with a power switch SW4. A functional block forming the analog circuit Alg2 is provided with a power switch SW5. As these power switches SW1 to SW5 provided in the functional blocks, multiple switches are formed in each functional block and they form power switch rows SWL1 to SWL5. Meanwhile, for example, the non-blocked circuit SGC, system controller SYSC, power switch controllers SWC1 to SWC5, and analog circuit Alg1 need be constantly operated; therefore, they are not provided with a power switch for interrupting power supply.

The semiconductor chip CHP in the first embodiment is arranged as mentioned above. Hereafter, brief description will be given to the functions of each functional block formed in the core region CR. The operation part CPU has a function of controlling each functional block and a function of computing or processing data. The memory RAM stores data and programs, and the processor DSP is a special microprocessor tailored to voice and image processing. The interface circuit IF is a functional block for transmitting and receiving data, and the non-blocked circuit SGC is a functional block comprised of a real time clock (RTC) generation circuit, a system monitoring circuit, and the like. The analog circuit Alg1 and the analog circuit Alg2 are functional blocks for analog signal processing. The analog circuit Alg2 need not be constantly operated, and the analog circuit Alg1 need be constantly operated. The system controller SYSC has a function of controlling the power switch controllers SWC1 to SWC5, and the power switch controllers SWC1 to SWC5 have a function of controlling turn-on/off of the power switches SW1 to SW5. The one system is formed by combining the functional blocks comprised as mentioned above.

Figure 2:
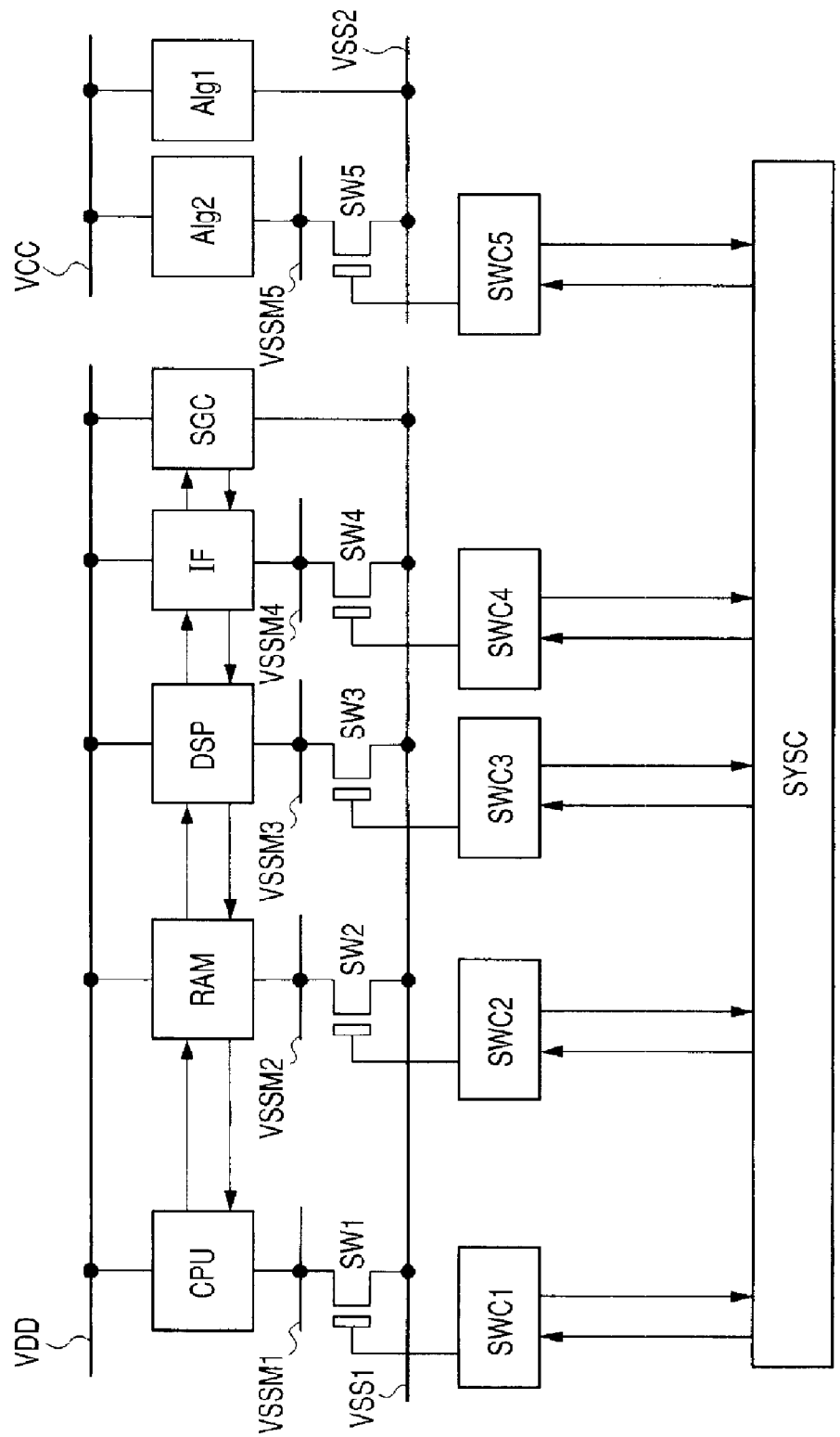
FIG. 2 is a block diagram illustrating the relation of coupling between each functional block and power switches formed in a core region.

Description will be given to the relation of coupling between each functional block and the power switches formed in the core region CR. FIG. 2 is a block diagram illustrating the relation of coupling between each functional block and the power switches formed in the core region CR.

As illustrated in FIG. 2, for example, the operation part CPU, memory RAM, processor DSP, interface circuit IF, and non-blocked circuit SGC are coupled with a power supply wire VDD for supplying 1.2V-power supply potential (VDD potential). The operation part CPU is coupled with a wire VSSM1 for supplying a potential lower than VDD potential. Similarly, the memory RAM is coupled with a wire VSSM2 for supplying a potential lower than VDD potential, and the processor DSP is coupled with a wire VSSM3 for, supplying a potential lower than VDD potential. Further, the interface circuit IF is coupled with a wire VSSM4 for supplying a potential lower than VDD potential. The power supply wire VDD is common to the operation part CPU, memory RAM, processor DSP, interface circuit IF, and non-blocked circuit SGC. Meanwhile, the wires VSSM1 to VSSM4 are independent of one another. The wires VSSM1 to VSSM4 are respectively coupled to a reference wire VSS1 for supplying reference potential (0V-potential, ground potential) through the power switches SW1 to SW4. The non-blocked circuit SGC is coupled directly with the reference wire VSS1 without the intervention of a power switch.

The analog circuit Alg1 and the analog circuit Alg2 are coupled with a power supply wire VCC for supplying 3.3V-power supply potential (VCC potential). The analog circuit Alg2 is coupled with a wire VSSM5 for supplying a potential lower than VCC potential, and this wire VSSM5 is coupled to a reference wire VSS2 for supplying reference potential through the power switch SW5. The analog circuit Alg1 is coupled directly to the reference wire VSS2 without intervention of the wire VSSM5 or the power switch SW5.

The power switches SW1 to SW5 are comprised of, for example, an n-channel field effect transistor (n-type MISFET (Metal Insulator Semiconductor Field Effect Transistor)). The drain regions of the n-type MISFETs are respectively coupled to the wires VSSM1 to VSSM5, and the source regions of the n-type MISFETs are coupled to the reference wire VSS1, VSS2. The gate electrode of each n-type MISFET forming the power switches SW1 to SW5 is coupled to the respective power switch controllers SWC1 to SWC5, and the individual power switch controllers SWC1 to SWC5 are coupled to the system controller SYSC.

As mentioned above, the circuits, such as the operation part CPU, memory RAM, processor DSP, interface circuit IF, and analog circuit Alg2, that need not be constantly operated are provided with the wires VSSM1 to VSSM5. These wires VSSM1 to VSSM5 are coupled to the reference wire VSS1, VSS2 through the power switches SW1 to SW5. Meanwhile, the circuits, such as the non-blocked circuit SGC and the analog circuit Alg1, that need be constantly operated are coupled directly with the reference wire VSS1, VSS2 without intervention of a power switch. With respect to the circuits that need not be constantly operated, the above formation makes it possible to supply power and interrupt this power supply on a functional block-by-functional block basis. Therefore, the power consumption of the semiconductor chip CHP can be reduced. Hereafter, description will be given to the operation of supplying power and interrupting this power supply on a functional block-by-functional block basis.

In the following description, a case where power is supplied to the operation part CPU to bring it into operational state will be taken as an example. When an instruction to turn on the power switch SW1 is outputted from the system controller SYSC to the power switch controller SWC1, the power switch controller SWC1 applies a High-level signal to the gate electrode of the power switch SW1. This turns on the n-type MISFET forming the power switch SW1 and the reference wire VSS1 and the wire VSSM1 are electrically coupled together. For this reason, reference potential is supplied to the wire VSSM1. Since the power supply wire VDD coupled to the operation part CPU has VDD potential (1.2V) applied thereto, a voltage of 1.2V is applied to the operation part CPU disposed between the power supply wire VDD and the wire VSSM1. As a result, the operation part CPU is brought into operational state.

Description will be given to a case where power supply to the operation part CPU is interrupted to bring the operation part CPU into non-active state. It will be assumed that the following takes place: the operation part CPU is being supplied with VDD potential through the power supply wire VDD, and the reference wire VSS1 and the wire VSSM1 have been electrically coupled together as the result of the power switch SW1 being turned on. Since the wire VSSM1 is supplied with reference potential in this case, the operation part CPU is in operational state. It will be assumed that an instruction to turn off the power switch SW1 is outputted from the system controller SYSC to the power switch controller SWC1 in this state. Then, the power switch controller SWC1 applies a Low-level signal to the gate electrode of the power switch SW1. For this reason, the n-type MISFET forming the power switch SW1 is turned off, and the reference wire VSS1 and the wire VSSM1 are electrically decoupled from each other. Therefore, the wire VSSM1 is not supplied with reference potential anymore, and the potential of the wire VSSM1 is increased. As a result, a voltage of 1.2V is not applied to the operation part CPU disposed between the power supply wire VDD and the wire VSSM1 anymore, and the operation part CPU is brought into non-active state.

As mentioned above, power supply to the operation part CPU and interruption of this power supply can be controlled by controlling turn-on/off of the power switch SW1. The above description takes as an example a case where the operation part CPU is controlled between operational state and non-active state by the power switch SW1. However, the foregoing is the same with the memory RAM, processor DSP, interface circuit IF, and analog circuit Alg2. That is, the memory RAM, processor DSP, interface circuit IF, and analog circuit Alg2 can be controlled between operational state and non-active state by controlling turn-on/off of the power switches SW2 to SW5.

The non-blocked circuit SGC and the analog circuit Alg1 that need be constantly kept in operational state are coupled directly to the reference wire VSS1, VSS2 without intervention of a power switch. Therefore, they are constantly kept in operational state.

As mentioned above, it is possible to bring only a required circuit into operational state and keep unnecessary circuits in non-active state, and thus to reduce the power consumed in the semiconductor chip CHP to the requisite minimum. As an example, it will be assumed that it is required to bring only the operation part CPU and the memory RAM in FIG. 2 into operational state and the processor DSP, interface circuit IF, and analog circuit Alg2 are unnecessary. In this case, the power consumed in the semiconductor chip CHP can be reduced to the requisite minimum by turning on the power switch SW1 and the power switch SW2 and turning off the power switches SW3 to SW5.

Figure 3:
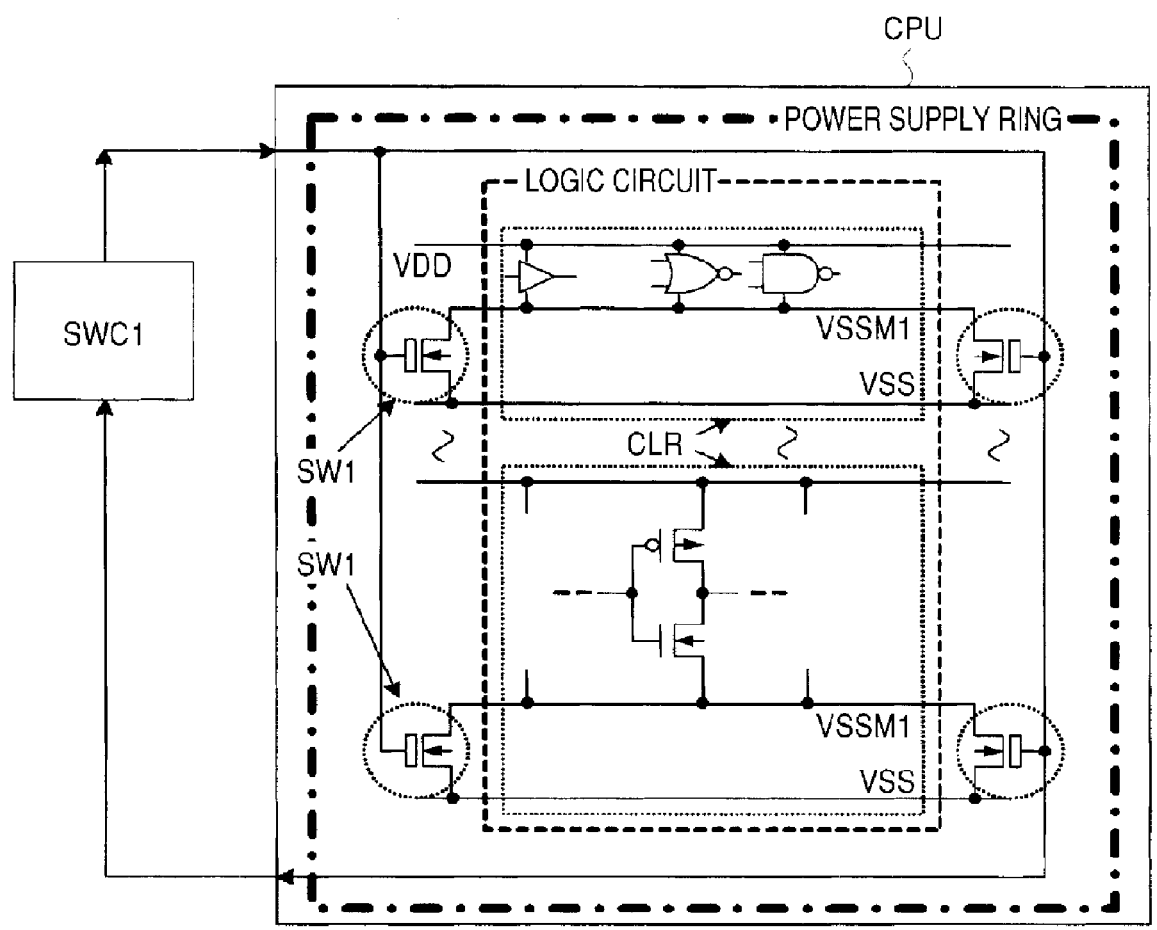
FIG. 3 is a drawing illustrating the internal configuration of an operation part, one of functional blocks, and the relation of coupling between the operation part and a power switch controller.

Description will be given to the internal configuration of each functional block. FIG. 3 illustrates the internal configuration of the operation part CPU, one of the functional blocks, and the relation of coupling between the operation part CPU and the power switch controller. In FIG. 3, the operation part CPU is formed in the core region and is, for example, rectangular. The operation part CPU in this shape has a power supply ring disposed in its peripheral portion. This power supply ring is comprised of wires for supplying VDD potential and wires for supplying reference potential. Inside the power supply ring, there is formed a logic circuit. The logic circuit is comprised of multiple logic elements (OR circuit, AND circuit, NAND circuit, NOR circuit, inverter circuit, etc.) and has multiple cell rows CLR. That is, the logic circuit region is divided into multiple cell rows CLR, and the multiple logic elements are arranged in each divided cell row CLR. In each cell row CLR, there are disposed a power supply wire VDD for supplying power supply potential (VDD potential), a wire VSSM1 for supplying a potential lower than VDD potential, and a reference wire VSS for supplying reference potential. The logic elements are disposed in parallel between the power supply wire VDD and the wire VSSM1. Between the wire VSSM1 and the reference wire VSS disposed in each cell row CLR, the power switches SW1 are provided. Each cell row CLR is provided with a pair of the power switches SW1, and the pair of power switches SW1 are disposed at both ends of the cell row CLR. The power supply wire VDD formed in each cell row CLR is coupled with a wire for supplying VDD potential of the wires forming the power supply ring. The reference wire VSS formed in each cell row CLR is coupled with a wire for supplying reference potential of the wires forming the power supply ring.

The power switches SW1 formed in each cell row CLR are formed of, for example, an n-type MISFET, and the gate electrodes of these n-type MISFETs are coupled to the power switch controller SWC1. That is, the gate electrodes of the n-type MISFETs formed in each cell row CLR are coupled together and to the power switch controller SWC1.

As mentioned above, the operation part CPU has multiple cell rows CLR, and the functions of the operation part CPU are implemented by the logic elements formed in these cell rows CLR. That is, the power switches SW1 are provided for each cell row CLR (or for multiple cell rows CLR in a lump), and the functions of the operation part CPU can be implemented by turning on/off all the cell rows CLR. For this purpose, the power switches SW1 provided for the individual cell rows CLR are so arranged that their turn-on/off can be simultaneously controlled.

When the operation part CPU is brought into operational state, for example, a High-level signal is applied to the gate electrodes of the power switches SW1 provided for each cell row CLR by the power switch controller SWC1. The power switch controller SWC1 is coupled with the gate electrodes of the power switches SW1 provided for each cell row CLR in common. Therefore, the power switches SW1 are turned on in every cell row CLR by the High-level signal outputted from the power switch controller SWC1. Thus, in every cell row CLR, the wire VSSM1 is electrically coupled with the reference wire VSS, and the wire VSSM1 is supplied with reference potential. As a result, all the cell rows CLR forming the operation part CPU are brought into operational state, and the operation part CPU functions.

To bring the operation part CPU into non-active state, a Low-level signal is applied to the gate electrodes of the power switches SW1 provided for each cell row CLR by the power switch controller SWC1. The power switch controller SWC1 is coupled with the gate electrodes of the power switches SW1 provided for each cell row CLR in common. Therefore, the power switches SW1 are turned off in every cell row CLR by the Low-level signal outputted from the power switch controller SWC1. Thus, in every cell row CLR, the wire VSSM1 is electrically decoupled from the reference wire VSS, and the wire VSSM1 is not supplied with reference potential anymore. This brings all the cell rows CLR forming the operation part CPU into non-active state, and the functions of the operation part CPU are stopped.

As mentioned above, power supply to the operation part CPU and interruption of this power supply can be controlled by controlling turn-on/off of the power switches SW1 provided for each cell row CLR. The above description has been given to the internal configuration of the operation part CPU. The basic configuration of the other functional blocks, such as the memory RAM, is the same as described above.

Figure 4:
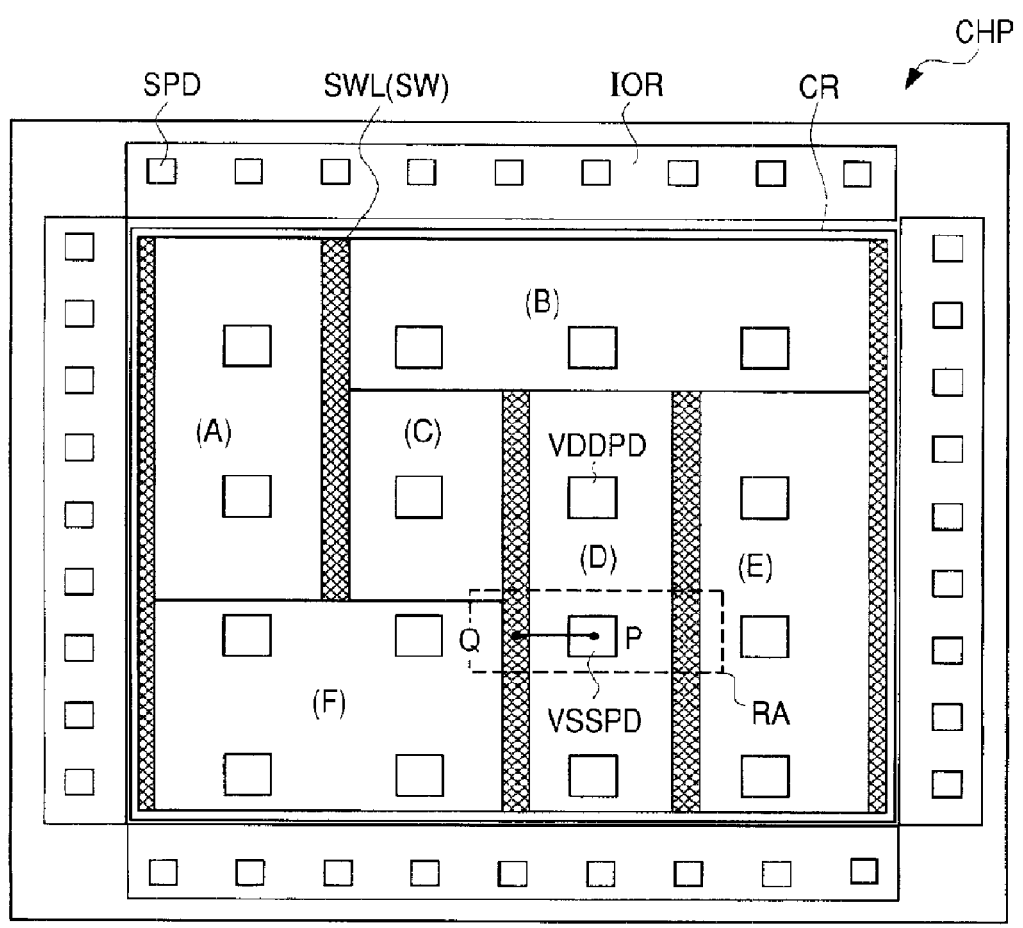
FIG. 4 is a plan view illustrating the relation between the disposed positions of pads and the disposed positions of power switch rows in a semiconductor chip in a first embodiment.

Description will be given to the relation between the disposition of the pads and the disposition of the power switch rows in the semiconductor chip CHP, which is one of the features of the first embodiment. FIG. 4 is a plan view illustrating the relation between the disposed positions of the pads and the disposed positions of the power switch row SWL in a semiconductor chip CHP in the first embodiment. In FIG. 4, the semiconductor chip CHP in the first embodiment is rectangular and has an I/O region IOR formed in its peripheral portion. Inside the I/O region IOR, there is formed the core region CR. In the I/O region IOR, as mentioned above, input/output circuits and level shifter circuits are formed. In the surface of the I/O region IOR, there are formed signal pads SPD. The signal pads SPD function as terminals for inputting signals from a source external to the semiconductor chip CHP and also function as terminals for outputting signals from the inside of the semiconductor chip CHP. The signal pads SPD are coupled to an internal circuit formed in the core region CR by way of an input/output circuit or the like formed in the I/O region IOR. In the I/O region IOR. there is also formed a pad for supplying VCC power supply (3.3V) used in the I/O region IOR though it is not shown in the drawing. The input/output circuit and the like formed in the I/O region IOR are formed using MISFET. Since they are elements using VCC power supply (3.3V), however, the gate insulating film of MISFET forming the input/output circuit and the like is thicker than the gate insulating film of MISFET using VDD power supply (1.2V), described later. The MISFETs whose gate insulating film is thick as mentioned above will be designated as thick-film MISFETs.

As illustrated in FIG. 1, the following are formed in the core region CR formed inside the I/O region IOR: the operation part CPU, memory RAM, processor DSP, interface circuit IF, non-blocked circuit SGC, system controller SYSC, power switch controllers SWC1 to SWC5, analog circuits Alg1, Alg2, and the like. In FIG. 4, these functional blocks are indicated as functional block A to functional block F. The functional blocks from functional block A to functional block F illustrated in FIG. 4 are so formed that they independently divide the core region, and the above-mentioned internal circuits are formed there. The internal circuits forming the functional blocks from functional block A to functional block F are comprised of MISFET using VDD power supply (1.2V); therefore, their gate insulating films are thinner than those of the thick-film MISFETs used in the input/output circuits in the I/O region IOR. The MISFETs whose gate insulating film is thin as mentioned above will be designated as thin-film MISFETs.

In the boundaries between the functional blocks from functional block A to functional block F, there is formed, for example, a power switch row SWL comprised of multiple power switches SW. By turning on/off the individual power switches SW forming these power switch rows SWL, the following can be implemented as illustrated in FIG. 2 and FIG. 3: reference potential can be supplied to the individual functional bocks from functional block A to functional block F or this supply can be interrupted. That is, the power switches SW are so provided that functional block A to functional block F can be independently brought into operational state or non-active state. These power switches SW are preferably formed of, for example, an n-type MISFET and especially preferably formed of a thick-film MISFET. This is because the thick-film MISFETs are thick in gate insulating film and a leakage current passed through their gate insulating films can be reduced. That is, the reason for the foregoing is as follows: a leakage current passed when power switches SW are off can be reduced and this is effective in reducing the power consumption of the entire semiconductor chip CHP. In the core region CR, there are also functional blocks that do not involve the supply of reference potential and its interruption by power switches SW and are constantly kept in operational state. In the drawings related to the following description, those functional blocks constantly in operational state are omitted and only the functional blocks involving the supply of reference potential and its interruption by power switches SW are shown.

In the surface of the core region CR, in addition, power supply pads VDDPD and reference pads VSSPD are formed. That power supply pads VDDPD and reference pads VSSPD are formed in the surface of the core region CR, as mentioned above, is one of the features of this embodiment. The power supply pads VDDPD are for supplying VDD potential (1.2V) to the functional blocks from functional block A to functional block F in the core region CR. The reference pads VSSPD are for supplying reference potential to the functional blocks from functional block A to functional block F in the core region CR.

One of common methods for supplying power supply potential or reference potential to a semiconductor chip CHP forming SOC is as follows: externally supplied power supply potential or reference potential is supplied to the core region CR through power supply pads VDDPD or reference pads VSSPD provided in the semiconductor chip CHP.

When power supply pads VDDPD and reference pads VSSPD are disposed in the I/O region IOR, as described under SUMMARY OF THE INVENTION, the following takes place: a wire coupling a reference pad VSSPD disposed in the I/O region IOR and functional block D positioned in the central part of the core region CR is lengthened, and its wiring resistance increased. When the wiring resistance is increased, a voltage drop that occurs when reference potential is supplied is increased, and this incurs degradation in the reliability of the semiconductor device.

Figure 54:
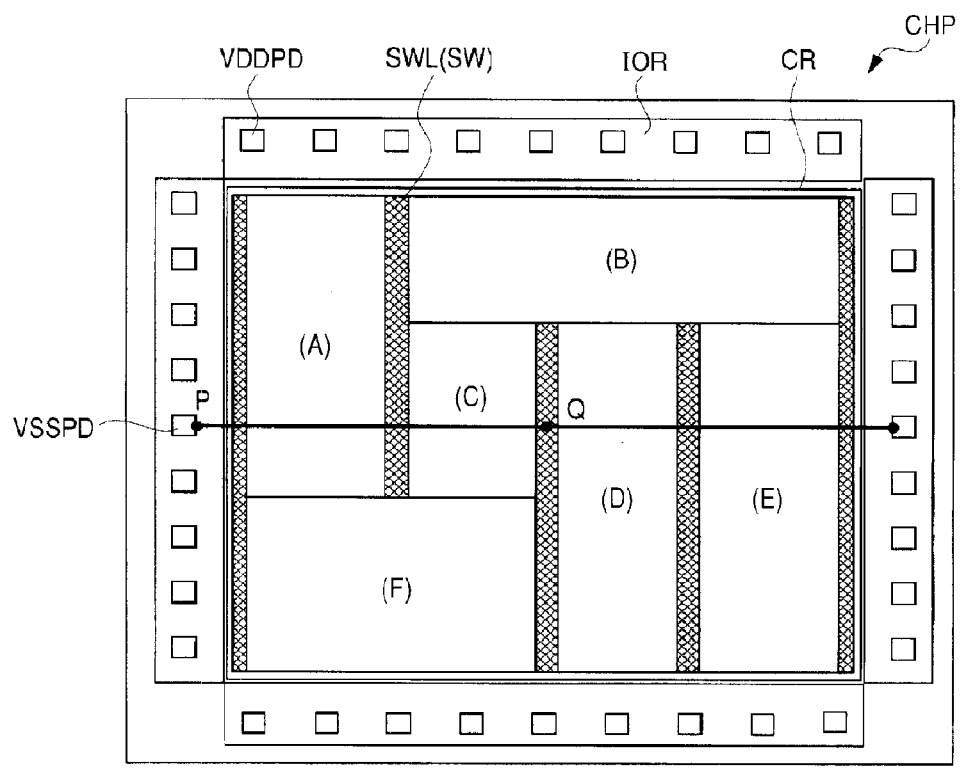
FIG. 54 is a top view illustrating a SOC (semiconductor chip), which is a technology discussed by the present inventors.

To cope with this, the first embodiment is so arranged that reference pads VSSPD are disposed in the core region CR. Thus, to supply reference potential to functional block D positioned in the central part of the core region, as illustrated in FIG. 4, the following measure can be taken: a wire is so formed that it is supplied from a reference pad VSSPD provided over functional block D through a power switch SW. It is apparent that the length PQ of the wire at this time (FIG. 4) is much shorter than the length of PQ of the wire in FIG. 54 in which reference pads VSSPD are formed in the I/O region IOR (FIG. 54).

Figure 5:
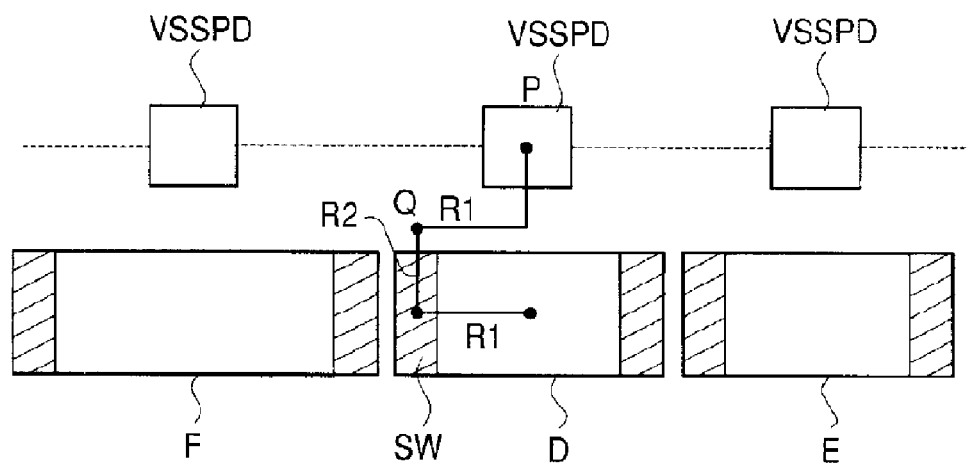
FIG. 5 is a sectional schematic diagram illustrating a section of a vicinity of the area between point P and point Q in FIG. 4.
Figure 55:
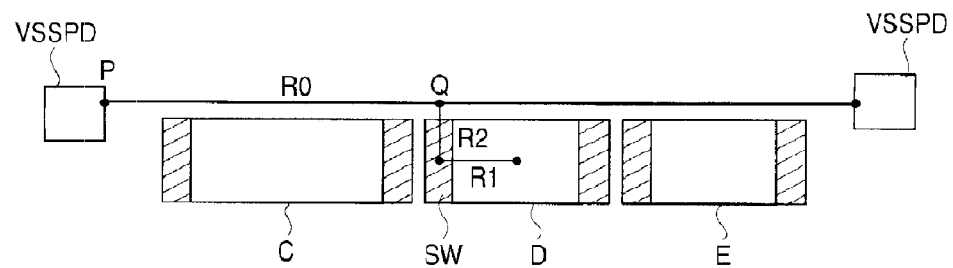
FIG. 55 is a sectional schematic diagram illustrating a section of a vicinity of the area between point P and point Q in FIG. 54.

An example will be taken. FIG. 5 is a sectional schematic diagram illustrating a section of a vicinity of the area between point P and point Q in FIG. 4. As illustrated in FIG. 5, the reference pad VSSPD and functional block D are coupled together through a wire, and a power switch SW is provided in proximity to the boundary of functional block D. The wiring resistance of the wire running from the reference pad VSSPD (point P) to the upper part (point Q) of the power switch SW will be taken as resistance R1; and the wiring resistance of the wire running from point Q to the power switch SW in the vertical direction will be taken as resistance R2. Further, the wiring resistance of the wire running from the power switch SW to the central part of functional block D will be taken as resistance R1. Thus, the wiring resistance of the wire from the reference pad VSSPD to the center position of functional block D is expressed as 2×R1+R2. This wiring resistance (2×R1+R2) will be compared with the wiring resistance (R0+R1+R2) of the wire illustrated in FIG. 55. In consideration of that R0 is much higher than R1 or R2, the following is apparent: with the arrangement that a reference pad VSSPD is provided over functional block D as in the first embodiment, the wiring resistance of the wire running between the reference pad VSSPD and the interior of functional block D through the power switch SW is lower. Therefore, the wiring resistance between the reference pad VSSPD and the power switch SW can be reduced, and thus a voltage drop that occurs when reference potential is supplied from the reference pad VSSPD can be reduced. That is, fluctuation in operating voltage for operating the circuits formed in a core region CR can be reduced in a semiconductor device so arranged that the following is implemented: the core region CR is divided into multiple functional blocks from functional block A to functional block F; and reduction of its power consumption can be achieved by supplying power and interrupting this power supply with respect to each of the divided functional blocks from functional block A to functional block F.

Figure 6:
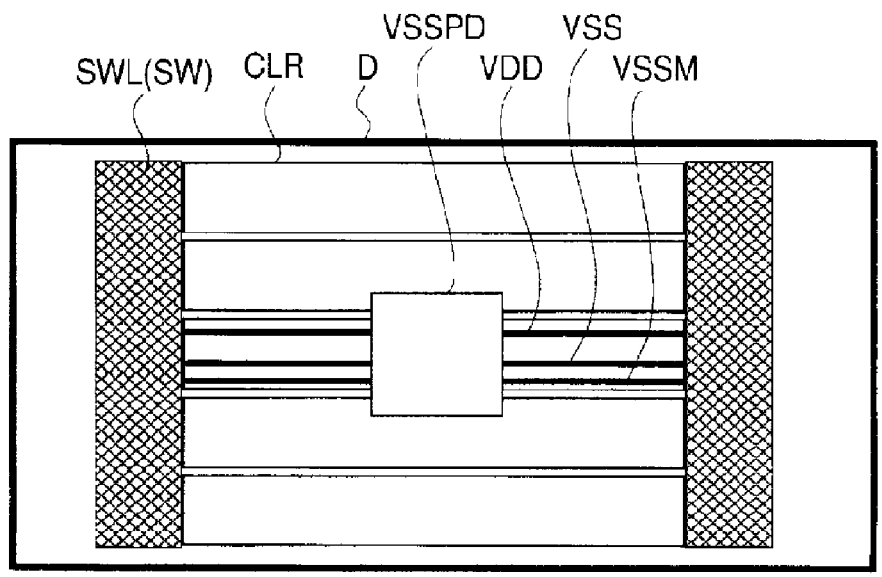
FIG. 6 is an enlarged view illustrating the area encircled with a broken line in FIG. 4.

Detailed description will be given to the positional relation between the disposition of power switches SW and the disposition of a reference pad VSSPD. FIG. 6 is an enlarged view of the area RA encircled with a broken line in FIG. 4. In FIG. 6, functional block D is comprised of multiple cell rows CLR and power switches SW are disposed at both ends of each cell row CLR. The multiple power switches SW are so formed that they arranged in the direction in which cell rows CLR are lined to form power switch rows SWL. In FIG. 6, for examples, the cell rows CLR have a power supply wire VDD, a wire VSSM, and a reference wire VSS formed therein. A reference pad VSSPD is formed at the upper part of the cell row CLR positioned in the center. This reference pad VSSPD is positioned between the power switch rows SWL positioned at both ends of the cell row CLR. That a reference pad VSSPD is disposed in the center between a pair of power switch rows SWL (in the center of a cell row CLR) is one of the features of the first embodiment. This brings the following advantage: the disposition of the reference pad VSSPD and the logic elements formed in functional block D (cell row CLR) is bilaterally symmetric and the wiring resistance is well balanced.

Figure 7:
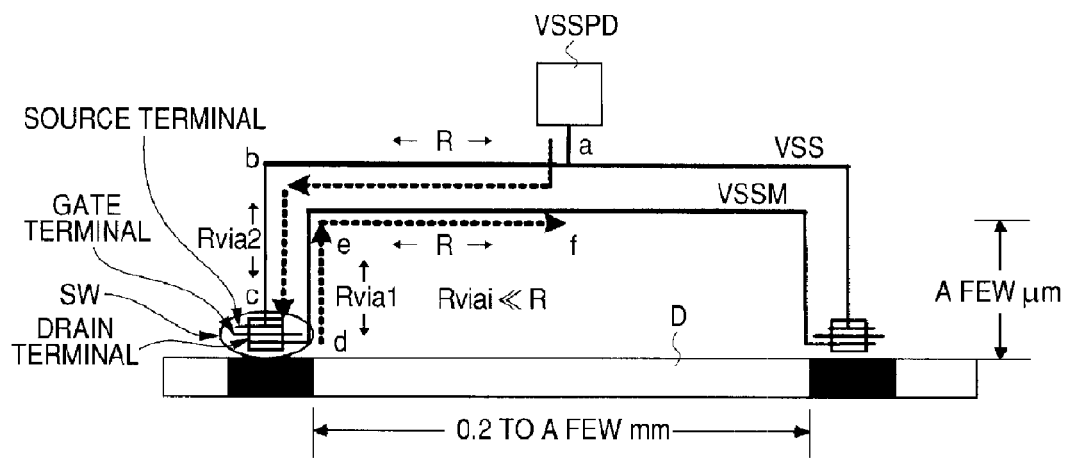
FIG. 7 is a drawing illustrating the positional relation between a reference pad and a power switch (a schematic view taken along the direction of the section of FIG. 6)
Figure 8:
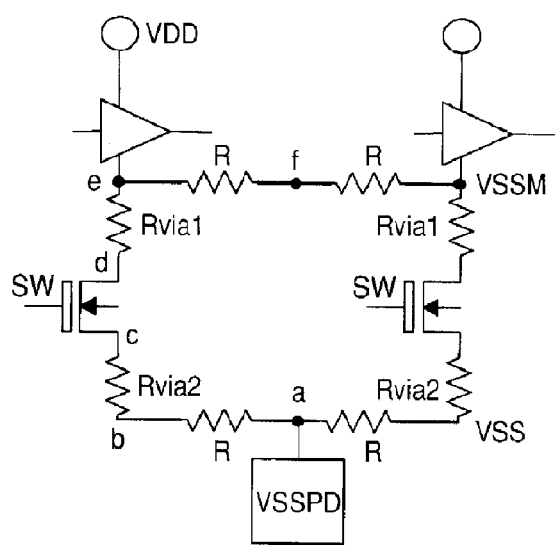
FIG. 8 is a diagram of an equivalent circuit to FIG. 7.

FIG. 7 illustrates the positional relation between a reference pad VSSPD and power switches SW (schematic view taken along the direction of the section of FIG. 6); and FIG. 8 is a diagram of an equivalent circuit to FIG. 7. The codes a to f indicated in FIG. 7 correspond to the codes a to f indicated in FIG. 8. As illustrated in FIG. 7 and FIG. 8, the reference pad VSSPD and the source terminals of the power switches SW are coupled with each other through a reference wire VSS, and the drain terminals of the power switches SW and a wire VSSM are coupled together. The reference pad VSSPD is disposed between the power switches SW disposed at both ends of functional block D. At this time, the distance from the reference pad VSSPD to the center of the wire VSSM (center of functional block D) is represented as a route extending from point a to point f. At this time, the wiring resistance of the wire from point a to point b is R, and the wiring resistance of the wire from point b to point c is Rvia2. The wiring resistance of the wiring from point d to point e is Rvia1, and the wiring resistance of the wire from point e to point f is R. Hence, the wiring resistance of the wire from point a to point f, representing the distance from the reference pad VSSPD to the center of functional block D, is expressed as Rtotal=2×R+Rvia1+Rvia2.

When the wiring resistance Rtotal of the wire from the reference pad VSSPD to the center of functional block D is concretely calculated, it is approximately 40 mΩ, for example. It will be assumed that a current passed between a power supply potential and a reference potential in functional block D in operation is 100 mA. In this case, a voltage drop that occurs when reference potential is supplied to functional block D is approximately 4 mV. It will be assumed that the wiring resistance of the wire from the power supply pad VDDPD to the center of functional block D is identical with the wiring resistance Rtotal of the wire from the reference pad VSSPD to the center of functional block D. Thus, a voltage drop that occurs when power supply potential is supplied to functional block D is also approximately 4 mV. In functional block D, therefore, the voltage drop (approximately 4 mV) arising from the wire for supplying reference potential and the voltage drop (approximately 4 mV) arising from the wire for supplying power supply potential occur. This results in a voltage drop of approximately 8 mV in total. The power supply voltage equivalent to the difference between power supply potential and reference potential is approximately 1.2V. The circuits formed in the core region CR are so arranged that they operate on this power supply voltage of approximately 1.2V. Some margin is allowed for fluctuation in power supply voltage, and ±0.1V of the power supply voltage of approximately 1.2V is established as an allowable range. The following is apparent from the foregoing: according to the first embodiment, a voltage drop is approximately 8 mV versus the allowable margin (±0.1V); therefore, any voltage drop can be suppressed to 8% of the allowable range. More specific description will be given. As described under SUMMARY OF THE INVENTION, the following takes place when the reference pads VSSPD are formed in the I/O region IOR: the distance between a reference pad VSSPD and the center of functional block D is lengthened, and the wiring resistance of the wire therebetween is increased. For this reason, for example, a voltage drop (approximately 20 mV) arising from a wire for supplying reference potential and a voltage drop (approximately 20 mV) arising from a wire for supplying power supply potential occurs. This results in a voltage drop of approximately 40 mV in total. This voltage drop accounts for as much as 40% of the allowable margin (±0.1V). Since voltage fluctuation is also caused by any other phenomenon than mentioned above, a voltage drop counting for 40% is problematic. More specific description will be given. If voltage fluctuation exceeds the allowable range, operation failure of a circuit formed in functional block D, for example, is incurred and this degrades the reliability of the semiconductor device.

In the first embodiment, reference pads VSSPD are provided over functional block D. As mentioned above, therefore, the wiring resistance of the wire running from a reference pad VS SPD to the interior of functional block D through power switches SW is reduced. This makes it possible to reduce the wiring resistance of the wire between the reference pad VSSPD and the power switches SW, and thus reduce a voltage drop that occurs when reference potential is supplied from the reference pad VSSPD. For example, as mentioned above, a voltage drop can be suppressed to 8% or so of the allowable range. For this reason, voltage fluctuation can be sufficiently reduced, and it is possible to avoid operation failure of a circuit formed in functional block D, for example, to enhance the reliability of the semiconductor device.

In addition, the reference pad VSSPD is disposed between the power switches SW disposed at both ends of functional block D. This brings the following advantage: the disposition of the reference pad VSSPD and the logic elements formed in functional block D (cell row CLR) is bilaterally symmetric and the wiring resistance is well balanced.

The reference pad VSSPD is coupled to the reference wire VSS, and the reference wire VSS is coupled to the wire VSSM through the power switches SW. At this time, the distance between the reference pad VSSPD and the wire VSSM can be shortened by forming the reference pad VSSPD in the core region CR. Therefore, the following can be implemented when the power switches SW are turned on to supply reference potential to the wire VSSM: a time it takes for the wire VSSM to settle to reference potential can be shortened; and a time required to return a functional block from non-active state to operational state can be shortened.

In the description of the first embodiment with respect to the positional relation between reference pads VSSPD and power switches SW, an arbitrary functional block obtained by dividing the core region CR is taken as an example. This arbitrary functional block refers to individual functional blocks in which, for example, the following are respectively formed: the operation part CPU, memory RAM, processor DSP, interface circuit IF, non-blocked circuit SGC, system controller SYSC, power switch controllers SWC1 to SWC5, analog circuits Alg1, Alg2, and the like.

(Second Embodiment)

In the description of a second embodiment, a case where power switches SW are formed directly under reference pads VSSPD will be taken as an example.

Figure 9:
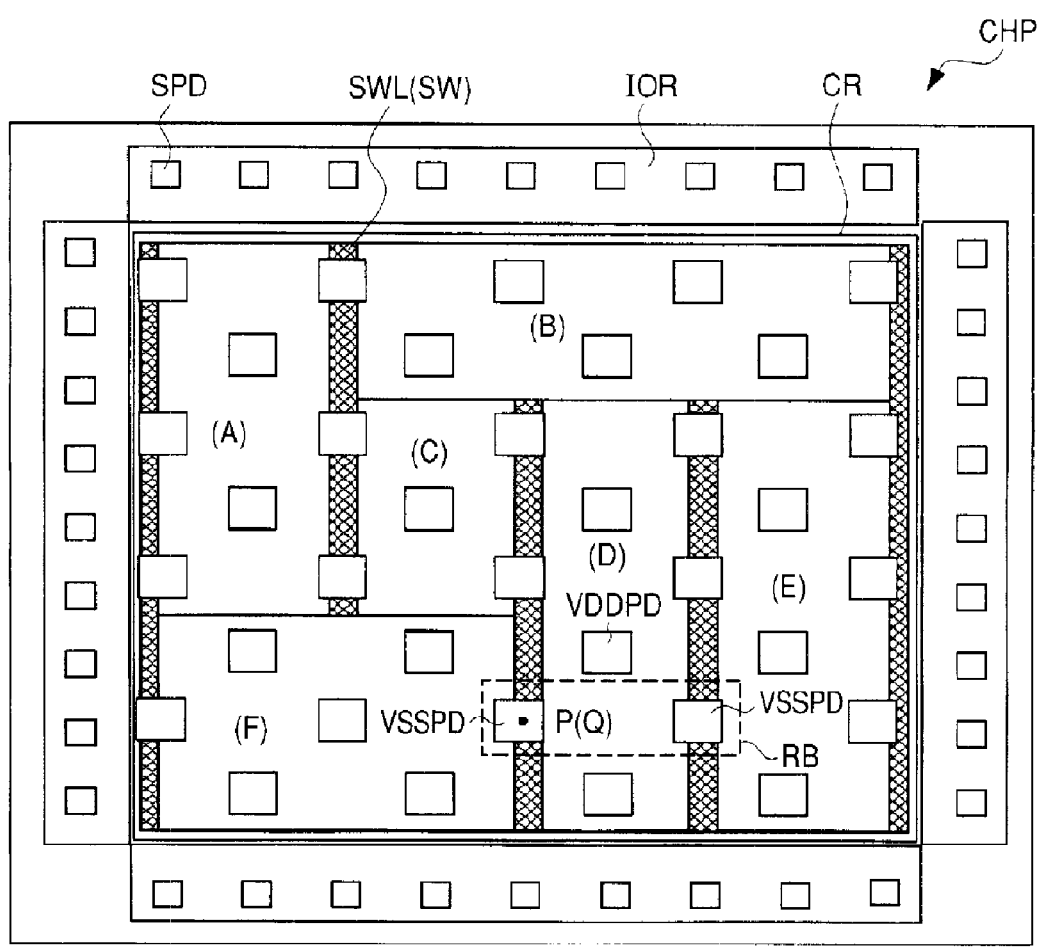
FIG. 9 is a plan view illustrating the relation between the disposed positions of pads and the disposed positions of power switch rows in a semiconductor chip in a second embodiment.

FIG. 9 is a plan view illustrating a semiconductor chip CHP in the second embodiment. The semiconductor chip in FIG. 9 has substantially the same arrangement as the semiconductor chip CHP in the first embodiment illustrated in FIG. 4; therefore, description will be given to a difference. As illustrated in FIG. 9, the semiconductor chip CHP in the second embodiment is characterized in the disposed positions of reference pads VSSPD and power supply pads VDDPD formed in the core region CR. More specific description will be given. In the first embodiment, a reference pad VSSPD is disposed between power switches SW disposed at both ends of a functional block as illustrated in FIG. 4. In the second embodiment, power switch rows SWL are provided directly under reference pads VSSPD. This makes it possible to further shorten the length of a wire between a reference pad VSSPD and a functional block than in the first embodiment.

Figure 10:
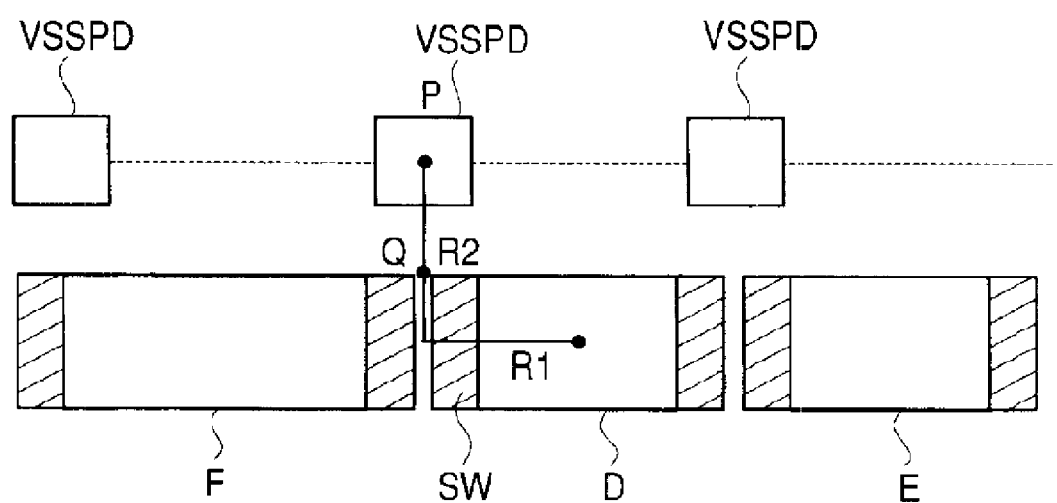
FIG. 10 is a sectional schematic diagram illustrating a section of a vicinity of the area between point P and point Q in FIG. 9.

FIG. 10 is a schematic diagram illustrating a section of a vicinity of the area between point P and point Q in FIG. 9. As illustrated in FIG. 10, the functional blocks from functional block D to functional block F are formed, and a power switch SW is formed at both ends of each of functional block D to functional block F. As illustrated in FIG. 10, for example, a reference pad VSSPD is formed directly above a power switch SW formed at both ends of functional block D. The wiring resistance of the wire running from the reference pad VSSPD (point P) to a power switch SW through the upper part of the power switch SW (point Q) in the vertical direction will be taken as resistance R2. The wiring resistance of the wire running from the power switch SW to the central part of functional block D will be taken as resistance R1. Thus, the wiring resistance of the wire running from the reference pad VSSPD to the center position of functional block D is expressed as R1+R2. This wiring resistance (R1+R2) will be compared with the wiring resistance (2×R1+R2) illustrated in FIG. 5. In the second embodiment, the power switch SW is provided directly under the reference pad VSSPD as illustrated in FIG. 10. Therefore, unlike the first embodiment illustrated in FIG. 5, there is not the wiring resistance R1 of the wire running from the reference pad VSSPD (point P) to the upper part of the power switch SW (point Q). In the second embodiment, for this reason, the wiring resistance can be further reduced by an amount equivalent to the wiring resistance R1. Therefore, the wiring resistance between the reference pad VSSPD and the power switch SW can be further reduced than in the first embodiment. This makes it possible to further reduce a voltage drop that occurs when reference potential is supplied from the reference pad VSSPD. As a result, voltage fluctuation can be sufficiently reduced, and it is possible to avoid operation failure of a circuit formed in a functional block, for example, to enhance the reliability of the semiconductor device.

Figure 11:
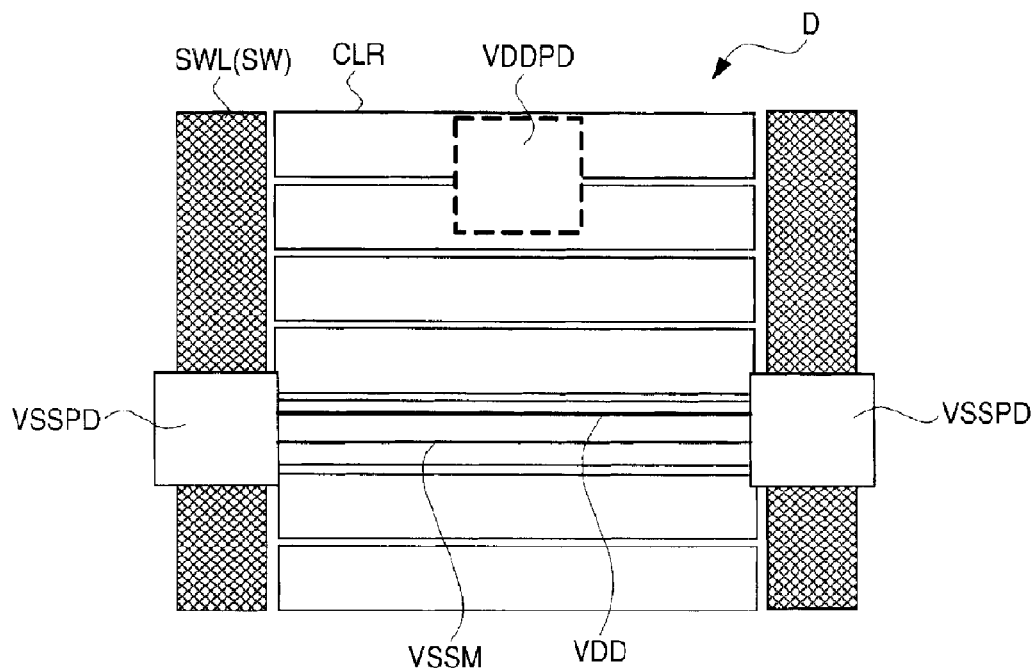
FIG. 11 is an enlarged view illustrating the area encircled with a broken line in FIG. 9.

FIG. 11 is an enlarged view of the area RB encircled with a broken line in FIG. 9. In FIG. 11, functional block D is comprised of multiple cell rows CLR and power switches SW are disposed at both ends of each cell row CLR. The multiple power switches SW are so formed that they are arranged in the direction in which cell rows CLR are lined to form power switch rows SWL. In FIG. 11, for example, the cell rows CLR have a power supply wire VDD and a wire VSSM formed therein. It is apparent that reference pads VSSPD are formed over power switch rows SWL. The power supply pad VDDPD is positioned between power switch rows SWL positioned at both ends of cell rows CLR. That power switch rows SWL are disposed directly under reference pads VSSPD and a power supply pad VDDPD is disposed between power switch rows SWL positioned at both ends of cell rows CLR is one of the features of the second embodiment.

Figure 12:
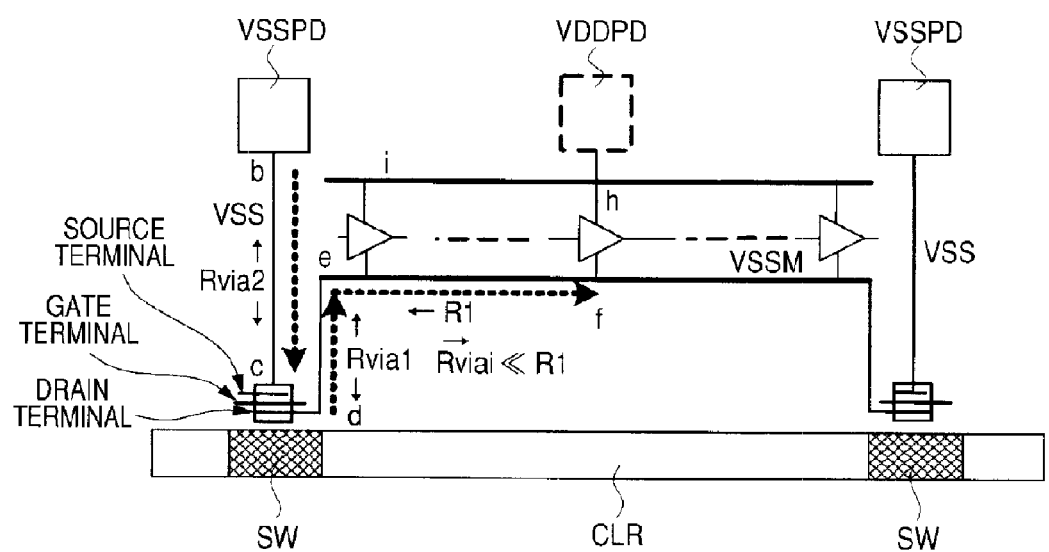
FIG. 12 is a drawing illustrating the positional relation between reference pads and a power switch (a schematic view taken along the direction of the section of FIG. 11)
Figure 13:
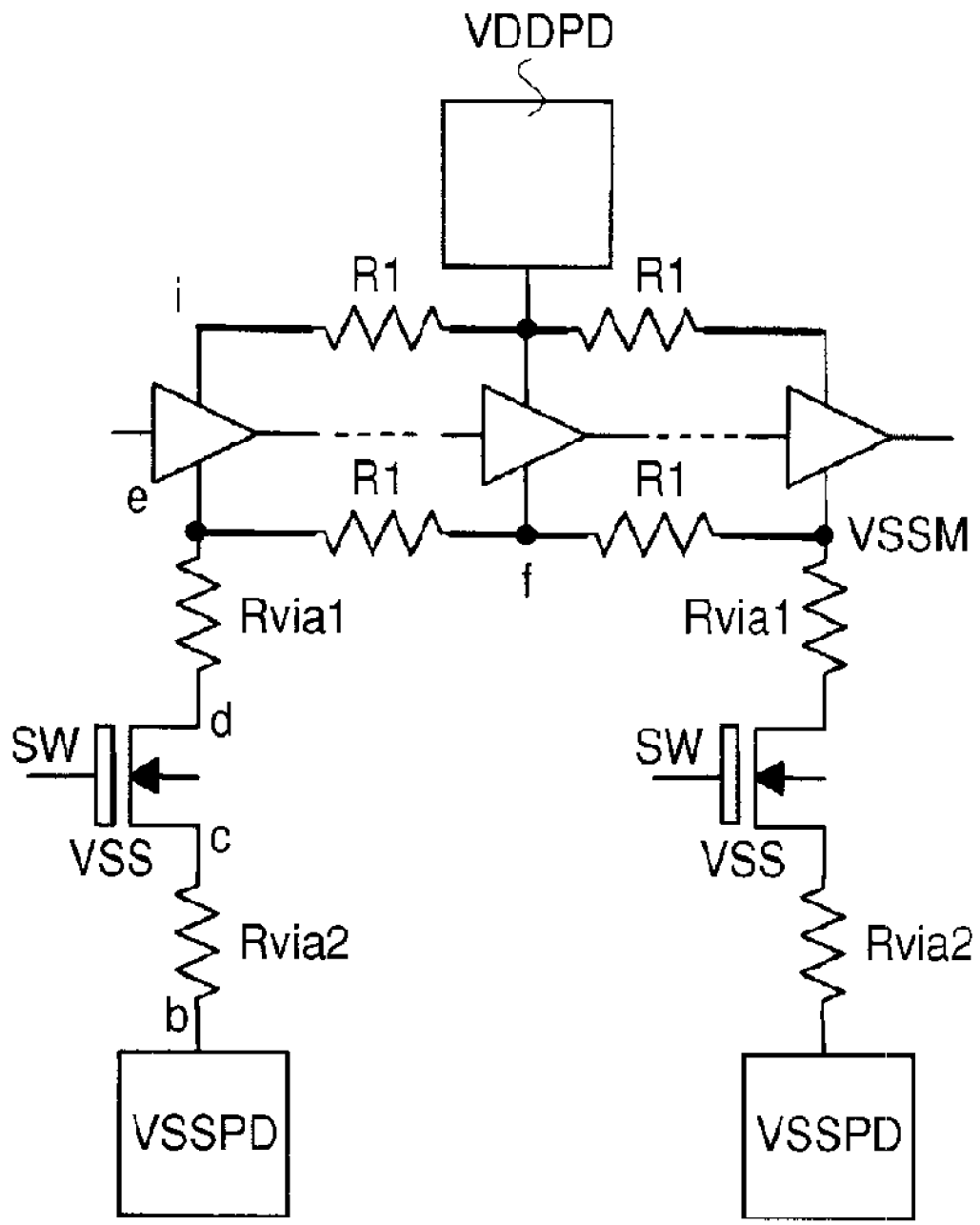
FIG. 13 is a diagram of an equivalent circuit to FIG. 12.

FIG. 12 illustrates the positional relation between reference pads VSSPD and power switches SW (schematic view taken along the direction of the section of FIG. 11); and FIG. 13 is a diagram of an equivalent circuit to FIG. 12. The codes b to f, h, and i correspond to the codes b to f, h, and i indicated in FIG. 13. As illustrated in FIG. 12 and FIG. 13, the reference pads VSSPD and the source terminals of the power switches SW are coupled with each other through a reference wire VSS, and the drain terminals of the power switches SW and a wire VSSM are coupled together. The reference pads VSSPD are disposed directly above the power switches SW disposed at both ends of functional block D. At this time, the distance from a reference pad VSSPD to the center of the wire VSSM (center of functional block D) is represented as a route extending from point b to point f. At this time, the wiring resistance of the wire from point b to point c is Rvia2. The wiring resistance of the wire from point d to point e is Rvia1, and the wiring resistance of the wire from point e to point f is R1. Hence, the wiring resistance of the wire from point b to point f, representing the distance from the reference pad VSSPD to the center of functional block D, is expressed as Rtotal=R1+Rvia1+Rvia2.

Here, the second embodiment will be compared with the first embodiment illustrated in FIG. 7 and FIG. 8. In the first embodiment, the wiring resistance R of the wire running from point a to point b exists. In the second embodiment, meanwhile, the reference pads VSSPD are present directly above the power switches SW as illustrated in FIG. 12 and FIG. 13; therefore, the wire running from point a to point b itself does not exist. In the second embodiment, as a result, the wiring resistance can be reduced by an amount equivalent to the wiring resistance R of the wire from point a to point b. That is, the wiring resistance between the reference pad VSSPD and the center of functional block D can be further reduced than in the first embodiment. Since the power supply pad VDDPD is disposed between power switch rows SWL positioned at both ends of cell rows CLR, the following advantage is brought: the disposition of the reference pads VSSPD and the logic elements formed in functional block D (cell row CLR) is bilaterally symmetric and the wiring resistance is well balanced.

As mentioned above, one of the features of the second embodiment is as follows: the wiring resistance of a wire coupling together a reference pad VSSPD and a functional block can be reduced by providing power switch rows SWL directly under reference pads VSSPD. Therefore, it is desirable to provide power switch rows SWL directly under reference pads VSSPD. Even when a reference pad VSSPD and a power switch row SWL are shifted from each other in planar position, however, the same effect as in the second embodiment may be obtained. An example will be taken. When there is a planner overlap area between a reference pad VSSPD and a power switch row SWL, a wire for coupling together the reference pad VSSPD and the power switch row SWL can be so formed that it couples this planar overlap area. This makes it possible to form the same wires as in cases where a power switch row SWL exists directly under a reference pad VSSPD, and thus obtain the same effect as that of the second embodiment.

Even when there is not a planar overlap area between a reference pad VSSPD and a power switch row SWL, the same effect as that of the second embodiment can be obtained. This effect can be obtained when the distance between the reference pad VSSPD and the power switch row SWL does not exceeds a predetermined value. Description will be given to this.

Figure 14:
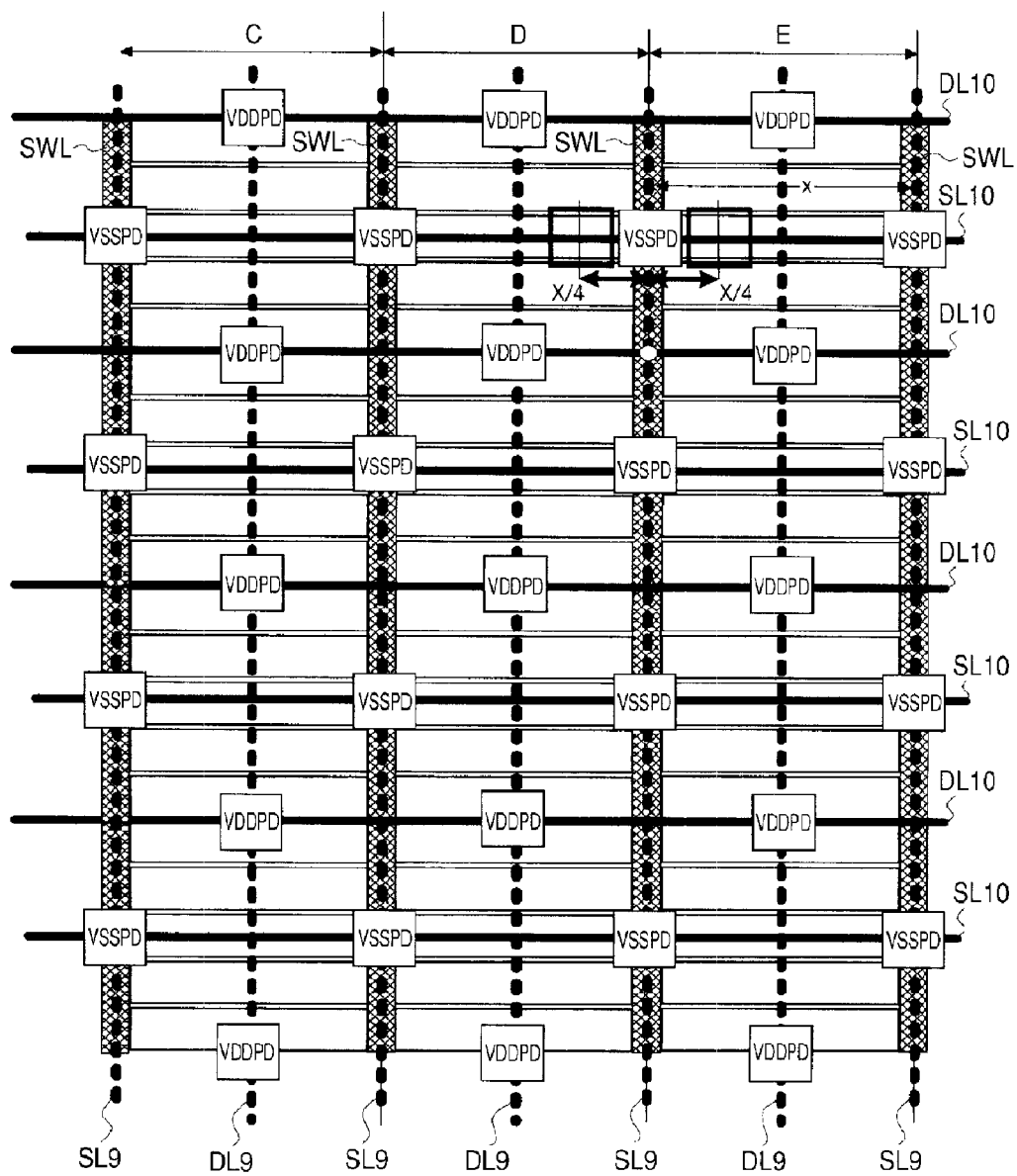
FIG. 14 is a top view illustrating part of a core region.

FIG. 14 is a top view illustrating part of a core region. In the example in FIG. 14, functional blocks from functional block C to functional block E are formed, and power switch rows SWL comprised of multiple power switches SW are formed at both end of each of functional block C to functional block E. Multiple reference pads VSSPD are formed directly above the power switch rows SWL, and multiple power supply pads VDDPD are formed between pairs of the power switch rows SWL.

The multiple power supply pads VDDPD formed in the lateral direction are coupled together through wires DL10, and the multiple power supply pads VDDPD formed in the longitudinal direction are coupled together through wires DL9. The wires DL10 are formed in the uppermost layer, or the same layer as the power supply pads VDDPD, and are comprised of, for example, aluminum wires. The wires DL9 are formed in a layer lower than that of the wires DL10, and are formed of, for example, copper wires.

Similarly, the multiple reference pads VSSPD formed in the lateral direction are coupled together through wires SL10, and the multiple reference pads VSSPD formed in the longitudinal direction are coupled together through wires SL9. The wires SL10 are formed in the uppermost layer, or the same layer as the reference pads VSSPD, and are comprised of, for example, aluminum wires. The wires SL9 are formed in a layer lower than that of the wires SL10, and are comprised of, for example, copper wires. The wires DL10, DL9 and the wires SL10, SL9 are wires that make main lines and form a power supply network. The wires DL10, DL9 and the wire SL10, SL9 are formed as metal layers, and they are formed as wires thick and wide and low in resistance.

Here, the distance between the closest two reference pads VSSPD will be taken as X as illustrated in FIG. 14. When the distance between a reference pad VSSPD and a power switch row SWL is not more than X/4, the same effect as in cases where power switch rows SWL are disposed directly under reference pads VSSPD can be obtained. Description will be given to this.

Figure 15:
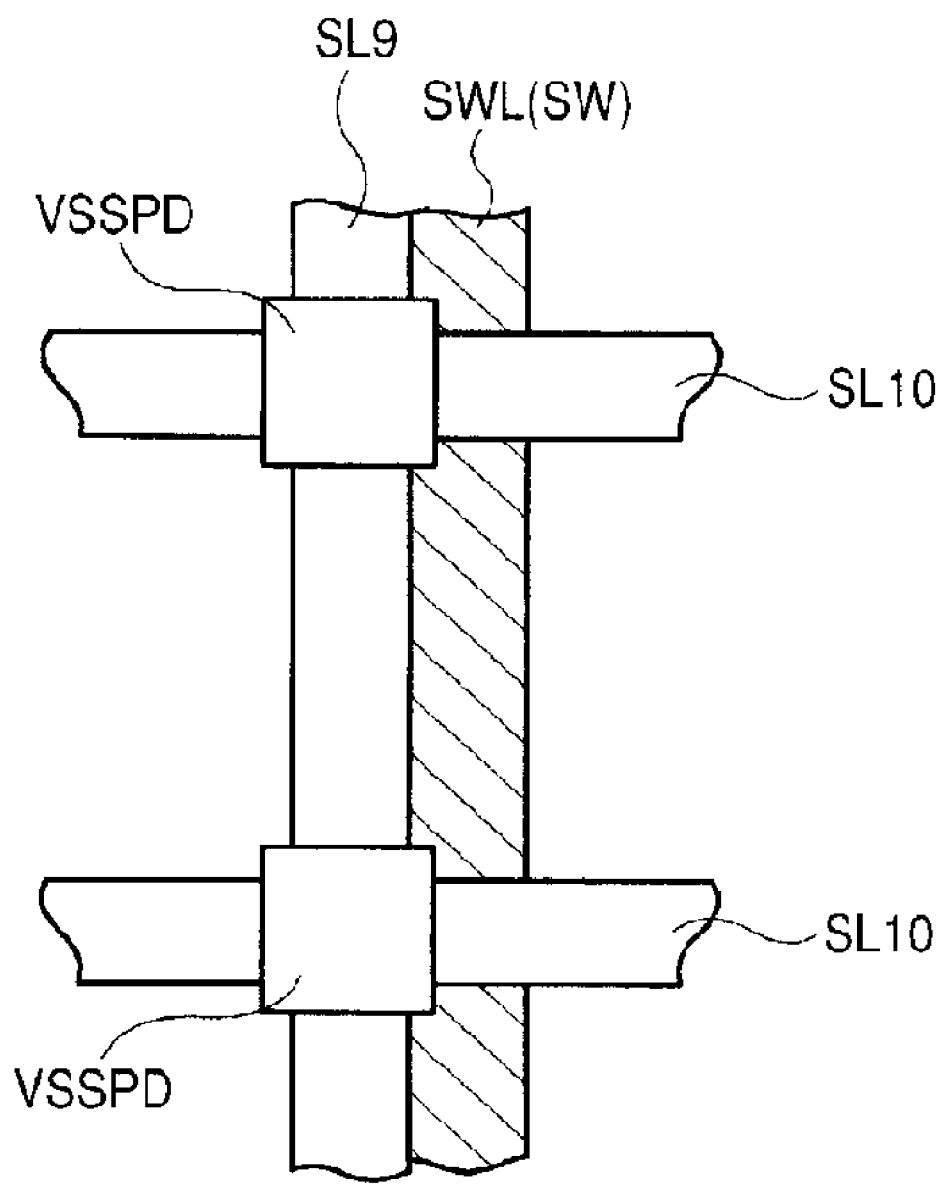
FIG. 15 is a drawing illustrating an example of a case where the distance between reference pads and a power switch row is not more than X/4.

FIG. 15 illustrates an example of cases where the distance between a reference pad VSSPD and a power switch row SWL is not more than X/4. As illustrated in FIG. 15, the multiple reference pads VSSPD formed in the longitudinal direction are coupled through a wire SL9 formed directly under the reference pads VSSPD. At this time, the power switch row SWL is not formed directly under the reference pads VSSPD. However, the power switch row SWL and the wire SL9 have areas in planar contact with each other. The power switch row SWL is formed as MISFET in the lowermost layer of a semiconductor substrate as described later. It is coupled to the reference pads VSSPD in the uppermost layer through a multilayer interconnection formed over this MISFET. In FIG. 15, that is, the power switch row SWL is coupled to the multilayer interconnection, and is coupled to the reference pads VSSPD through the wire SL9 forming part of the multilayer interconnection. Therefore, the same effect as in cases where power switch rows SWL are formed directly under reference pads VSSPD can be obtained by taking the following measure: reference pads VSSPD are coupled to wires SL9 formed directly thereunder, and thereby coupled to power switch rows SWL in planar contact with the wires SL9. More specific description will be given. Since the power switch rows SWL and the wires SL9 are in planar contact with each other, they can be coupled together as in cases where the power switch rows SWL are positioned directly under the wires SL9. Since the reference pads VSSPD are positioned directly above the wires SL9 at the same time, the wiring resistance can be reduced as in cases where the power switch rows SWL are formed directly under the reference pads VSSPD.

Figure 16:
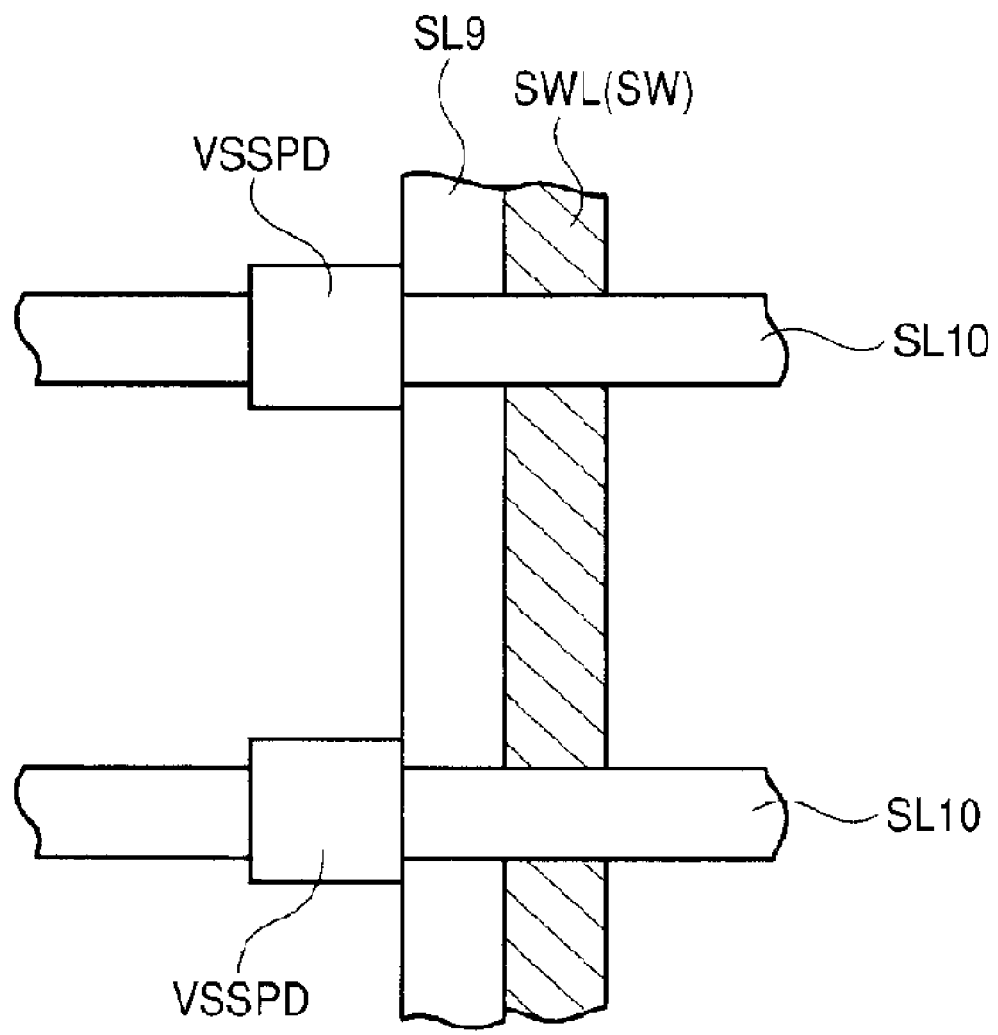
FIG. 16 is a drawing illustrating an example of a case where the distance between reference pads and a power switch row is not more than X/4.

FIG. 16 illustrates another example of cases where the distance between a reference pad VSSPD and a power switch row SWL is not more than X/4. As illustrated in FIG. 16, a wire SL9 is so formed that it in planar contact with reference pads VSSPD, and a power switch row SWL is so formed that it is in planar contact with this wire SL9. However, the reference pads VSSPD or the power switch row SWL does not have an area in planar contact with each other. When the reference pads VSSPD and the power switch row SWL are coupled together, therefore, the following takes place: the length of a wire coupling together the reference pads VSSPD and the power switch row SWL is lengthened as compared with cases where power switch rows SWL are positioned directly under reference pads VSSPD; and the wiring resistance of the wire is increased. As a result, it is suspected that the same effect as of the second embodiment cannot be obtained.

In the example illustrated in FIG. 16, however, the reference pads VSSPD and the wire SL9 are in planar contact with each other, and at the same time, the wire SL9 and the power switch row SWL are in planar contact with each other. Since the power switch row SWL and the wire SL9 are in planar contact with each other, they can be coupled together as in cases where power switch rows SWL are positioned directly under wires SL9. Further, since the reference pads VSSPD and the wire SL9 are in planar contact with each other, they can be coupled together as in cases where wires SL9 are positioned directly under reference pads VSSPD. Even in the example illustrated in FIG. 16, therefore, the wiring resistance can be reduced as in cases where power switch rows SWL are formed directly under reference pads VSSPD. In the example illustrated in FIG. 16, the power switch row SWL does not have an area in contact with the reference pads VSSPD but the power switch row SWL is in planar contact with the wire SL9 having an area in planar contact with the reference pads VSSPD. In this case, the wiring resistance can be reduced as in cases where power switch rows SWL are formed directly under reference pads VSSPD. Since the wires SL9 function as main lines large in film thickness and width and low in resistance, they are on the assumption that they are in planar contact with the reference pads VSSPD. For this reason, when the power switch rows SWL are so disposed that they are in planer contact with the wires SL9, the wiring resistance can be reduced as in cases where power switch rows SWL are formed directly under reference pads VSSPD. It is apparent from the foregoing: when the distance between a reference pad VSSPD and a power switch row SWL is not more than X/4, the wiring resistance can be reduced as in cases where the power switch rows SWL are formed directly under the reference pads VSSPD.

Figure 17:
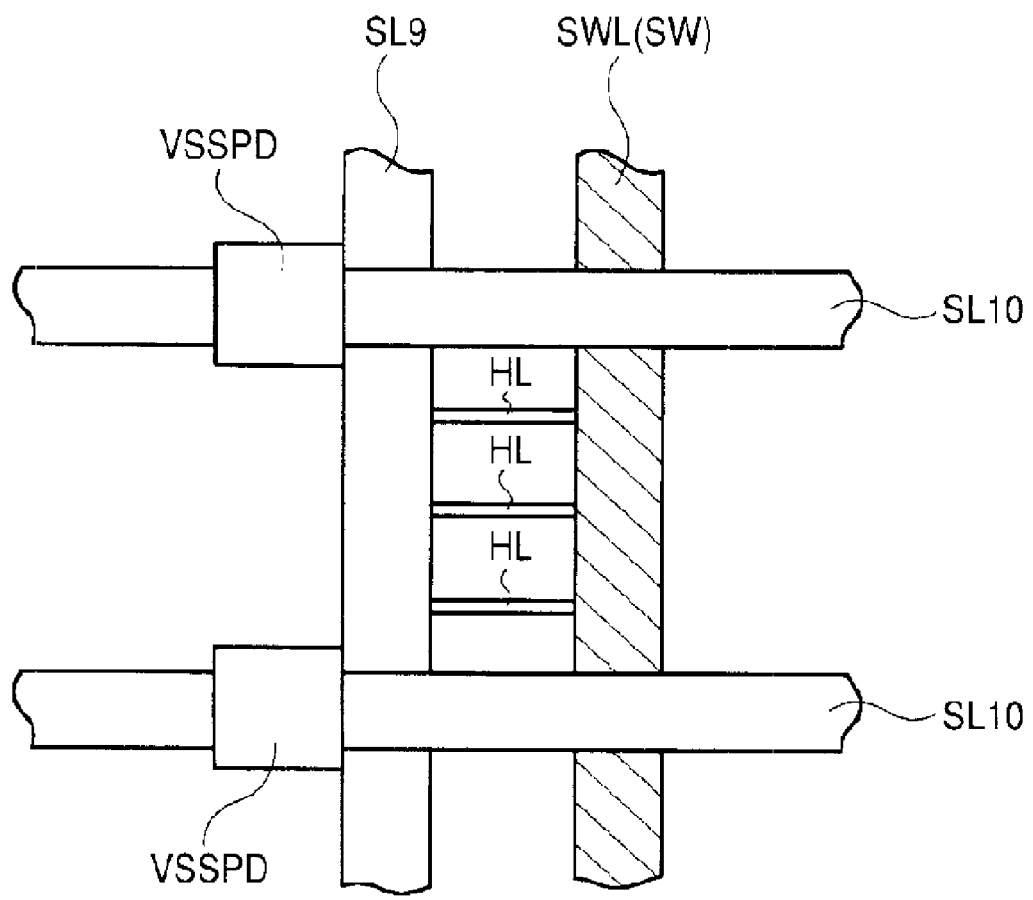
FIG. 17 is a drawing illustrating an example of a case where the distance between reference pads and a power switch row is not less than X/4.

FIG. 17 illustrates an example of cases where the distance between a reference pad VSSPD and a power switch row SWL is not less than X/4. As illustrated in FIG. 17, a wire SL9 is so formed that it is in planar contact with reference pads VSSPD but a power switch row SWL does not have an area in planar contact with the reference pads VSSPD or the wire SL9. To couple together the power switch row SWL and the wire SL9, for this reason, it is required to use a wire HL as a lower-layer wire as illustrated in FIG. 17. The wire HL as a lower-layer wire is smaller in film thickness and width as compared with the wire SL9 and the like as upper-layer wires, and thus high in resistance. Therefore, the wiring resistance of the wires coupling together the power switch rows SWL and the reference pads VSSPD is higher than the wiring resistance obtained when the power switch rows SWL are formed directly under the reference pads VSSPD. That is, in the case illustrated in FIG. 17, the same effect as of the second embodiment cannot be obtained. Consequently, the present inventors discussed the following conditions on the assumption that the structure illustrated in FIG. 15 to FIG. 17 is used: conditions under which the wiring resistance can be reduced to substantially the same level as in cases where power switch rows SWL are formed directly under reference pads VSSPD. As the result of discussion on the positional relation between power switch rows SWL and reference pads VSSPD, the present inventors found the following: when the distance between a reference pad VSSPD and a power switch row SWL is not more than X/4, the wiring resistance can be reduced to substantially the same level as in cases where power switch rows SWL are formed directly under reference pads VSSPD. The value of X/4 is not just a design item, and was found in terms of wiring layout on the assumption that the structure illustrated in FIG. 15 to FIG. 17 is used. It is a distinctive numeric value clearly defining a range in which the same effect as of the second embodiment can be obtained.

FIG. 14 depicts the reference pads VSSPD and the power switch rows SWL so that the positions of the reference pads VSSPD are shifted from the positions of the power switch rows SWL. In reality, the degree of freedom in positioning the power switch rows SWL is higher than the degree of freedom in positioning the reference pads VSSPD. This is because the semiconductor chip CHP is to be mounted over a mounting board and thus the intervals and the like of the reference pads VSSPD are restricted. Therefore, that the positions of the power switch rows SWL are shifted from the formation positions of the reference pads VSSPD more conform to the actual situation. However, FIG. 14 depicts the power switch rows SWL and the reference pads VSSPD so that the reference pads VSSPD are displaced relative to the power switch rows SWL for the sake of simplicity.

Up to this point, description has been given to the planar positional relation between the power switch rows SWL and the reference pads VSSPD with reference to FIG. 14. Next, description will be given to the cross section structure of power switches SW forming a power switch row SWL and a reference pad VSSPD.

Figure 18:
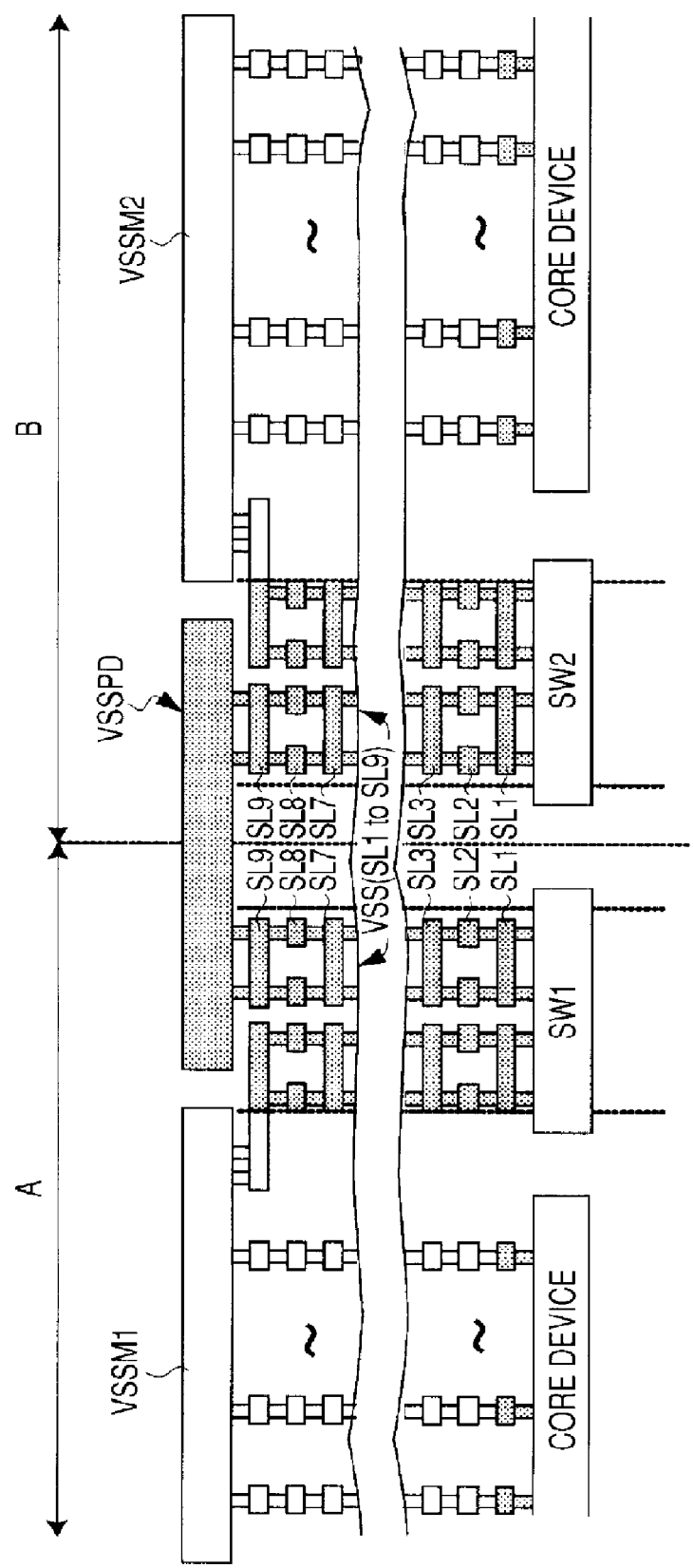
FIG. 18 is a sectional schematic diagram illustrating part of a core region of a semiconductor chip.

FIG. 18 is a sectional schematic diagram illustrating part of the core region of a semiconductor chip. As illustrated in FIG. 18, the region of functional block A and the region of functional block B are formed, and core devices comprised of thin-film MISFETs are formed in functional block A and functional block B. The core devices are formed over a semiconductor substrate. In the boundary between functional block A and functional block B, there are formed a power switch SW1 and a power switch SW2. The power switch SW1 and the power switch SW2 are also formed over a semiconductor substrate, and are comprised of, for example, thick-film MISFETs. The power switch SW1 is for switching functional block A between operational state and non-active state, and the power switch SW2 is for switching functional block B between operational state and non-active state.

Over the core device formed in functional block A or functional block B, a multilayer interconnection is formed, and in the uppermost layer of this multilayer interconnection, a wire VSSM1 or a wire VSSM2 is disposed. A multilayer interconnection is also formed over the power switch SW1 or the power switch SW2. The multilayer interconnection coupled to the drain region of the power switch SW1 is coupled with the wire VSSM1, and the multi layer interconnection coupled to the drain region of the power switch SW2 is coupled with the wire VSSM2. The multilayer interconnection coupled to the source region of the power switch SW1 (a reference wire VSS comprised of a wire SL1 to a wire SL9) is coupled to a reference pad VSSPD at its uppermost layer. Similarly, the multilayer interconnection coupled to the source region of the power switch SW2 (a reference wire VSS comprised of a wire SL1 to a wire SL9) is also coupled to the reference pad VSSPD at its uppermost layer.

Figure 19:
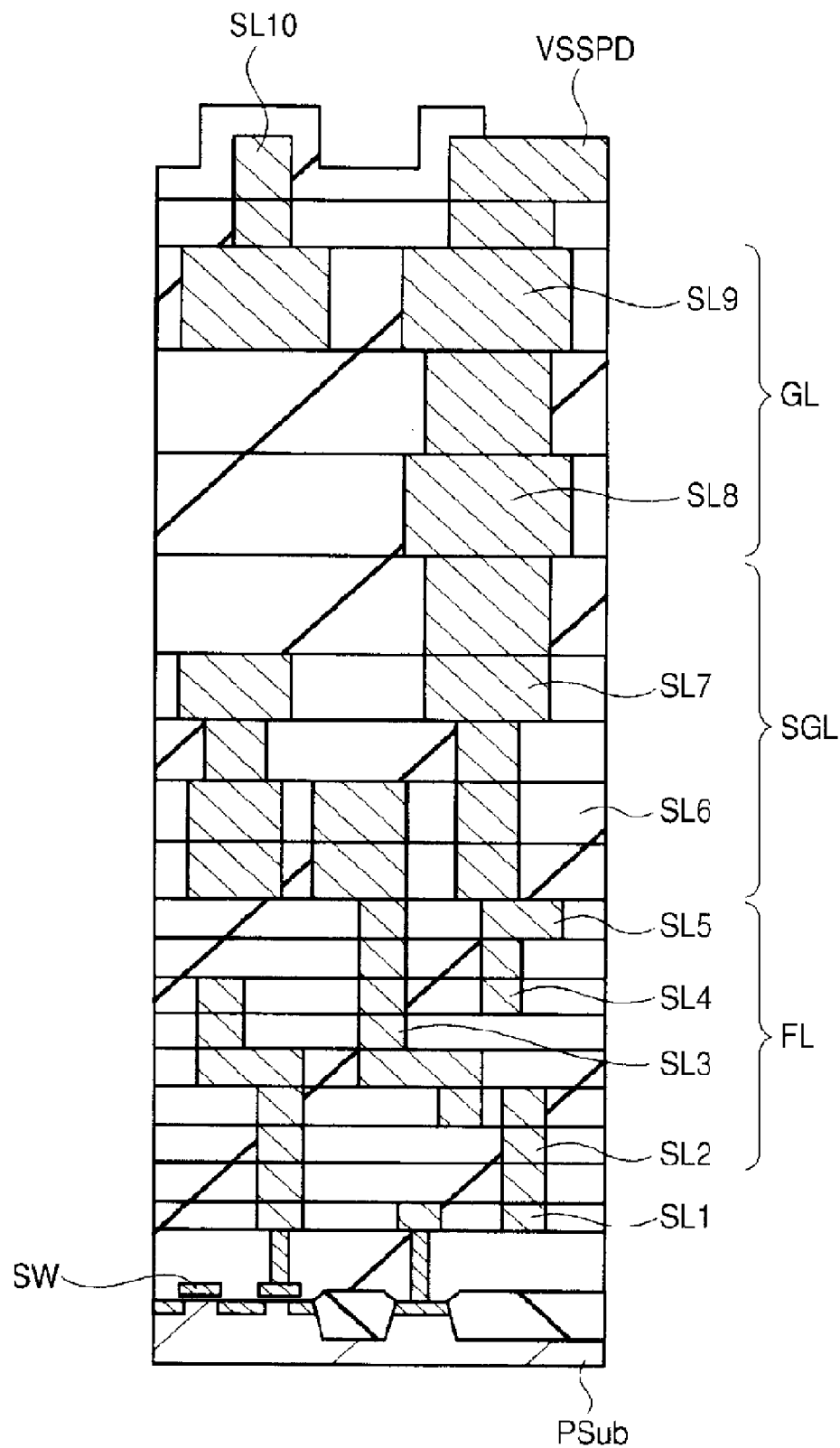
FIG. 19 is a drawing explaining the details of a multilayer interconnection coupled to a power switch.

Detailed description will be given to a multilayer interconnection coupled to a power switch SW with reference to FIG. 19. As illustrated in FIG. 19, the power switch SW comprised of a thick-film MISFET is formed over a semiconductor substrate Psub, and the multilayer interconnection is formed over this power switch SW. The multilayer interconnection is so arranged that wires from wire SL1 to wire SL9 are laminated, and a reference pad VSSPD is formed over the wire SL9. A wire SL10 is formed in the same layer as the reference pad VSSPD. The wires from wire SL1 to wire SL9 are formed of, for example, copper wires, and the wire SL10 is formed of an aluminum wire. As it goes from the wire SL1 formed in the lowermost layer to the wire SL9 formed in the uppermost layer, the film thickness of the wires is increased and the width of the wires is increased as well. That is, the wire SL1 in the first layer is smallest in film thickness and smallest in wire width. The wires from wire SL2 to wire SL5 will be designated as fine wires FL, and the wire SL6 and the wire SL7 will be designated as semiglobal wires SGL. The wire SL8 and the wire SL9 will be designated as global wires GL.

The wire SL9 formed under the reference pad VSSPD is large in film thickness and in wire width, and makes a main line for supplying reference potential.

There are also cases where a bump electrode is formed over the reference pad VSSPD or so-called rewiring is formed over the reference pad VSSPD and a bump electrode is formed in a place different from the place of the reference pad VSSPD.

Figure 20:
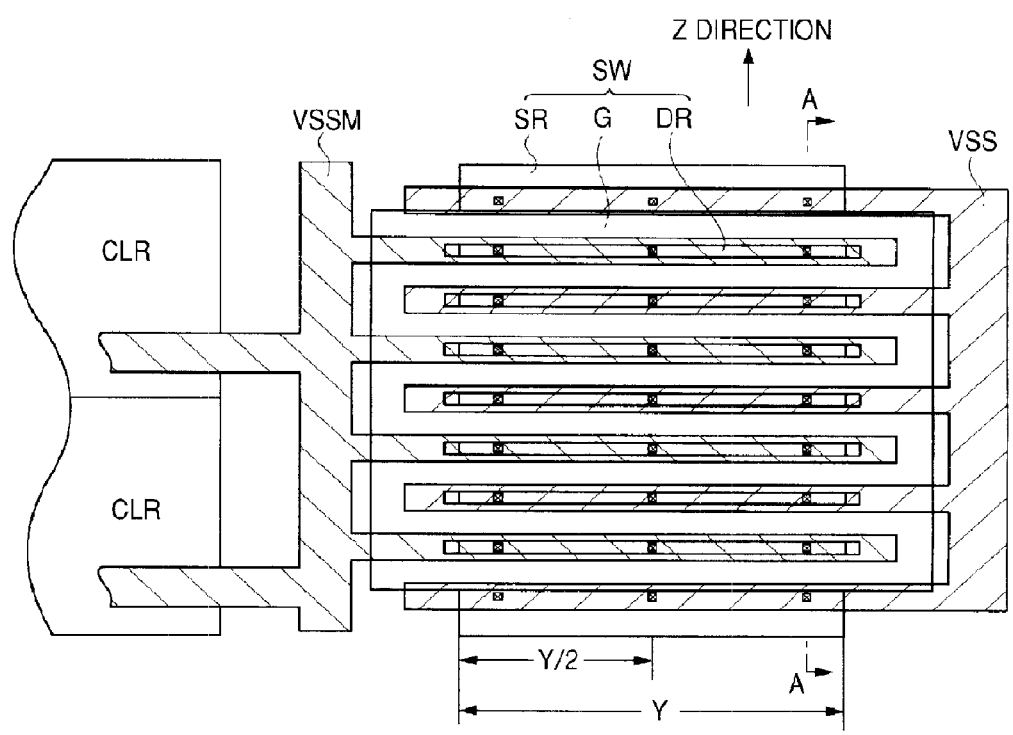
FIG. 20 is a plan view mainly illustrating a power switch.

Description will be given to the planer arrangement of a power switch SW with reference to FIG. 20. FIG. 20 is a plan view mainly illustrating power switches SW. As illustrated in FIG. 20, a rectangular diffusion layer is formed, and part of this diffusion layer makes a source region SR and a drain region DR. Between the source region SR and the drain region DR, a gate electrode G is formed with a gate insulating film (not shown) in-between. The MISFET comprised of the source region SR, drain region DR, and gate electrode G forms a power switch SW. The power switch SW is plurally formed in the diffusion layer in a predetermined direction, and they form a power switch row.

The source region SR of each power switch SW is coupled with a reference wire VSS through a plug, and the drain region DR of the power switch SW is coupled with a wire VSSM through a plug. The wire VSSM is extended to cell rows CLR formed in a functional block. The reference wire VSS for supplying reference potential and the wire VSSM are coupled to and decoupled from each other by controlling turn-on/off of the thus arranged power switches SW. When the power switches SW are on, the reference wire VSS and the wire VSSM are electrically coupled together and reference potential is supplied to the cell rows CLR through the wire VSSM. When the power switches SW are off, the reference wire VSS and the wire VSSM are electrically decoupled from each other and reference potential is not supplied to the cell rows CLR.

Figure 21:
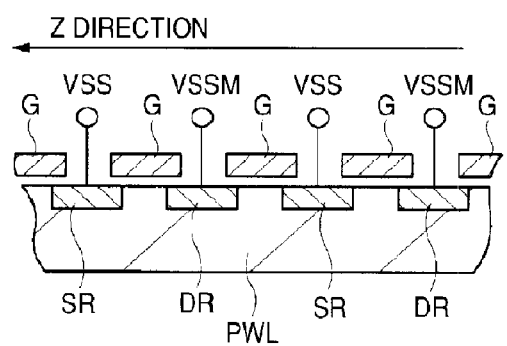
FIG. 21 is a sectional schematic diagram illustrating a section taken along line A-A of FIG. 20.

FIG. 21 is a sectional schematic diagram illustrating a section taken along line A-A of FIG. 20. As illustrated in FIG. 21, source regions SR and drain regions DR are alternately formed in a p-type well PWL formed in a semiconductor substrate, and a gate electrode G is formed between the source regions SR and the drain regions DR. It is apparent from the drawing that multiple power switches each including a source region SR, drain region DR, and gate electrode G as constituent elements are formed in line.

Previously, description was given to the distance between the reference pads VSSPD and the power switch rows SWL with reference to FIG. 14. Here, description will be given to the definition of the distance between the reference pads VSSPD and the power switch rows SWL. The direction in which multiple power switches SW are lined as illustrated in FIG. 20 will be defined as predetermined direction (Z direction). That is, the direction in which the power switch rows are extended is defined as the predetermined direction. The width of the diffusion layer in the direction intersecting the predetermined direction will be taken as Y. Thus, the central line of the diffusion layer goes through a position in which the width Y is equally divided into two (position represented by Y/2) and is extended in the predetermined direction. This central line of the diffusion layer will be defined as the central line of the power switch rows. The distance between the reference pads VSSPD and the power switch rows at this time is taken as the distance between the central line of the reference pads VSSPD and the central line of the power switch rows. (The above distance between the reference pads VSSPD and the power switch rows at this time is equivalent to the distance between P and Q in FIG. 4 and FIG. 9 or X/4 indicated in FIG. 14.) Thus, the distance between the reference pads VSSPD and the power switch rows is well defined.

In the description of the second embodiment with respect to the positional relation between the reference pads VSSPD and the power switches SW, an arbitrary functional block obtained by dividing the core region CR is taken as an example. This arbitrary functional block refers to individual functional blocks in which, for example, the following are respectively formed: the operation part CPU, memory RAM, processor DSP, interface circuit IF, non-blocked circuit SGC, system controller SYSC, power switch controllers SWC1 to SWC5, analog circuits AIg1, AIg2, and the like.

(Third Embodiment)

In the description of the first embodiment and the second embodiment, cases where reference pads VSSPD are disposed over a core region CR have been taken as examples. In the description of a third embodiment, a case where reference pads VSSPD are disposed not only over a core region CR but also over an I/O region IOR will be taken.

Figure 22:
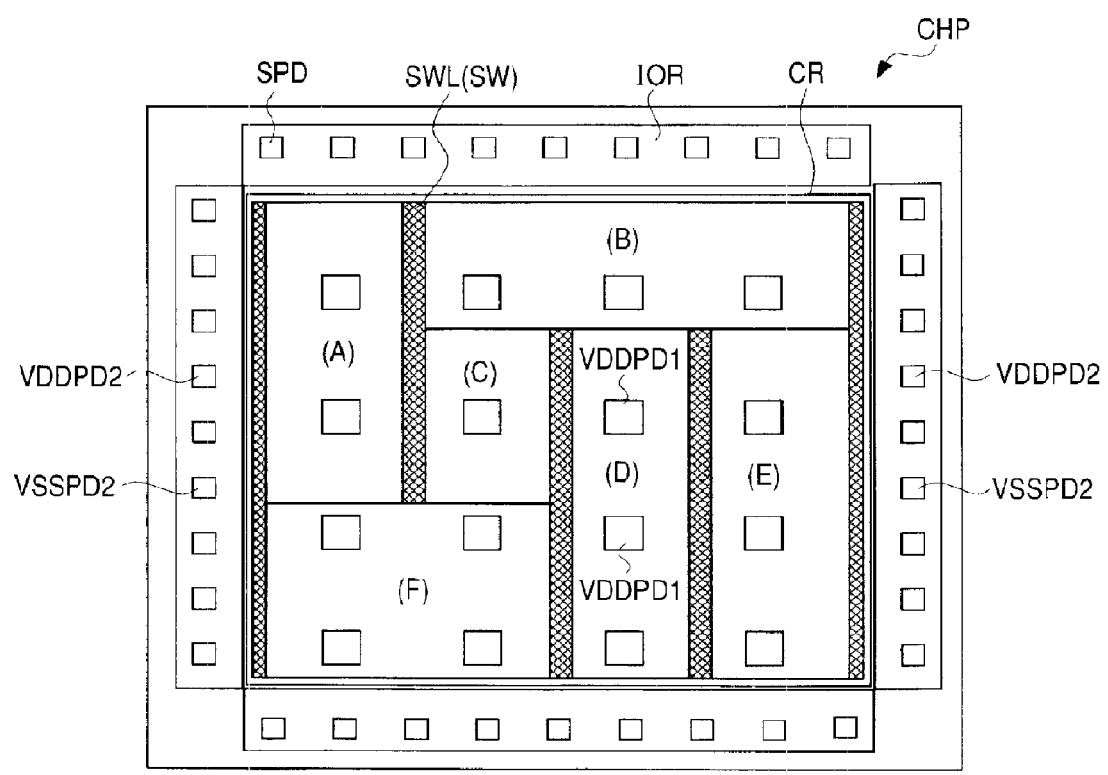
FIG. 22 is a plan view illustrating the relation between the disposed positions of pads and the disposed positions of power switch rows in a semiconductor chip in a third embodiment.

FIG. 22 is a plan view illustrating the layout of a semiconductor chip CHP in the third embodiment. The layout of the semiconductor chip CHP in FIG. 22 is substantially the same as the layout of the semiconductor chip CHP in the first embodiment illustrated in FIG. 4. In the semiconductor chip in FIG. 22, as in the first embodiment, reference pads VSSPD1 are formed in a core region CR and these reference pads VSSPD1 are formed over the functional blocks from functional block A to functional block F. Specifically, a reference pad VSSPD1 is disposed between a pair of power switch rows SWL formed in the proximity to the boundary (both ends) of each of functional block A to functional block F. These reference pads VSSPD1 are coupled to wires (wires VSSM not shown in FIG. 22) disposed in each of functional block A to functional block F through power switches SW. Also in the third embodiment, as mentioned above, the distance between the reference pads VSSPD1 and the power switches SW can be shortened by disposing the reference pads VSSPD1 in the core region CR. Therefore, the resistance of wires can be reduced, and the advantage that voltage fluctuation in the reference potential supplied from the reference pads VSSPD1 to functional block A to functional block F is reduced is obtained. In the third embodiment, as illustrated in FIG. 22, reference pads VSSPD2 are formed in the I/O region IOR as well.

Figure 23:
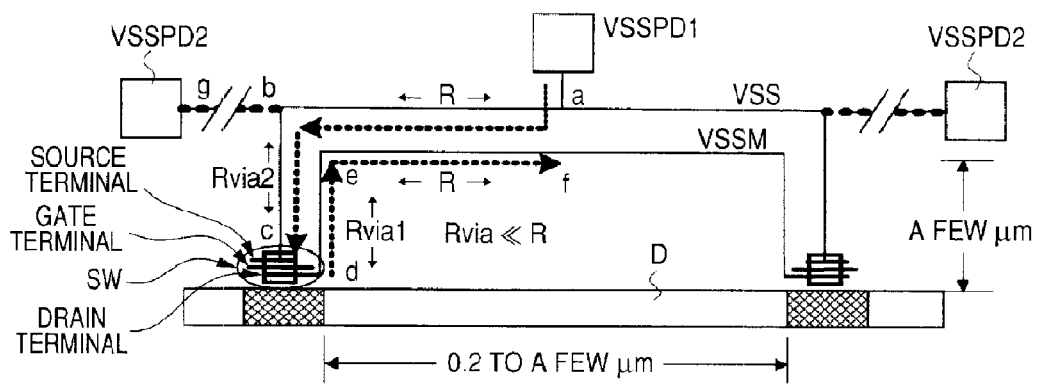
FIG. 23 is a drawing illustrating the positional relation between reference pads and a power switch.
Figure 24:
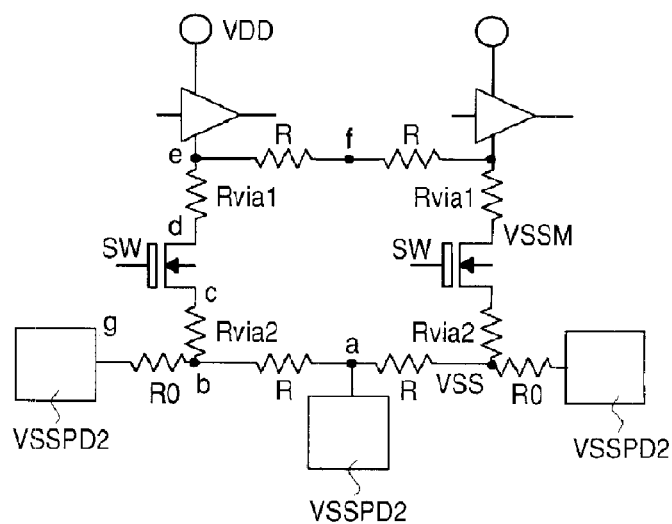
FIG. 24 is a diagram of an equivalent circuit to FIG. 23.

FIG. 23 illustrates the positional relation between a reference pad VSSPD1 and reference pads VSSPD2 and power switches SW (schematic view taken along the direction of the section of FIG. 22); and FIG. 24 is a diagram of an equivalent circuit to FIG. 23. The codes a to g indicated in FIG. 23 correspond to the codes a to g indicated in FIG. 24. As illustrated in FIG. 23 and FIG. 24, the reference pad VSSPD1 and the source terminals of the power switches SW are coupled together through a reference wire VSS, and the drain terminals of the power switches SW are coupled with a wire VSSM. The reference pad VSSPD1 is placed between the power switches SW disposed at both ends of functional block D. At this time, the distance from the reference pad VSSPD1 to the center of the wire VSSM (center of functional block D) is represented as a route extending from point a to point f. At this time, the wiring resistance of the wire from point a to point b is R, and the wiring resistance of the wire from point b to point c is Rvia2. The wiring resistance of the wire from point d to point e is Rvia1, and the wiring resistance of the wire from point e to point f is R. Hence, the wiring resistance of the wire from point a to point f, representing the distance from the reference pad VSSPD1 to the center of functional block D, is expressed as Rtotal=2×R+Rvia1+Rvia2. In the third embodiment, in addition, the reference pads VSSPD2 are formed, and the reference pads VSSPD2 and the reference pad VSSPD1 are electrically coupled together through the reference wire VSS. Therefore, the reference pads VSSPD2 are also coupled with the wire VSSM formed in functional block D through the power switches SW (from point g to point f).

One of the features of the third embodiment is that: not only the reference pads VSSPD1 are provided in the core region CR but also the reference pads VSSPD2 are provided in the I/O region IOR positioned outside the core region CR. The effect of the invention is obtained by providing the reference pads VSSPD1 in the core region CR, not in the I/O region IOR, as in the first embodiment. Therefore, it may be suspected that a reference pad VSSPD2 need not be additionally provided in the I/O region IOR. However, provision of the reference pads VSSPD2 in the I/O region IOR also brings an advantage. Description will be given to this advantage. A manufacturing process for the semiconductor chip CHP includes a step for conducting an electrical characteristic test. This electrical characteristic test is for inspecting whether or not the electrical characteristics of elements formed in the semiconductor chip CHP are normal. It is conducted by bringing a probe into contact with a pad formed in the semiconductor chip CHP and applying a predetermined signal to the pad.

In conventional semiconductor chips, pads are formed in an I/O region positioned in the peripheral portion of a semiconductor chip and thus a cantilever-type probe used to be brought into contact with pads for inspection. However, when reference pads VSSPD as some of such pads are disposed in a core region CR as in the first embodiment and the second embodiment, a cantilever-type probe cannot be used, and any other type must be used to conduct an electrical characteristic test. Cantilever-type probes are generally used and have an advantage of low cost. Use of a vertical contact probe, for example, increases a cost. Therefore, it is desirable to use cantilever-type probe in electrical characteristic tests from the viewpoint of cost reduction. To use a cantilever-type probe, it is required to provide pads in the area (I/O region IOR) on the periphery of a semiconductor chip CHP.

In the third embodiment, consequently, the reference pads VSSPD1 are provided in the core region CR, and then these reference pads VSSPD1 and the power switches SW are coupled together. The effect of reducing the wiring resistance as in the first embodiment is thereby ensured. In the third embodiment, further, the reference pads VSSPD2 electrically coupled with the reference pads VSSPD1 are disposed in the I/O region IOR, and it is thereby made possible to conduct an electrical characteristic test using these reference pads VSSPD2. That is, a cantilever-type probe can be used in electrical characteristic tests, and this contributes to cost reduction.

Figure 25:
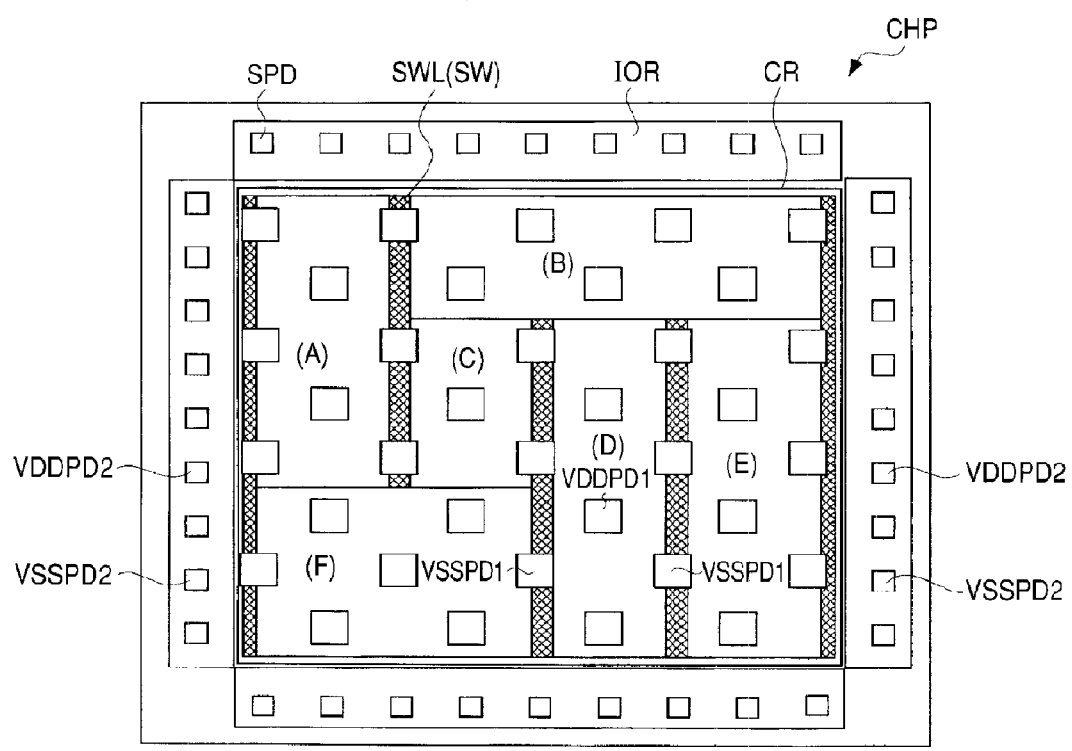
FIG. 25 is a plan view illustrating the relation between the disposed positions of pads and the disposed positions of power switch rows in a semiconductor chip in the third embodiment.

FIG. 25 illustrates another example of the third embodiment. FIG. 25 planarly depicts the layout of a semiconductor chip CHP. FIG. 25 corresponds to the second embodiment, and in the example illustrated in this drawing, reference pads VSSPD1 formed in a core region CR are formed directly above power switch rows SWL as in the second embodiment. (Refer to FIG. 9 for the second embodiment.) In the example in FIG. 25, further, reference pads VSSPD2 are formed in an I/O region IOR as well.

Figure 26:
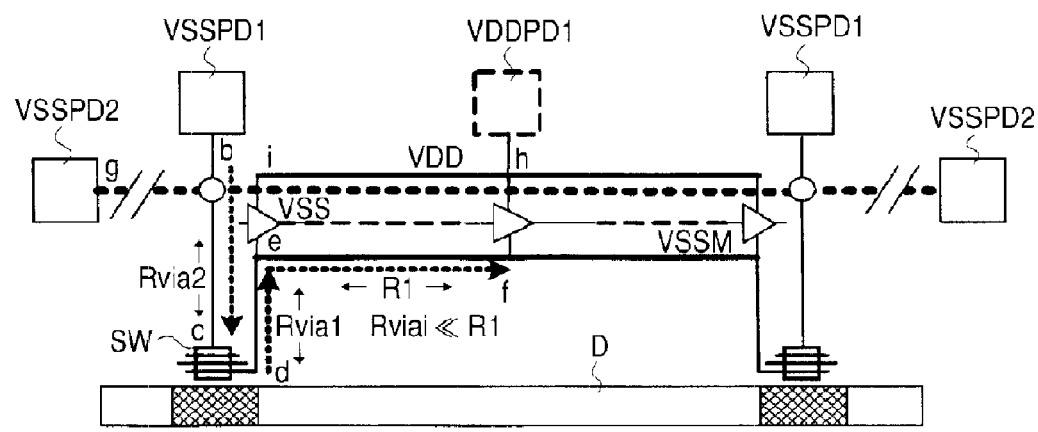
FIG. 26 is a drawing illustrating the positional relation between reference pads and a power switch.
Figure 27:
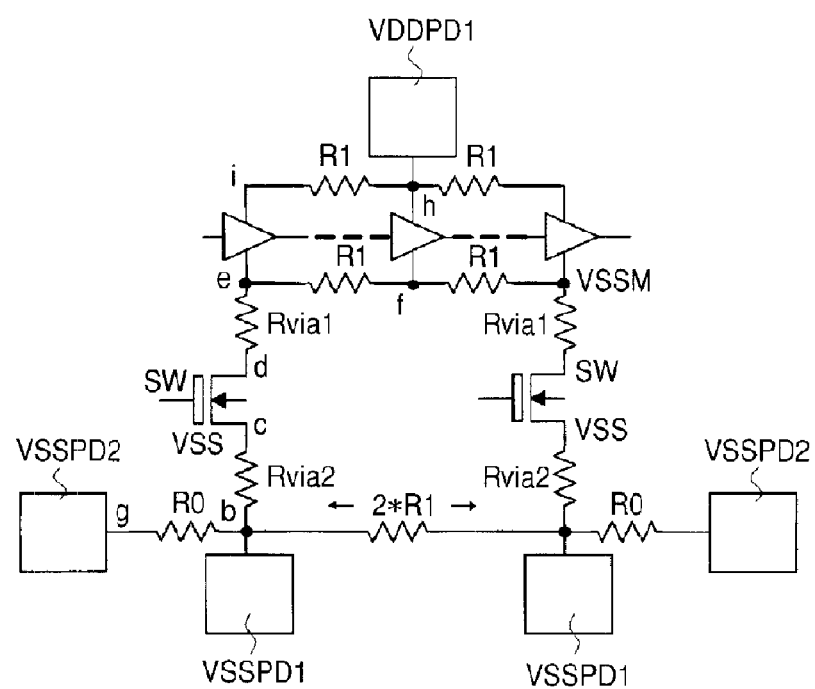
FIG. 27 is a diagram of an equivalent circuit to FIG. 26.

FIG. 26 illustrates the positional relation between reference pads VSSPD1 and reference pads VSSPD2 and power switches SW (schematic view taken along the direction of the section of FIG. 25); and FIG. 27 is a diagram of an equivalent circuit to FIG. 26. The codes b to i indicated in FIG. 26 correspond to the codes b to i indicated in FIG. 27. FIG. 26 and FIG. 27 are substantially the same as FIG. 12 and FIG. 13 referred to in the description of the second embodiment. A difference is as follows: in the third embodiment, the reference pads VSSPD2 are formed and these reference pads VSSPD2 and the reference pads VSSPD1 are electrically coupled together through wires VSS. These reference pads VSSPD2 are also coupled to wires VSSM formed in functional block D through power switches SW (from point g to point f).

Also, in this case, as mentioned above, the effect of further reducing the wiring resistance than in the first embodiment can be ensured as in the second embodiment by taking the following measure: the reference pads VSSPD1 are provided in the core region CR, and these reference pads VSSPD1 are disposed directly above the power switch rows SWL and they are coupled together. In the third embodiment, further, the reference pads VSSPD2 electrically coupled with the reference pads VSSPD1 are disposed in the I/O region IOR. Thus, electrical characteristic tests can be conducted using these reference pads VSSPD2. That is, a cantilever-type probe can be used in electrical characterictic tests, and this contributes to cost reduction.

The third embodiment is so arranged that: the reference pads VSSPD1 are disposed in the core region CR and the reference pads VSSPD2 are disposed in the I/O region IOR as well; and these reference pads VSSPD2 are also coupled to the power switches SW. The following arrangement may be similarly adopted: the power supply pads VDDPD1 are disposed in the core region CR and the power supply pads VDDPD2 are disposed in the I/O region IOR as well; and these power supply pads VDDPD2 are coupled to the power switches SW. This arrangement makes it possible to dispose the reference pads VSSPD2 and the power supply pads VDDPD2 in the I/O region IOR; therefore, a cantilever-type probe can be used in electrical characterictic tests. This contributes to cost reduction.

(Fourth Embodiment)

A fourth embodiment is a modification to the second embodiment. More specific description will be given. The second embodiment adopts such a layout that the reference pads VSSPD are disposed directly above the power switch rows SWL. However, the following case is possible depending on the interval of reference pad VSSPD formation and how the blocks from functional block A to functional block F are separated from one another: a case where power switch rows SWL cannot be disposed directly under reference pads VSSPD in all the areas in the core region CR. The description of the fourth embodiment will be given to a layout adopted when the power switch rows SWL cannot be disposed directly under the reference pads VSSPD in all the areas in the core region CR.

Figure 28:
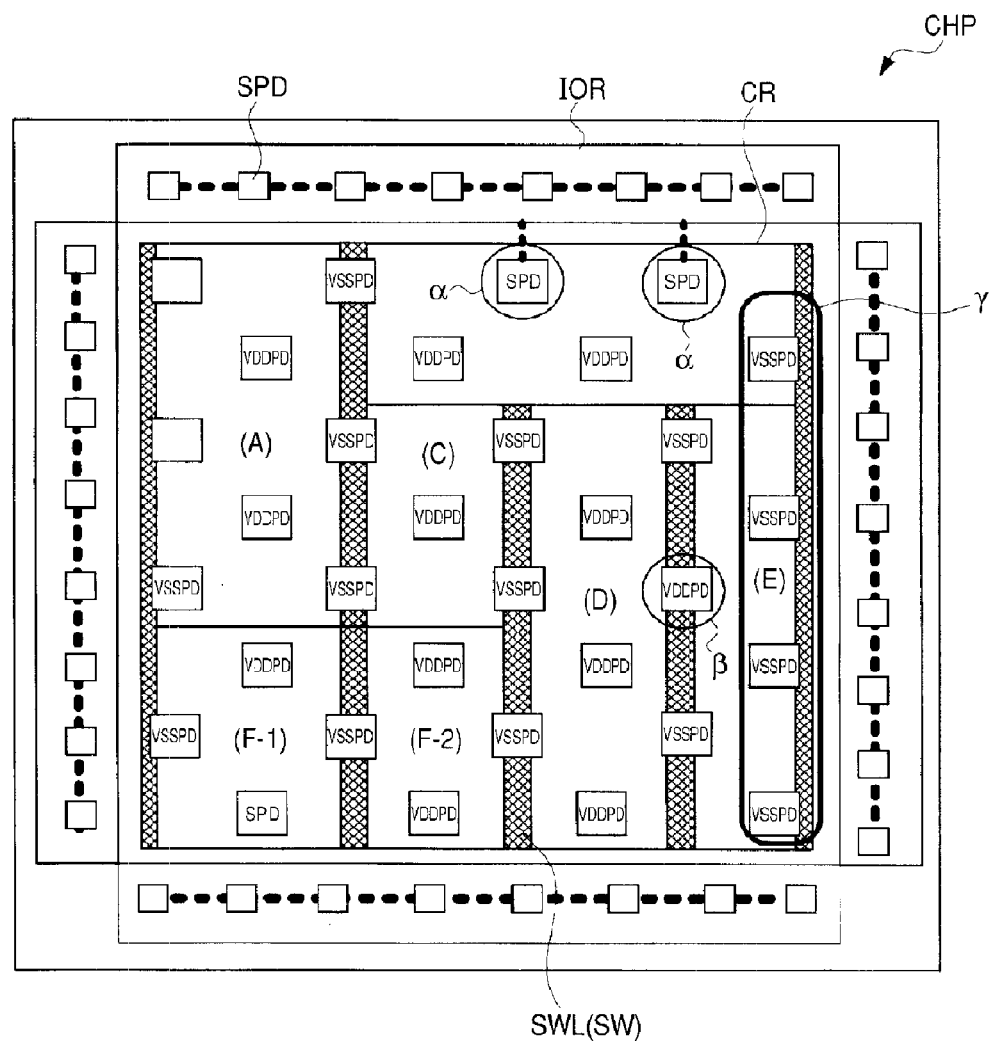
FIG. 28 is a plan view illustrating the relation between the disposed positions of pads and the disposed positions of power switch rows in a semiconductor chip in a fourth embodiment.

FIG. 28 is a plan view illustrating the layout of a semiconductor chip CHP in the fourth embodiment. As illustrated in FIG. 28, a core region CR is divided into individual functional blocks. At this time, a pair of power switch rows SWL are formed at both end of each functional block. Further, reference pads VSSPD and power supply pads VDDPD are regularly disposed at predetermined intervals over the core region CR.

The semiconductor chip CHP in the fourth embodiment also has such a layout that the power switch rows SWL are basically disposed directly under the reference pads VSSPD. However, the following case is possible depending on the interval of reference pad VSSPD formation and how the blocks from functional block A to functional block F are separated from one another: a case where power switch rows SWL cannot be disposed directly under reference pads VSSPD in all the areas in the core region CR. An example will be taken. In consideration of the regular disposition of the reference pads VSSPD, reference pads VSSPD should be formed in the encircled areas a in functional block B. Since the areas α are not positioned at both ends of functional block B but positioned inside it, a power switch row SWL is not disposed there. Therefore, even if a reference pad VSSPD is disposed in an area α, a power switch row SWL is not disposed directly under the reference pad VSSPD. Consequently, for example, a signal pad SPD can be formed in the areas α, instead of forming a reference pad VSSPD. Conversely, the following arrangement may be adopted: a power switch row SWL is also provided in areas, such as functional block F-1 and functional block F-2, other than at both ends of functional blocks having specific functions so that the power switch rows SWL are disposed directly under the reference pads VSSPD. That is, an adjustment may be made so that the following is implemented: a power switch row SWL is provided in an area other than at both ends of a functional block that is one and the same block and need not be divided and the block is divided into, for example, functional block F-1 and functional block F-2; and a reference pad VSSPD is disposed directly above the power switch row SWL that divides functional block F-1 and functional block F-2 from each other. Like the area β, further, an adjustment may be made so that the following is implemented: a reference pad VSSPD is disposed over a power switch row SWL but a power supply pad VDDPD is disposed for the reason of layout. Because of the interval of reference pad VSSPD formation and how the functional blocks from functional block A to functional block F are separated from one another, the following can take place especially in the peripheral portion of the core region CR: a power switch row SWL cannot be disposed directly under reference pads VSSPD and it is misaligned therewith. In the area γ, for example, reference pads VSSPD are not formed directly above a power switch row SWL. However, the same effect as in cases where reference pads VSSPD are disposed directly above power switch rows SWL can be obtained by taking the following measure, as described with respect to the second embodiment: the reference pads VSSPD and the power switch rows SWL are so disposed that they planarly overlap each other as in the area γ. Further, the same effect as in cases where reference pads VSSPD are disposed directly above power switch rows SWL can be obtained, as described with respect to the second embodiment, even in the following case: a case where the reference pads VSSPD and the power switch rows SWL are so misaligned that they are not in planar contact with each other. The above effect is achieved by disposing the reference pads VSSPD and the power switch rows SWL so that the distance between them is not more than a predetermined value. In the fourth embodiment, as mentioned above, it is possible to achieve a layout with the following taken into account without reducing the above-mentioned effect of the second embodiment: the interval of reference pad VSSPD formation and how the functional blocks from functional block A to functional block F are separated from one another.

Figure 29:
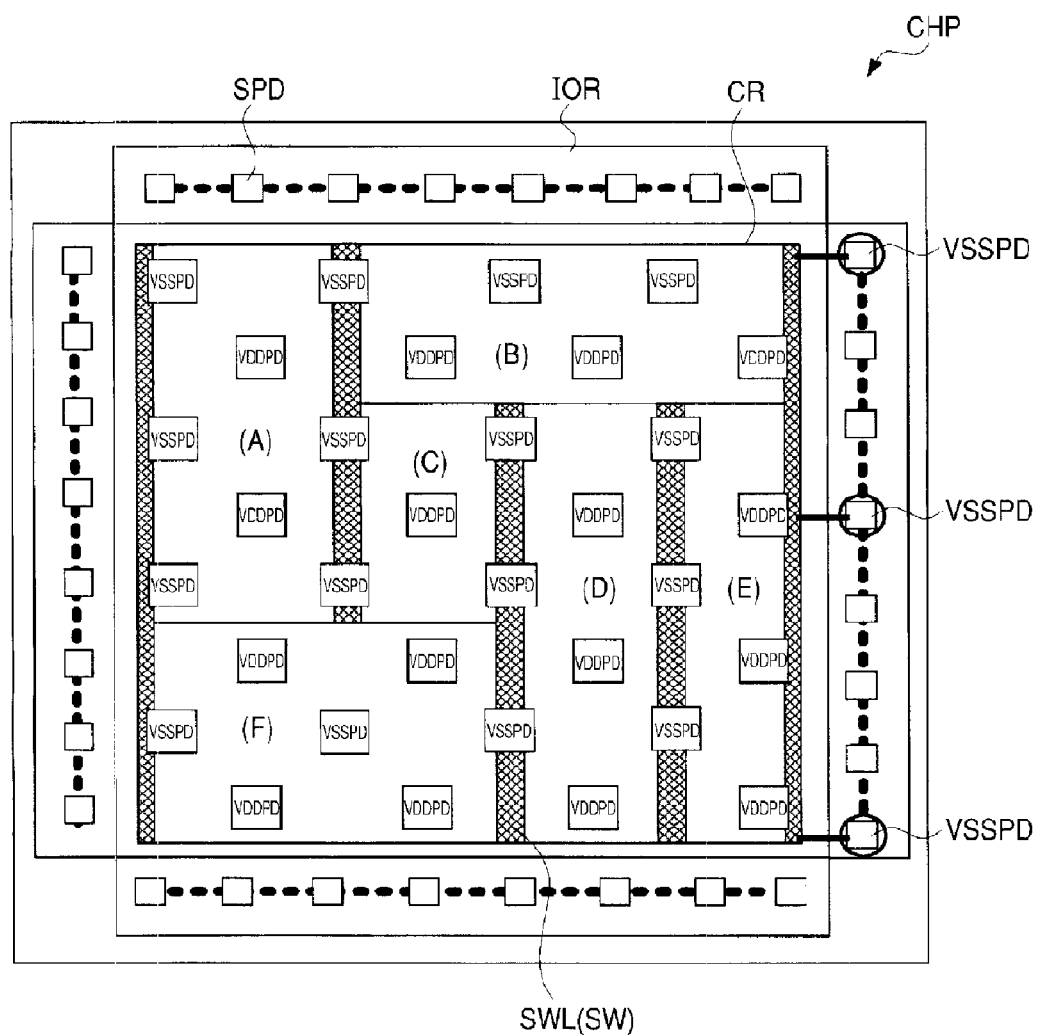
FIG. 29 is a plan view illustrating the relation between the disposed positions of pads and the disposed positions of power switch rows in a semiconductor chip in the fourth embodiment.

FIG. 29 illustrates another example of the fourth embodiment. In the example in FIG. 29, a reference pad VSSPD is not disposed directly above a power switch row SWL at ends of a core region CR. In this case, the following arrangement may be adopted: reference pads VSSPD and power switch rows SWL are not coupled together; and reference pads VSSPD are formed in an I/O region IOR, and the reference pads VSSPD formed in the I/O region IOR and a power switch row SWL formed at an end of the core region CR are coupled together. Since the distance between the power switch row SWL formed at the end of the core region CR and the I/O region IOR is short, increase in wiring resistance is not significant so much.

(Fifth Embodiment)

A fifth embodiment is a modification to the second embodiment and relates to a technology that makes it possible to enhance the resistance to surge voltage due to electrostatic discharge.

Conventional arrangements in which reference pads are provided in an I/O region is provided with a function of protecting internal elements against surge voltage due to electrostatic discharge when this surge voltage is applied to a reference pad. That is, the reference pads are coupled with diodes as protection elements for protecting internal circuits against surge voltage. These diodes are formed in the I/O region. In the above-mentioned second embodiment, meanwhile, reference pads VSSPD are provided in a core region CR, and power switches SW formed directly under the reference pads VSSPD and the reference pads VSSPD are coupled together. The power switches SW are coupled with wires VSSM, and internal circuits (logic circuits) are formed between the wires VSSM and power supply wires VDD. At this time, a diode is not provided between the wires VSSM and the power supply wires VDD, and surge resistance is not taken into account.

Consequently, one of the features of the fifth embodiment is as follows: the same arrangement as of the second embodiment is adopted and yet a diode for surge resistance is provided in a core region CR. That is, the reference pads VSSPD are disposed directly above the power switch rows SWL and further a diode is formed in the core region CR.

Figure 30:
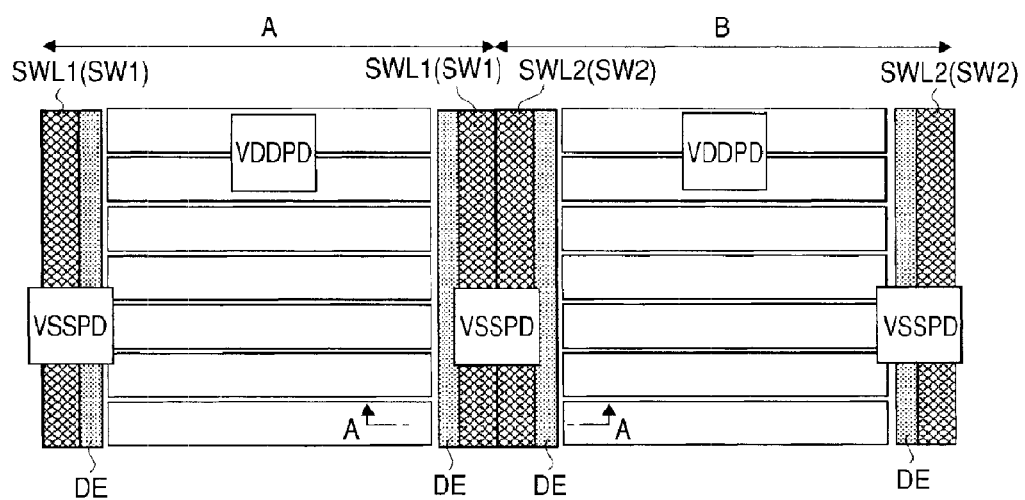
FIG. 30 is a plan view illustrating part of a core region of a semiconductor chip in a fifth embodiment.

FIG. 30 is a plan view illustrating part of the core region of a semiconductor chip in the fifth embodiment. In the example in FIG. 30, functional block A and functional block B are adjacently formed in the core region, and a power switch row SWL1 is provided at both ends of functional block A. Similarly, a power switch row SWL2 is provided at both ends of functional block B. Reference pads VSSPD are formed directly above the power switch rows SWL1. SWL2. In functional block A, a power supply pad VDDPD is formed between a pair of the power switch rows SWL1, and in functional block B, a power supply pad VDDPD is formed between a pair of the power switch rows SWL2. One of the features of the fifth embodiment is that diodes DE (diode rows) are formed in parallel with one another in line with the power switch rows SWL1, SWL2.

Figure 31:
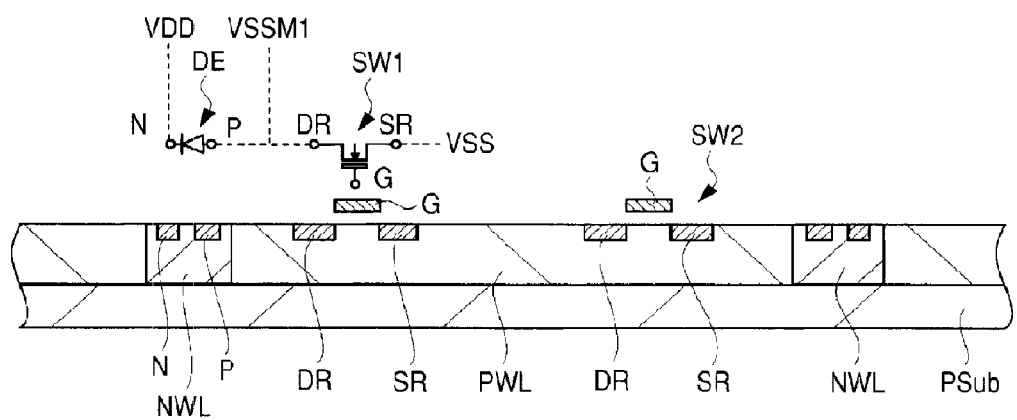
FIG. 31 is a sectional schematic diagram illustrating a section taken along line A-A of FIG. 30.

FIG. 31 is a sectional schematic diagram illustrating a section taken along line A-A of FIG. 30. In the example in FIG. 31, a p-type well PWL and n-type wells NWL are formed in a semiconductor substrate Psub. In the p-type well PWL, there are formed source regions SR and drain regions DR implanted with an n-type impurity. Between the source regions SR and the drain regions DR, there are formed gate electrodes G over the semiconductor substrate Psub with a gate insulating film (not shown) in-between. The MISFETs comprised of the source regions SR, drain regions DR, and gate electrodes G form a power switch SW1 and a power switch SW2. Thus, the n-type wells NWL are formed adjacently to the p-type well PWL where the power switches SW1, SW2 are formed; and a p-type semiconductor region P implanted with a p-type impurity and an n-type semiconductor region N implanted with an n-type impurity are formed in these n-type wells NWL. The p-type semiconductor region P and the n-type semiconductor region N form a diode DE.

Figure 32:
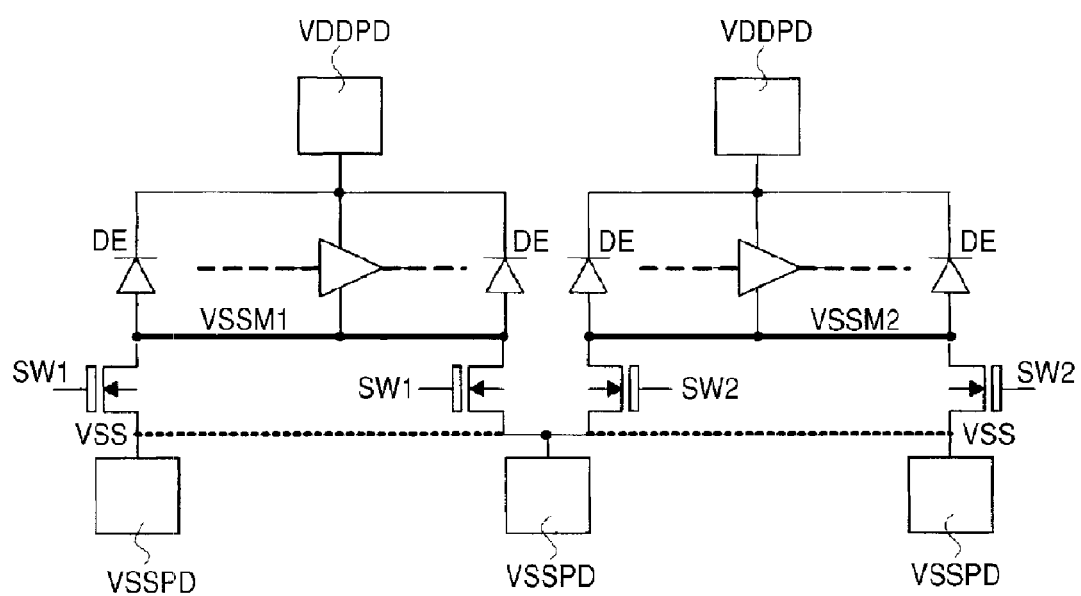
FIG. 32 is a circuit diagram containing the relation of coupling between power switches and diodes.

Description will be given to the relation of coupling between the power switches SW1, SW2 comprised of MISFETs and diodes DE as protection elements for surge resistance. FIG. 32 is a circuit diagram including the relation of coupling between power switches SW1, SW2 and diodes DE. As illustrated in FIG. 32, multiple reference pads VSSPD are coupled together through a reference wire VSS (dotted line). The power switches SW1 are coupled between the reference pads VSSPD and a wire VSSM1. The source terminals of the MISFETs forming the power switches SW1 are coupled to the reference pads VSSPD, and the drain terminals of the MISFETs are coupled to the wire VSSM1. An internal circuit (logic circuit) is formed between the wire VSSM1 and a power supply pad VDDPD, and diodes DE are coupled between the wire VSSM1 and the power supply pad VDDPD. Similarly, the power switches SW2 are coupled between the reference pads VSSPD and a wire VSSM2. The source terminals of the MISFETs forming the power switches SW2 are coupled to the reference pads VSSPD, and the drain terminals of the MISFETs are coupled to the wire VSSM2. An internal circuit (logic circuit) is formed between the wire VSSM2 and a power supply pad VDDPD, and diodes DE are coupled between the wire VSSM2 and the power supply pad VDDPD. Thus, the internal circuits coupled between the wire VSSM1 or the wire VSSM2 and a power supply pad VDDPD can be protected against surge voltage due to electrostatic discharge by the diodes DE.

In the fifth embodiment, as mentioned above, diodes DE can be additionally formed in a core region CR even in such an arrangement that reference pads VSSPD are provided in the core region CR. For this reason, the effect of reducing the wiring resistance to suppress voltage fluctuation can be obtained as in the second embodiment, and further internal circuits can be sufficiently protected against surge voltage due to electrostatic discharge.

(Sixth Embodiment)

Figure 33:
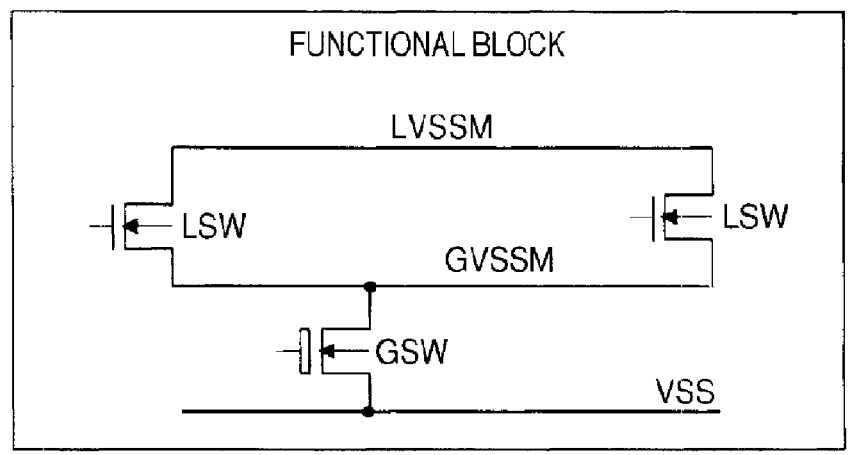
FIG. 33 is a schematic diagram illustrating the relation of coupling between layered power switches disposed in a functional block in a sixth embodiment.

In a sixth embodiment, power switches are layered. FIG. 33 is a schematic diagram illustrating the relation of coupling between layered power switches disposed in a functional block. In the example in FIG. 33, a global power switch GSW is coupled between a reference wire VSS and a global wire GVSSM, and local power switches LSW are coupled between the global wire GVSSM and a local wire LVSSM. Though not shown in FIG. 33, an internal circuit (logic circuit) is formed between the local wire LVSSM and a power supply wire VDD (not shown). The reference wire VSS is coupled with a reference pad VSSPD (not shown), and the power supply wire VDD (not shown) is coupled with a power supply pad VDDPD (not shown).

With the global power switch GSW and the local power switches LSW coupled as mentioned above, the following can be implemented: reference potential can be supplied from the reference pad VSSPD (not shown) to the local wire LVSSM by simultaneously turning on the global power switch GSW and the local power switches LSW; and as a result, an internal circuit in the functional block is brought into operational state. Meanwhile, the supply of reference potential to the local wire LVSSM can be interrupted by turning off either the global power switch GSW or the local power switches LSW. That is, the internal circuit in the functional block can be brought into non-active state by turning off either the global power switch GSW or the local power switches LSW.

For example, the local power switches LSW are formed of a thin-film MISFET like the internal circuit, and the global power switch GSW is formed of a thick-film MISFET. This makes it possible to control the supply of reference potential and the interruption of this supply by two different methods. When the supply of reference potential and the interruption of this supply are controlled by the global power switch GSW comprised of a thick-film MISFET, for example, the leakage current can be reduced when the functional block is in non-active state. This is because thick-film MISFETs have a thick gate insulating film and thus the leakage current passed through the gate insulating film can be reduced. That is, when the supply of reference potential and the interruption of this supply are controlled by the global power switch GSW, power consumption can be reduced.

When the supply of reference potential and the interruption of this supply are controlled by the local power switches LSW formed of a thin-film MISFET, meanwhile, the local power switches LSW operate at high speed. Therefore, the functional block can be switched between operational state and non-active state at high speed. As mentioned above, provision of global power switches GSW and local power switches LSW makes it possible to elaborately control the switching of functional blocks between operational state and non-active state.

Figure 34:
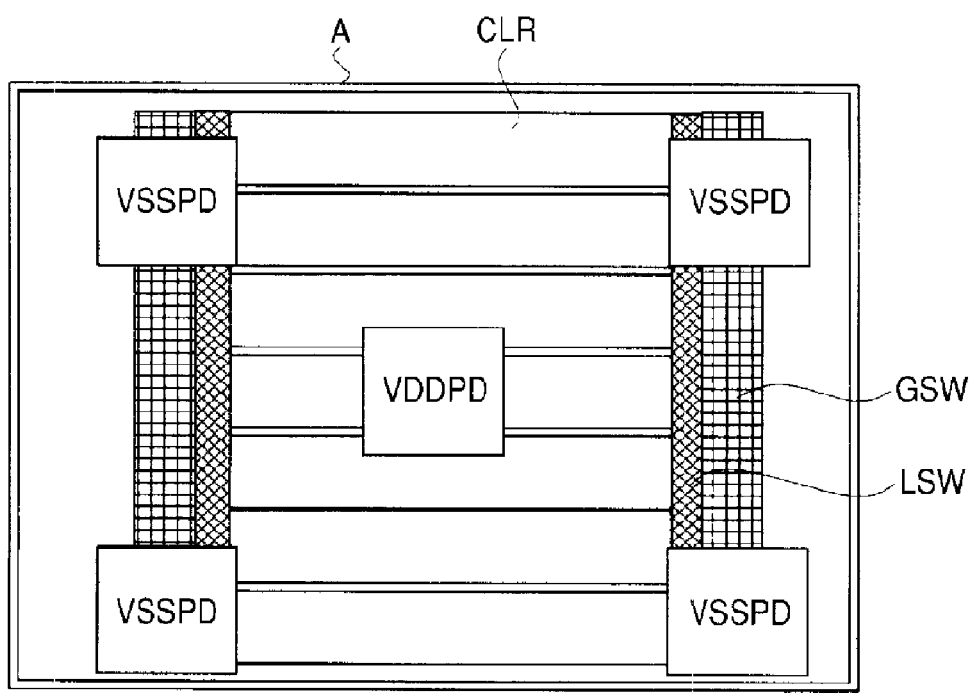
FIG. 34 is a drawing illustrating an example of layout of global power switches and local power switches.

Description will be given to the layout of global power switches GSW and local power switches LSW. FIG. 34 illustrates an example of the layout of global power switches GSW and local power switches LSW. As illustrated in FIG. 34, global power switch rows (global power switches GSW) and local power switch rows (local power switches LSW) can be disposed in parallel with each other adjacently to both ends of the multiple cell rows CLR forming functional block A. Reference pads VSSPD are disposed directly above the global power switches GSW and the local power switches LSW. This makes it possible to obtain the same effect as of the second embodiment. A power supply pad VDDPD is disposed in the center of the cell rows CLR.

Figure 35:
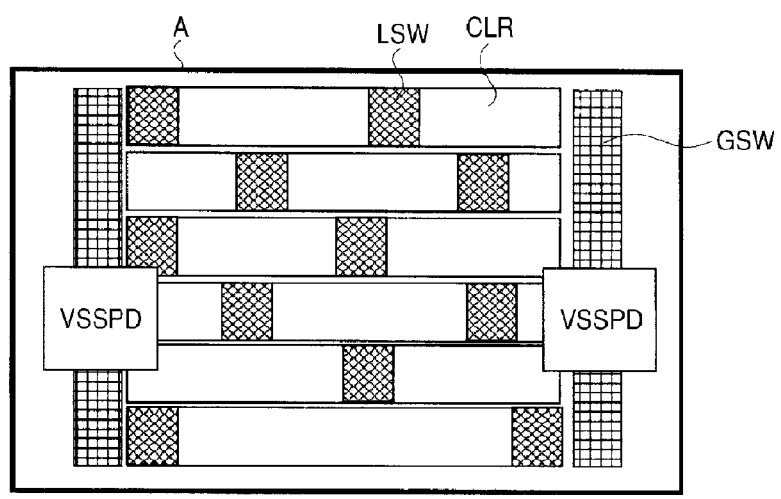
FIG. 35 is a drawing illustrating an example of layout of global power switches and local power switches.

FIG. 35 illustrates an example of the layout of global power switches. GSW and local power switches LSW. As illustrated in FIG. 35, global power switch rows (global power switches GSW) are disposed at both ends of the cell rows CLR forming functional block A; and local power switch rows (local power switches LSW) are dispersedly disposed in the multiple cell rows CLR. The global power switches GSW and the local power switches LSW can also be disposed as mentioned above. The local power switches LSW are formed of a thin-film MISFET. For this reason, they can be easily formed in cell rows CLR and thus the above-mentioned disposition can be achieved. That is, internal circuits formed in cell rows CLR are also formed of a thin-film MISFET; therefore, the local power switches LSW can be formed using part of these thin-film MISFETs. Reference pads VSSPD are disposed directly above global power switch rows (global power switches GSW).

Figure 36:
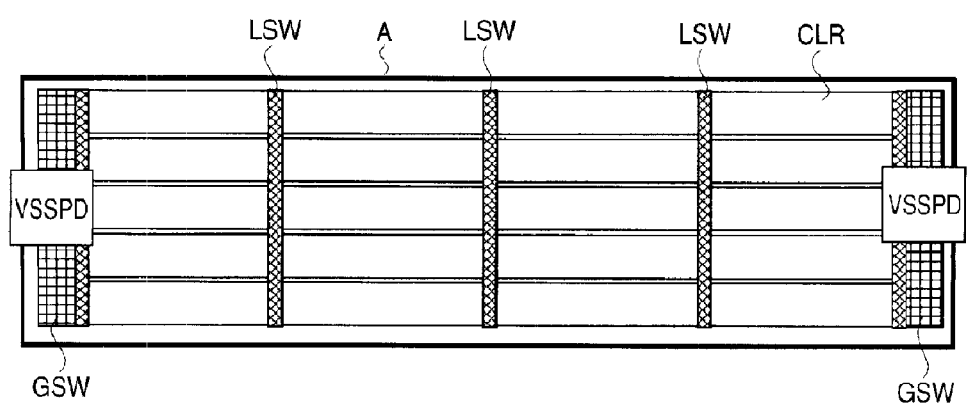
FIG. 36 is a drawing illustrating an example of layout of global power switches and local power switches.

FIG. 36 illustrates an example of the layout of global power switches GSW and local power switches LSW. As illustrated in FIG. 36, global power switch rows (global power switches GSW) are disposed at both ends of the cell rows CLR forming functional block A; and local power switch rows (local power switches LSW) are disposed in the multiple cell rows CLR. A difference between FIG. 36 and FIG. 35 is as follows: in the example in FIG. 35, the local power switches LSW are disposed in a checkered pattern in the cell rows CLR; and in the example in FIG. 36, the local power switch rows (local power switches LSW) formed in the cell rows CLR are so formed that they are extended in parallel with the global power switch rows (global power switches GSW). That is, in the layout illustrated in FIG. 36, the cell rows CLR are segmented by the local power switch rows (local power switches LSW). Reference pad VSSPD are disposed directly above the global power switch rows (global power switches GSW) formed at both ends of the cell rows CLR.

Figure 37:
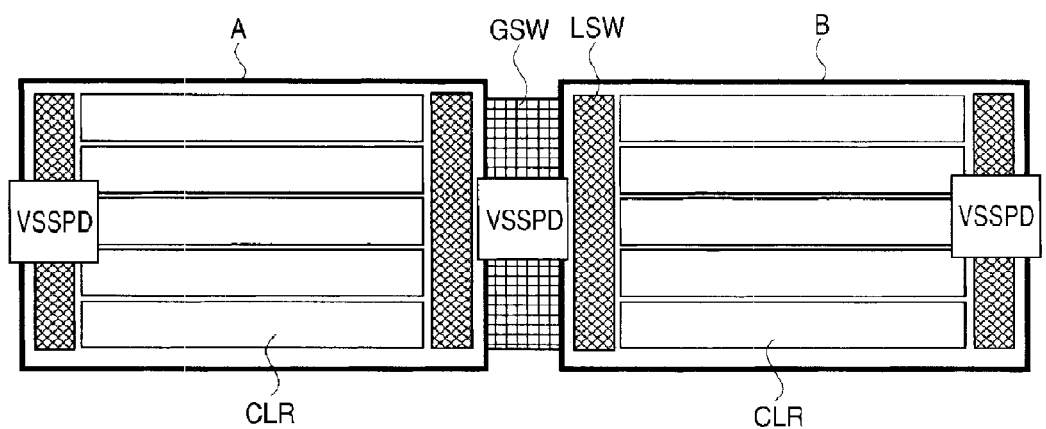
FIG. 37 is a drawing illustrating an example of layout of global power switches and local power switches.

FIG. 37 illustrates an example of the layout of global power switches GSW and local power switches LSW. As illustrated in FIG. 37, a global power switch row (global power switches GSW) is disposed between functional block A and functional block B. That is, a global power switch row (global power switches GSW) need not be disposed at both ends of functional block A or functional block B. Local power switch rows (local power switches LSW) are disposed at both ends of the cell rows CLR respectively forming functional block A and functional block B. Reference pads VSSPD are disposed directly above the global power switch row (global power switches GSW) or the local power switch rows (local power switches LSW).

Figure 38:
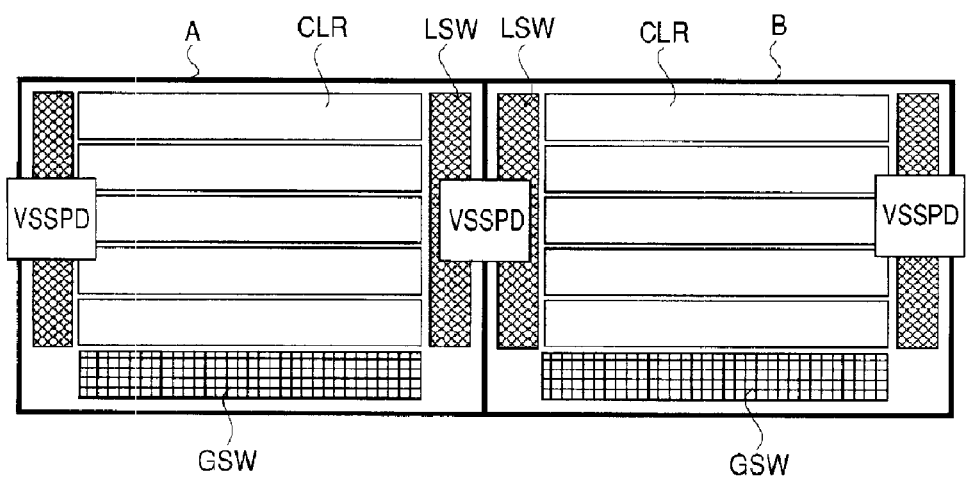
FIG. 38 is a drawing illustrating an example of layout of global power switches and local power switches.

FIG. 38 illustrates an example of the layout of global power switches GSW and local power switches LSW. As illustrated in FIG. 38, a local power switch row (local power switches LSW) is disposed at both ends of the cell rows CLR in each of functional block A and functional block B. Global power switch rows (global power switches GSW) are so disposed as to occupy one or more cell rows CLR. The global power switches GSW and the local power switches LSW can also be disposed as mentioned above. Reference pads VSSPD are disposed directly above the local power switch rows (local power switches LSW).

Figure 39:
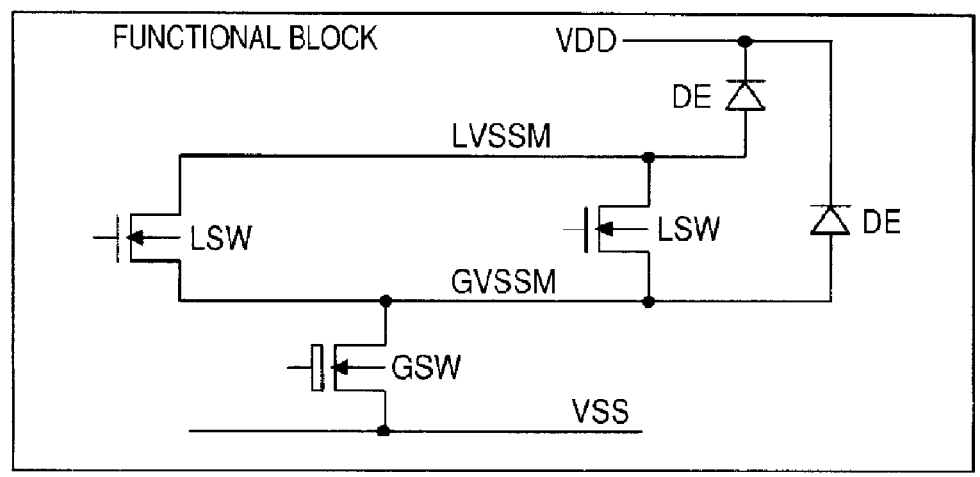
FIG. 39 is a drawing illustrating the relation of coupling between a global power switch, local power switches, and diodes.

Description will be given to an example where power switches are layered to form global power switches GSW and local power switches LSW and further diodes DE for surge resistance are formed. FIG. 39 illustrates the relation of coupling between a global power switch GSW, local power switches LSW, and diodes DE. In the example in FIG. 39, the global power switch GSW is coupled between a reference wire VSS and a global wire GVSSM; and the local power switches LSW are coupled between the global wire GVSSM and a local wire LVSSM. Though not shown in FIG. 39, an internal circuit (logic circuit) is formed between the local wire LVSSM and a power supply wire VDD. The reference wire VSS is coupled with a reference pad VSSPD (not shown), and the power supply wire VDD is coupled with a power supply pad VDDPD (not shown). Further, a diode DE is formed between the local wire LVSSM and the power supply wire VDD, and a diode DE is formed between the global wire GVSSM and the power supply wire VDD. With this arrangement, the following can be implemented: the switching of a functional block between operational state and non-active state can be elaborately controlled by providing global power switches GSW and local power switches LSW. Provision of diodes DE makes it possible to sufficiently protect internal circuits against surge voltage due to electrostatic discharge.

Figure 40:
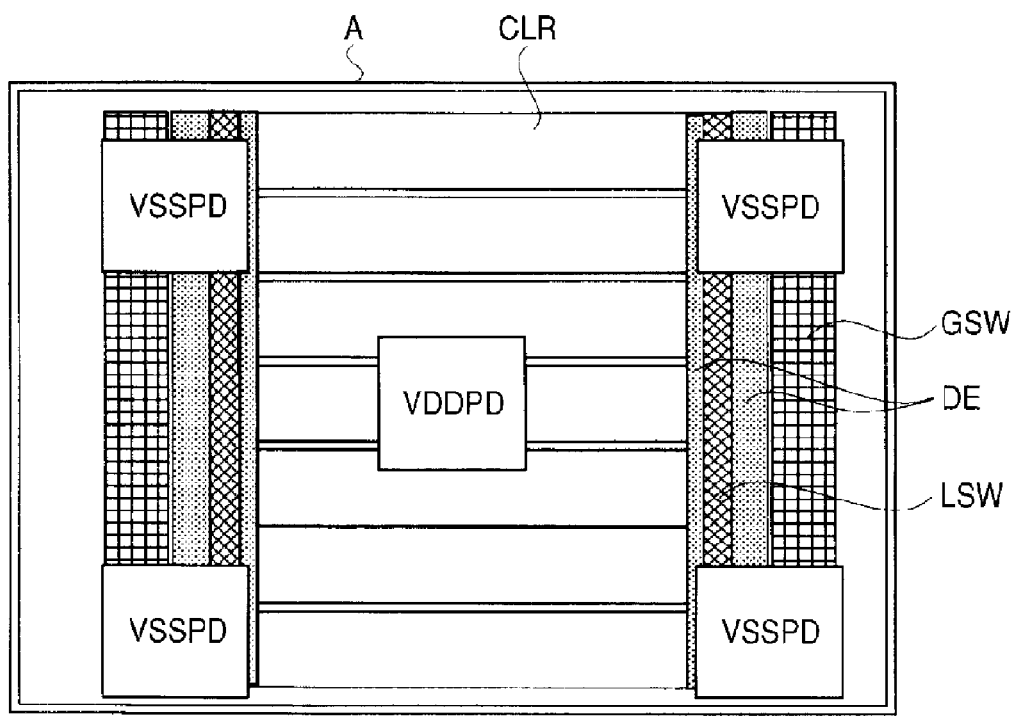
FIG. 40 is a drawing illustrating an example of layout of global power switches, local power switches, and diodes.

FIG. 40 illustrates an example of the layout of global power switches GSW, local power switches LSW, and diodes DE. As illustrated in FIG. 40, global power switch rows (global power switches GSW) and local power switch rows (local power switches LSW) can be disposed in parallel with each other adjacently to both ends of the multiple cell rows CLR forming functional block A. Further, diode rows (diodes DE) are formed in parallel with the global power switch rows (global power switches GSW) and the local power switch rows (local power switches LSW). Reference pads VSSPD are disposed directly above the global power switches GSW and the local power switches LSW. This makes it possible to obtain the same effect as of the second embodiment. A power supply pad VDDPD is disposed in the center of the cell rows CLR.

Figure 41:
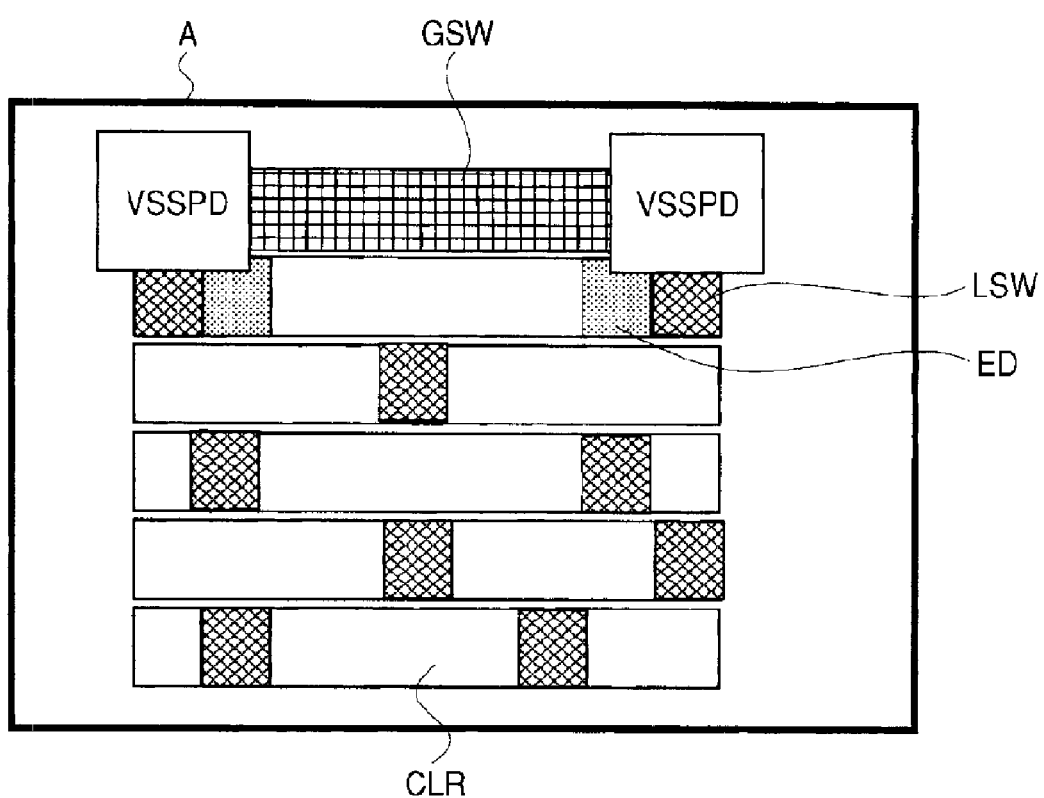
FIG. 41 is a drawing illustrating an example of layout of global power switches, local power switches, and diodes.

FIG. 41 illustrates an example of the layout of global power switches GSW, local power switches LSW, and diodes DE. As illustrate in FIG. 41, a global power switch row (global power switches GSW) is so formed as to occupy one or more of the multiple cell rows CLR forming functional block A. Local power switch rows (local power switches LSW) are dispersedly formed in the multiple cell rows CLR. The diodes DE are formed adjacently to local power switch rows (local power switches LSW). Thus, the disposition of the global power switches GSW, local power switches LSW, and diodes DE can be variously implemented.

(Seventh Embodiment)

Figure 42:
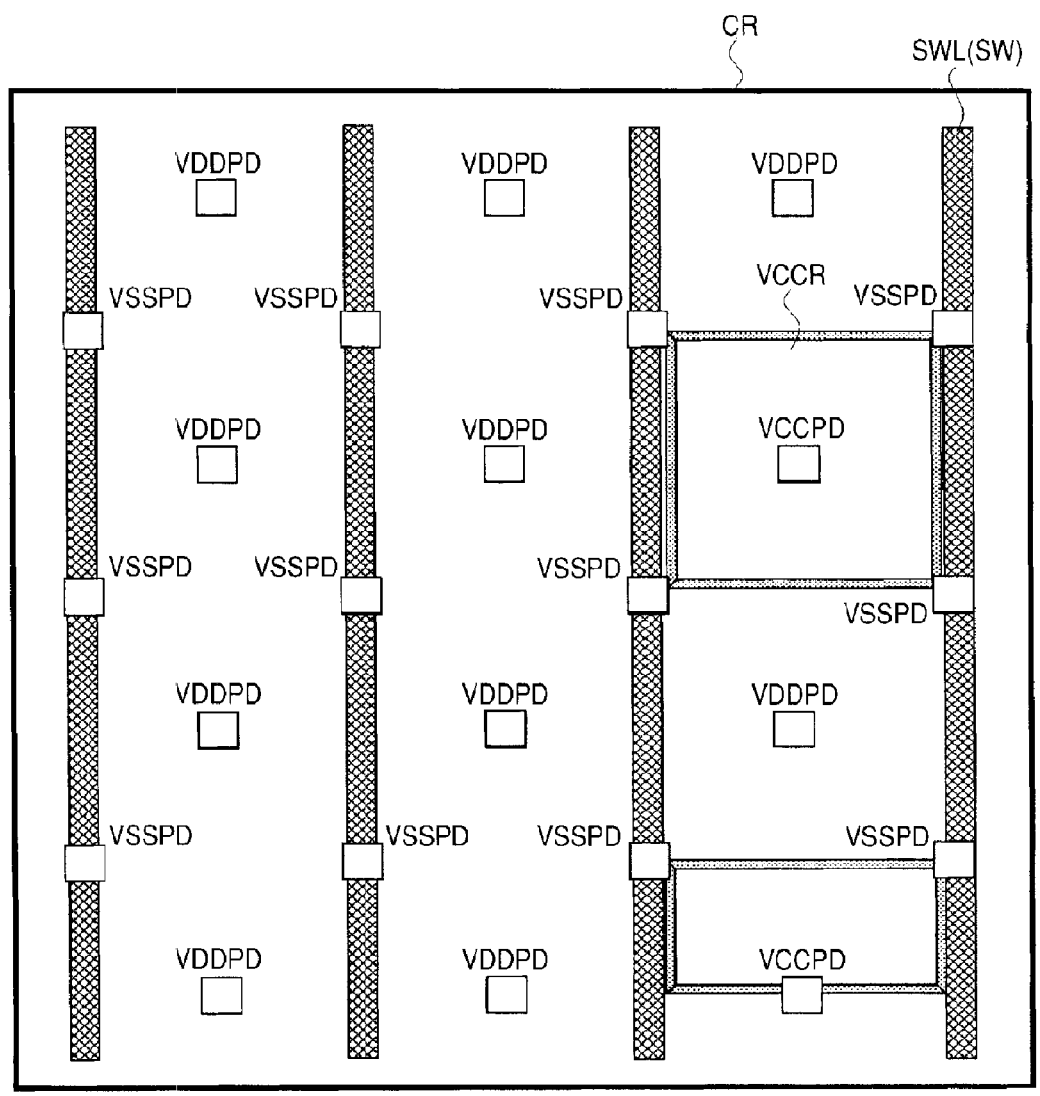
FIG. 42 is a plan view illustrating part of a core region of a semiconductor chip in a seventh embodiment.

In a seventh embodiment, a power supply pad VCCPD for supplying VCC power supply (e.g., 3.3V-power supply higher than VDD voltage) to a core region CR is also formed. FIG. 42 is a plan view illustrating part of the core region CR of a semiconductor chip in the seventh embodiment. In the core region CR, there are disposed power switch rows SWL, and reference pads VSSPD are formed directly above the power switch rows SWL. Power supply pads VDDPD are formed between adjoining power switch rows SWL. Each functional block exists in an area divided by power switch rows SWL. Many functional blocks formed in a core region operate on VDD potential (1.2V) and reference potential (0V). Power switch controllers and analog circuits formed in a core region operate on VCC potential (3.3V) and reference potential (0V). That is, analog circuits and the like use thick-film MISFETs and are driven by VCC potential (3.3V). When a power supply pad for supplying VCC potential (3.3V) is not provided over a core region CR in this case, it is required to supply VCC potential (3.3V) from an I/O region to the core region CR using a wire. Then, it is necessary to ensure an area for forming a wire for supplying VCC potential (3.3V) to the core region CR, and it is difficult to reduce the area of the semiconductor chip. In addition, the length of a wire running from the I/O region to the core region CR is increased; therefore, the wiring resistance is increased and a voltage drop in VCC potential (3.3V) becomes significant.

To cope with this, one of the features of the seventh embodiment is as follows: in addition to power supply pads VDDPD for supplying VDD potential (1.2V) and reference pads VSSPD for supplying reference potential, a power supply pad VCCPD for supplying VCC potential (3.3V) is also formed in a core region CR. As illustrated in FIG. 42, a circuit that operates on VCC potential (3.3V) is disposed in a region VCCR between power switches SW, and a power supply pad VCCPD is disposed over this region VCCR. The region VCCR is separated from areas where a circuit that operates on VDD potential (1.2V) is formed. VCC potential (3.3V) is supplied from this power supply pad VCCPD to the circuit formed in the region VCCR. Thus, VCC potential (3.3V) can be supplied from the power supply pad VCCPD formed in the core region CR to the circuit in the region VCCR; therefore, it is unnecessary to supply VCC potential (3.3V) from the I/O region to the core region CR using a wire. As a result, it is unnecessary to ensure an area for forming the wire for supplying VCC potential (3.3V) from the I/O region to the core region CR, and thus the area of the semiconductor chip can be reduced. Further, provision of the power supply pad VCCPD over the region VCCR shortens the length of a wire coupling together the power supply pad VCCPD and a circuit in the region VCCR. Thus, it is possible to reduce the wiring resistance and suppress a voltage drop. As a result, the reliability of the semiconductor device can be enhanced. The power switches SW are formed using thick-film MISFETs, and VCC potential (3.3V) to be applied to the gate electrodes of the thick-film MISFETs is required. The positioning of the power supply pad VCCPD for supplying VCC potential (3.3V) over the core region CR brings the advantage that the supply of VCC potential (3.3V) to the power switches SW is facilitated.

Figure 43:
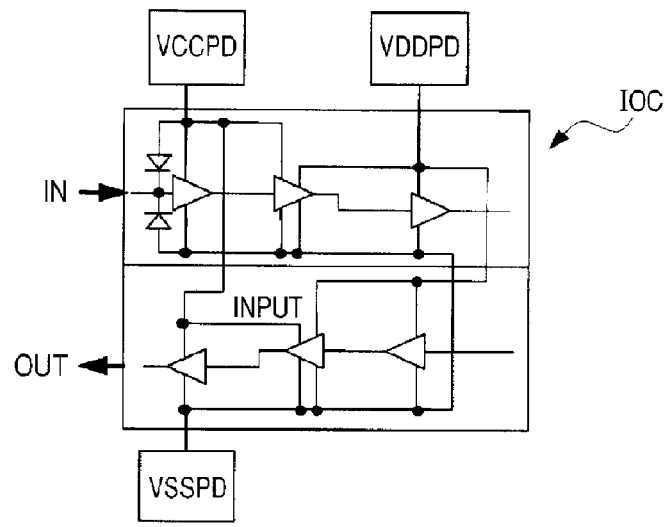
FIG. 43 is a circuit diagram illustrating an I/O circuit formed in an I/O region.

FIG. 43 is a circuit diagram illustrating an I/O circuit IOC formed in an I/O region. As illustrated in FIG. 43, the I/O circuit IOC is coupled with a reference pad VSSPD, a power supply pad VDDPD, and a power supply pad VCCPD. Reference potential, VDD potential (1.2V), and VCC potential (3.3V) are used to drive the I/O circuit IOC. Though not shown in the drawing, it is also coupled to a signal pad and an internal circuit formed in a core region. The I/O circuit IOC is so arranged that the following operation is performed: it is inputted with an input signal from a signal pad and outputs it to an internal circuit formed in the core region (IN); and further, it is inputted with a signal from an internal circuit and outputs an output signal to a signal pad (OUT). The I/O circuit IOC is comprised of, for example, a protection circuit for surge resistance, a level shifter circuit for conversion between VCC potential and VDD potential, an input/output circuit, and the like.

For example, reference pads VSSPD, power supply pads VDDPD, and the like are formed in the core region. and some signal pads can also be formed there. The signal pads are coupled to an I/O circuit IOC, and are coupled to an internal circuit in the core region through this I/O circuit IOC. To form a signal pad in the core region, therefore, it is required to take the following procedure: the signal pad formed in the core region is coupled to the I/O circuit IOC formed in the I/O region; and subsequently, it is led from the I/O circuit IOC formed in the I/O region and coupled to an internal circuit formed in the core region. For this reason, coupling the signal pad and the internal circuit through the I/O circuit IOC complicates the wiring structure. In the seventh embodiment, to cope with this, a signal pad is provided in the core region and further an I/O circuit IOC is also formed in the core region. This makes it possible to form the signal pad, I/O circuit IOC, and internal circuit in the core region. Therefore, it is possible to simplify the structure of the wire coupling together the signal pad, I/O circuit IOC, and internal circuit and further shorten the length of the wire, and this makes it possible to reduce the wiring resistance. That is, the seventh embodiment is characterized in that: an I/O circuit IOC, such as input/output circuit, that uses a power supply potential (VCC potential (3.3V)) higher than a power supply potential (VDD potential (1.2V)) used in the operation part CPU or the memory RAM is also formed in the core region CR.

Figure 44:
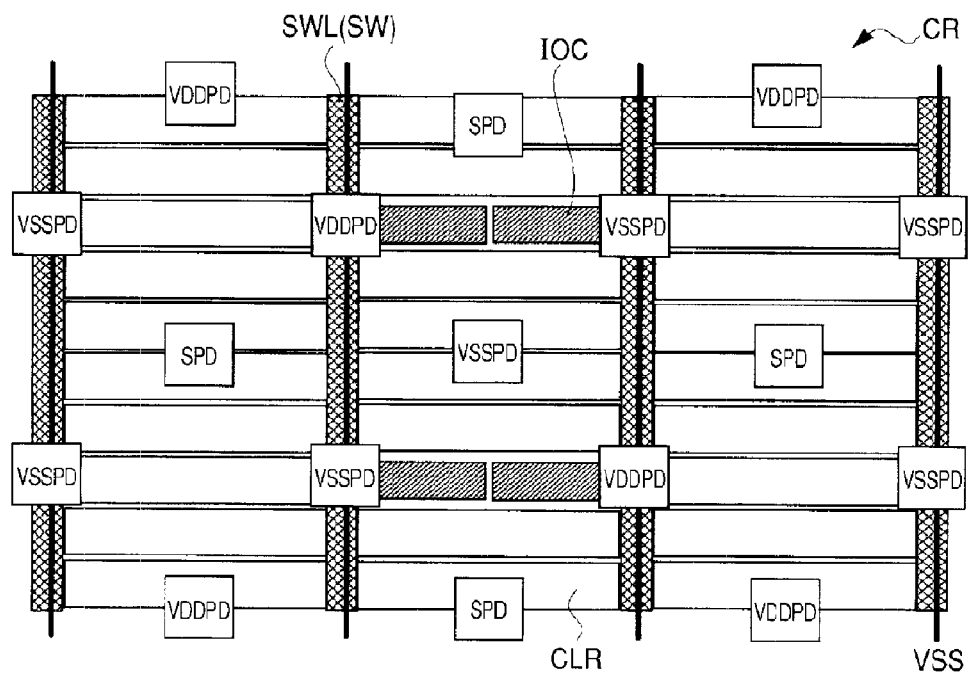
FIG. 44 is a drawing illustrating an example of a layout with which signal pads and I/O circuits are formed in a core region.

FIG. 44 illustrates an example of the layout in which signal pads and I/O circuits IOC are formed in a core region CR. As shown in the center of FIG. 44, power supply pads VDDPD and reference pads VSSPD are formed directly above power switch rows SWL; and a power supply pad VCCPD is formed between a pair of power switch rows SWL. Signal pads SPD are formed as pads adjacent to the power supply pad VCCPD. The I/O circuits IOC are so formed that they occupy specific cell rows CLR. As a result, the reference pads VSSPD, power supply pads VDDPD, power supply pad VCCPD, and signal pads SPD are disposed around the I/O circuits IOC, and these pads and the I/O circuits IOC are coupled together.

Figure 45:
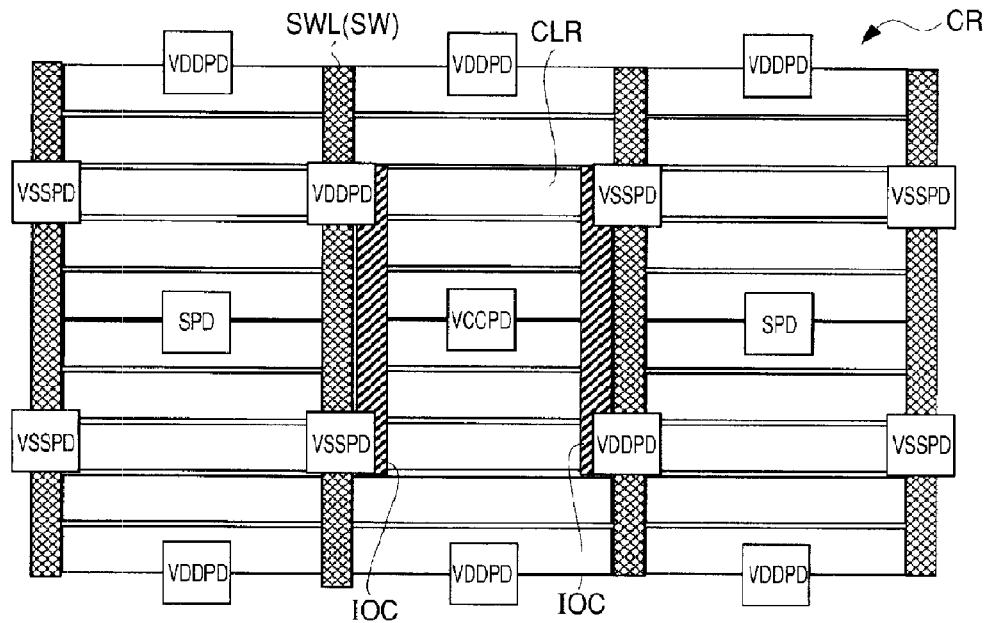
FIG. 45 is a drawing illustrating an example of a layout with which signal pads and I/O circuits are formed in a core region.
Figure 46:
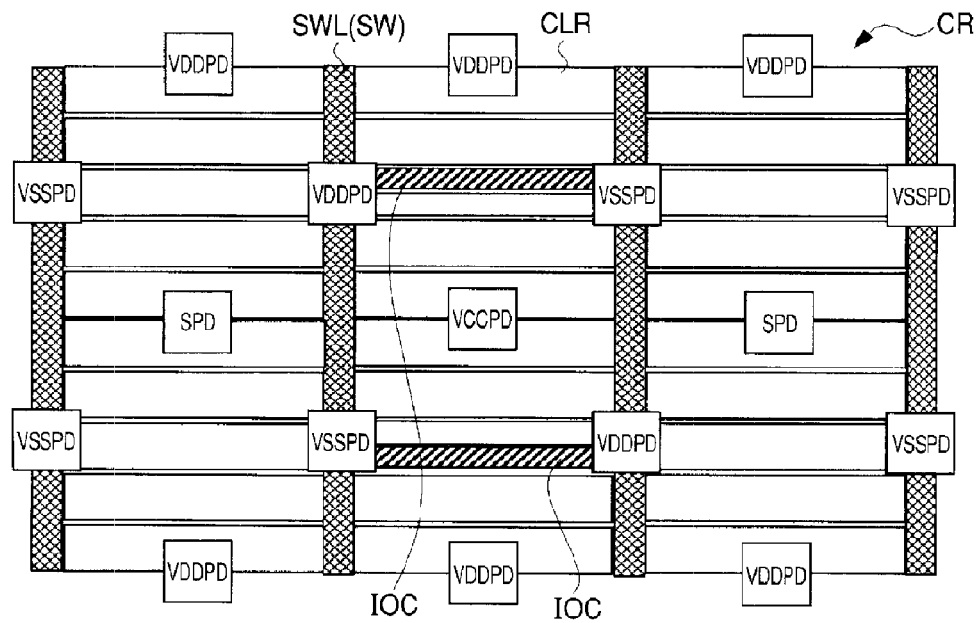
FIG. 46 is a drawing illustrating an example of a layout with which signal pads and I/O circuits are formed in a core region.

FIG. 45 illustrates an example of a layout in which signal pads and I/O circuits IOC are formed in a core region CR. A difference from FIG. 44 is the disposition of the I/O circuits IOC. While the I/O circuits IOC are formed in the lateral direction so that they occupy specific cell rows CLR in FIG. 44, they are so formed that they are in parallel with power switch rows SWL extended in the longitudinal direction in FIG. 45. As illustrated in FIG. 46, the I/O circuits IOC can also be disposed in the direction intersecting power switch rows SWL. Thus, the disposition of the I/O circuits IOC formed in the core region CR can also be variously implemented.

(Eighth Embodiment)

Figure 47:
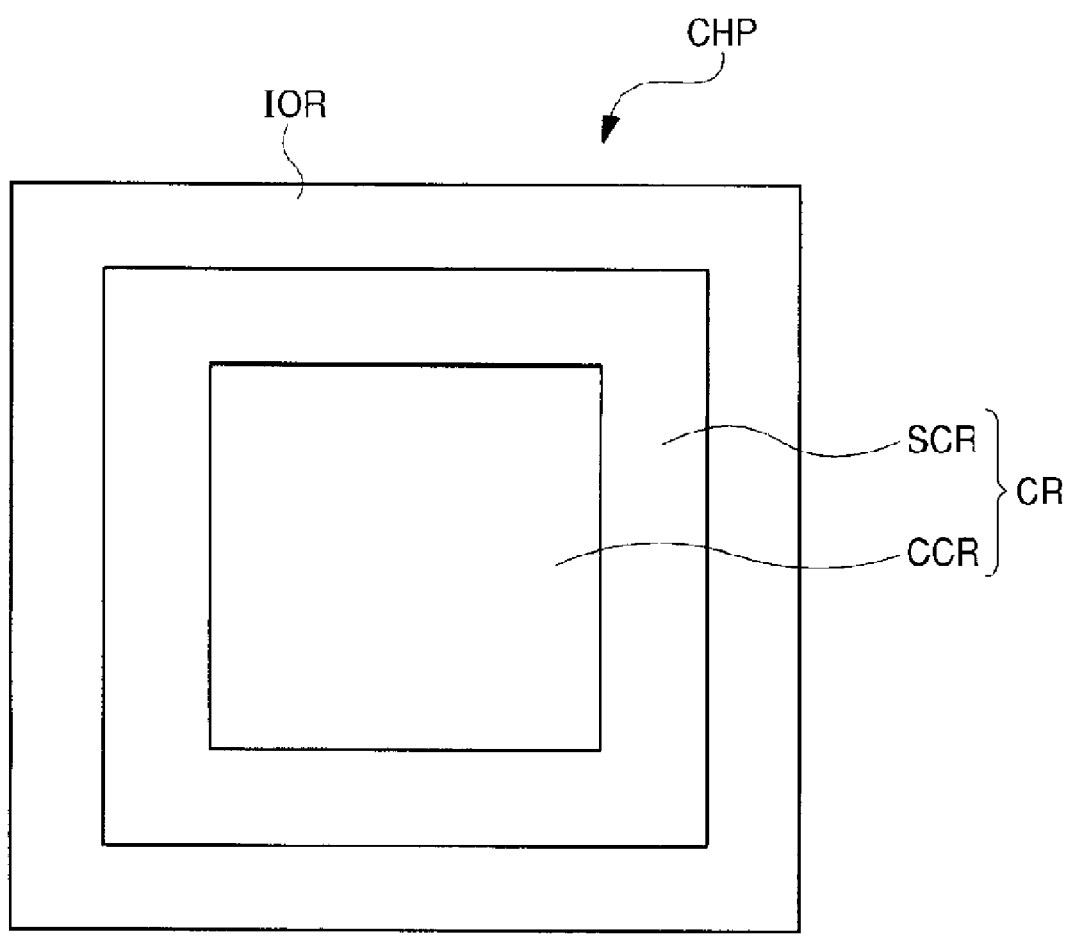
FIG. 47 is a schematic diagram illustrating the upper face of a semiconductor chip in an eighth embodiment.

The description of an eighth embodiment will be given to the positional relation between reference pads VSSPD, power supply pads VDDPD, and signal pads SPD disposed over a core region CR. FIG. 47 is a schematic diagram illustrating the upper face of a semiconductor chip CHP. As illustrated in FIG. 47, an I/O region IOR is formed in the peripheral portion of the semiconductor chip CHP, and a core region CR is formed in the area inside the I/O region IOR. This core region CR is comprised of a peripheral core region SCR and a central core region CCR.

Most of signal pads SPD are formed in an I/O region IOR but they are also formed in a core region CR in the eighth embodiment. Forming signal pads SPD in the core region CR as well as mentioned above makes it possible to reduce the number of signal pads formed in the I/O region IOR and contribute to downsizing of the semiconductor chip CHP. It is desirable that the signal pads SPD disposed in the core region CR should be formed mainly in the peripheral core region SCR of the core region CR. The reason for this is as follows: the signal pads SPD need be coupled with an I/O circuit formed in the I/O region IOR; therefore, shortening the distance between the I/O circuit and the signal pads SPD makes it possible to reduce signal delay and provide sufficient ESD (ElectroStatic Discharge) protection. The reference pads VSSPD and the power supply pads VDDPD are formed mainly in the central core region CCR as the central part of the core region CR. This is because this disposition makes it possible to shorten the distance between an internal circuit (functional block) disposed in the central part of the core region CR and the reference pads VSSPD and power supply pads VDDPD. That is, the resistance of the wires coupling together an internal circuit and the reference pads VSSPD or the power supply pads VDDPD can be reduced, and thus voltage fluctuation can be suppressed.

Figure 48:
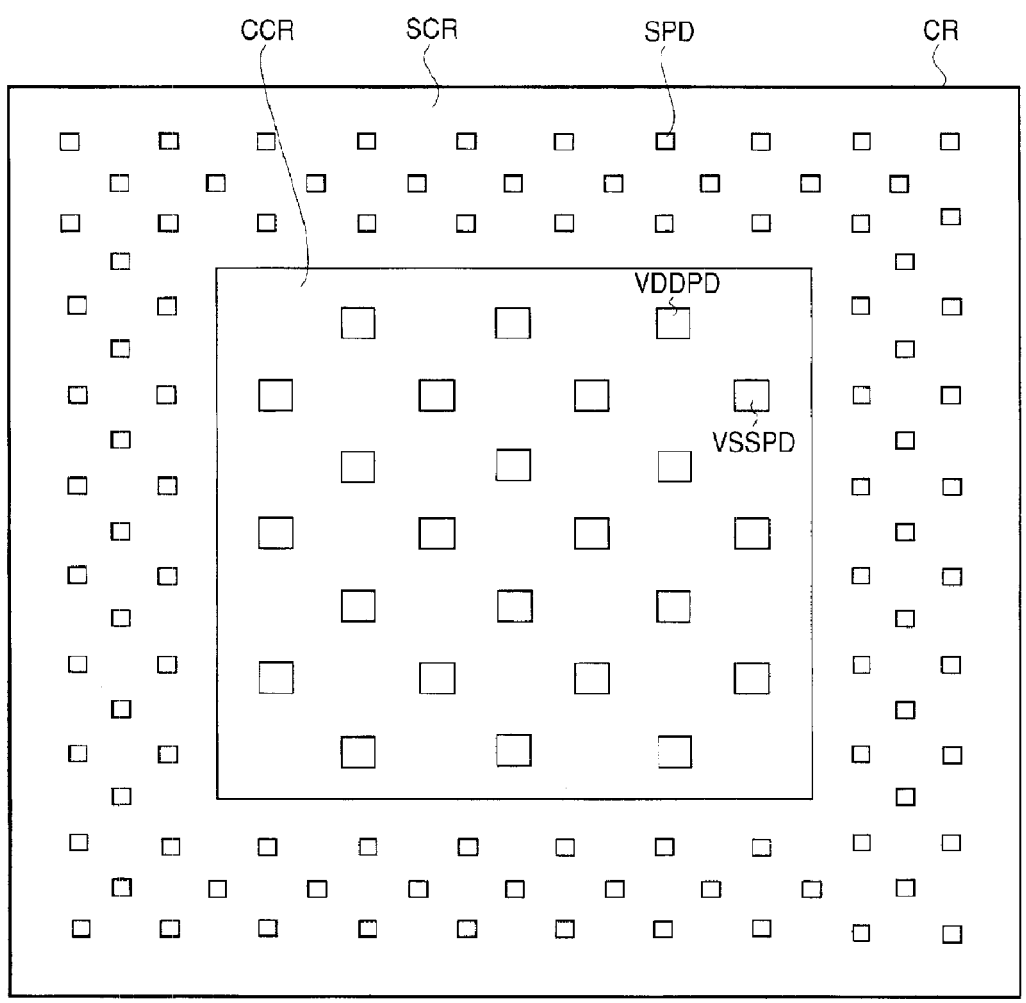
FIG. 48 is a drawing illustrating an example of the disposed positions of reference pads, power supply pads, and signal pads formed in a core region.

FIG. 48 illustrates an example of the disposed positions of reference pads VSSPD, power supply pads VDDPD, and signal pads SPD formed in a core region CR. As illustrated in FIG. 48, the signal pads SPD are formed in the peripheral core region SCR, and the reference pads VSSPD and the power supply pads VDDPD are formed in the central core region CCR. At this time, the reference pads VSSPD or the power supply pads VDDPD are larger than the signal pads SPD. This is because the signal pads SPD are large in number and it is required to ensure as many signal pads SPD disposed in the peripheral core region SCR as possible. The foregoing is also because it is required to ensure the certain current supplying capabilities of the reference pads VSSPD and the power supply pad VDDPD and it is desirable to enlarge them to a certain size or larger.

(Ninth Embodiment)

Figure 49:
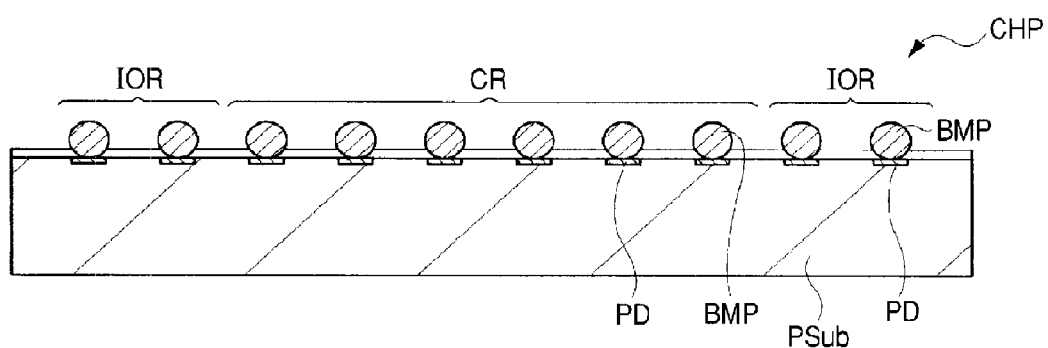
FIG. 49 is a sectional view illustrating an example of a semiconductor chip in a ninth embodiment.

The description of a ninth embodiment will be given to mounting methods for a semiconductor chip CHP. First, description will be given to face down bonding, one of methods for mounting a semiconductor chip CHP. FIG. 49 is a sectional view illustrating an example of a semiconductor chip CHP in the ninth embodiment. As illustrated in FIG. 49, pads PD are formed in the surface of a semiconductor substrate Psub. These pads PD are formed in both the core region CR and the I/O region IOR of the semiconductor chip CHP. For example, the pads PD formed in the core region CR are reference pads or power supply pads, and the pads PD formed in the I/O region IOR are signal pads. Bump electrodes BMP are formed over the pads PD formed in the core region CR and the I/O region IOR. The following arrangement may be adopted: rewiring is formed over the pads PD and bump electrodes are formed over the rewiring.

Figure 50:
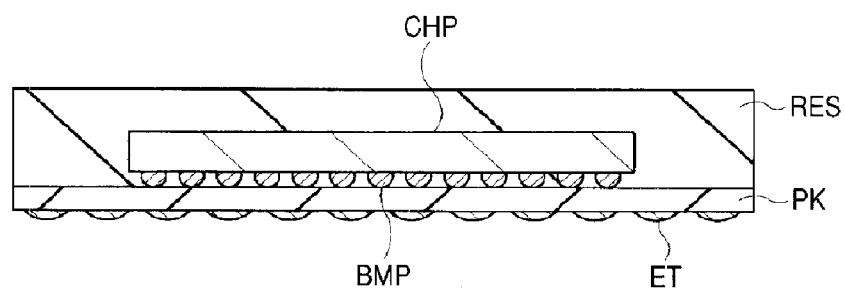
FIG. 50 is a sectional view illustrating how a semiconductor chip with bump electrodes formed over pads is mounted over a mounting board by face down bonding.

FIG. 50 is a sectional view illustrating how a semiconductor chip CHP with bump electrodes BMP formed over its pads PD is mounted over a mounting board PK by face down bonding. As illustrated in FIG. 50, external terminals ET are formed over one surface of the mounting board PK, and the semiconductor chip CHP is mounted over the other surface. Electrical coupling between the mounting board PK and the semiconductor chip CHP is implemented by coupling the bump electrodes BMP formed over the semiconductor chip CHP with terminals (not shown) formed over the surface of the mounting board PK. The semiconductor chip CHP is sealed with resin RES so that it is covered with the resin, and thus a semiconductor device is completed. As mentioned above, a semiconductor chip CHP with pads PD also formed in a core region CR can be mounted over a mounting board PK by face down bonding. Examples of this mounting method include BGA (Ball Grid Array) and the like. When pads PD are also formed in a core region CR as in the ninth embodiment, the method illustrated in FIG. 49 and FIG. 50 is suitable. That is, it is desirable to form bump electrodes BMP over the pads PD and mount the semiconductor chip CHP over a mounting board PK by face down bonding.

Figure 51:
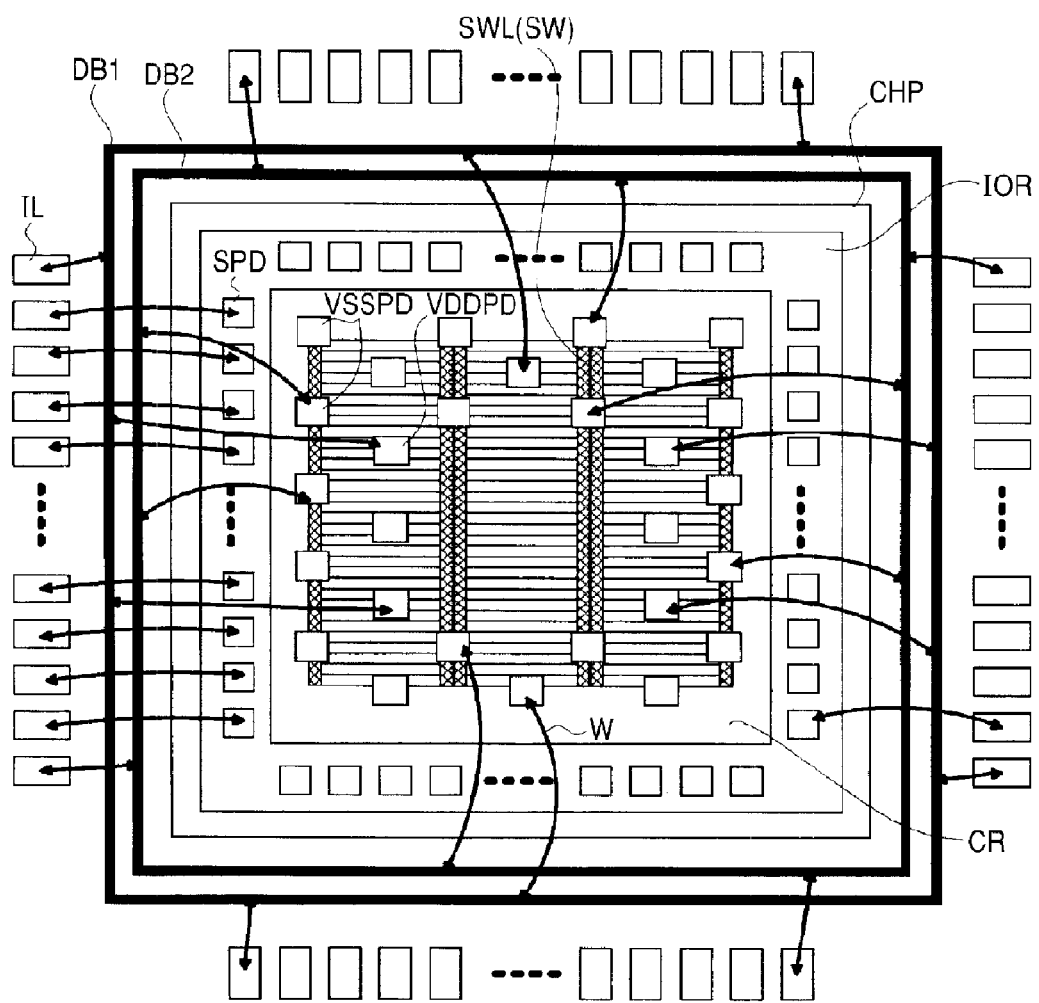
FIG. 51 is a drawing illustrating how a semiconductor chip is placed over a lead frame and the lead frame and the semiconductor chip are coupled together by wire bonding.

Description will be given to another method for mounting a semiconductor chip CHP. FIG. 51 illustrates how the semiconductor chip CHP is placed over a lead frame (mounting board) and the lead frame and the semiconductor chip CHP are coupled together by wire bonding. As illustrated in FIG. 51, the semiconductor chip CHP is formed over the lead frame, and a pair of power supply buses DB1, DB2 are formed in the lead frame so that they encircle the semiconductor chip CHP. The power supply bus DB1 is for supplying VDD potential (1.2V), and the power supply bus DB2 is for supplying reference potential (0V). Inner leads IL are formed outside the power supply bus DB1.

Meanwhile, signal pads SPD are formed in the I/O region IOR of the semiconductor chip CHP, and reference pads VSSPD and power supply pads VDDPD are formed in the core region CR of the semiconductor chip CHP. The reference pads VSSPD are disposed directly above power switch rows SWL, and the power supply pads VDDPD are disposed between adjoining power switch rows SWL. The lead frame and semiconductor chip CHP formed as mentioned above are coupled together through a wire W. More specific description will be given. The signal pads SPD formed in the I/O region IOR of the semiconductor chip CHP and inner leads IL formed in the lead frame are coupled together through a wire W. The power supply pads VDDPD formed in the core region CR and the power supply bus DB1 are coupled together through a wire W, and the reference pads VSSPD and the power supply bus DB2 are coupled together through a wire W. To supply VDD potential (1.2V) and reference potential to the power supply buses DB1, DB2, the power supply bus DB1 and the power supply bus DB2 are coupled with inner leads IL through a wire. In the ninth embodiment, as mentioned above, the reference pads VSSPD are supplied with reference potential by coupling together the reference pads VSSPD and the power supply bus DB2. That is, reference potential is not supplied to the reference pads VSSPD by coupling together the reference pads VSSPD and inner leads IL; reference potential is supplied to the reference pads VSSPD by coupling together the reference pads VSSPD and the power supply bus DB2. This arrangement brings the following advantages: first, use of the power supply bus DB2 produces the effect of wiring resistance reduction; and second, when the reference pads VSSPD and the power supply bus DB2 are coupled together through a wire W, the wire W can be disposed in any position over the power supply bus DB2. This enhances the degree of freedom in coupling together the reference pads VSSPD and the power supply bus DB2, and the reference pads VSSPD and the power supply bus DB2 can be easily coupled together through a wire W. The above description has been given to the relation of coupling between the reference pads VSSPD and the power supply bus DB2. The same effect can also be obtained in the relation of coupling between the power supply pads VDDPD and the power supply bus DB1. The power supply buses DB1, DB2 are 100 µm or so in wiring width and several µm in film thickness and thus their resistance is significantly reduced.

Figure 52:
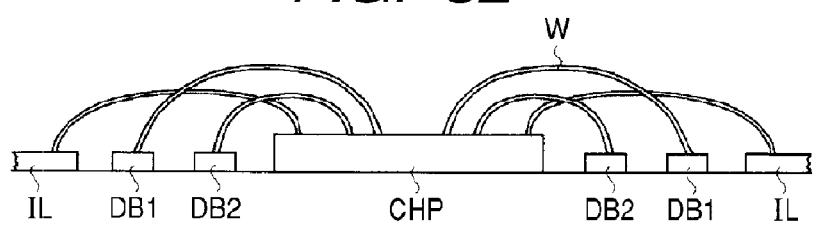
FIG. 52 is a side view illustrating how a semiconductor chip and power supply buses or inner leads are coupled together by wires.

FIG. 52 is a side view illustrating how a semiconductor chip CHP and power supply buses DB1, DB2 or inner leads IL are coupled together through a wire W. The following is apparent from FIG. 52: the peripheral portion (signal pads) of the semiconductor chip CHP and inner leads IL are coupled together through a wire W; and the central portion (reference pads, power supply pads) of the semiconductor chip CHP and the power supply buses DB1, DB2 are coupled together.

Figure 53:
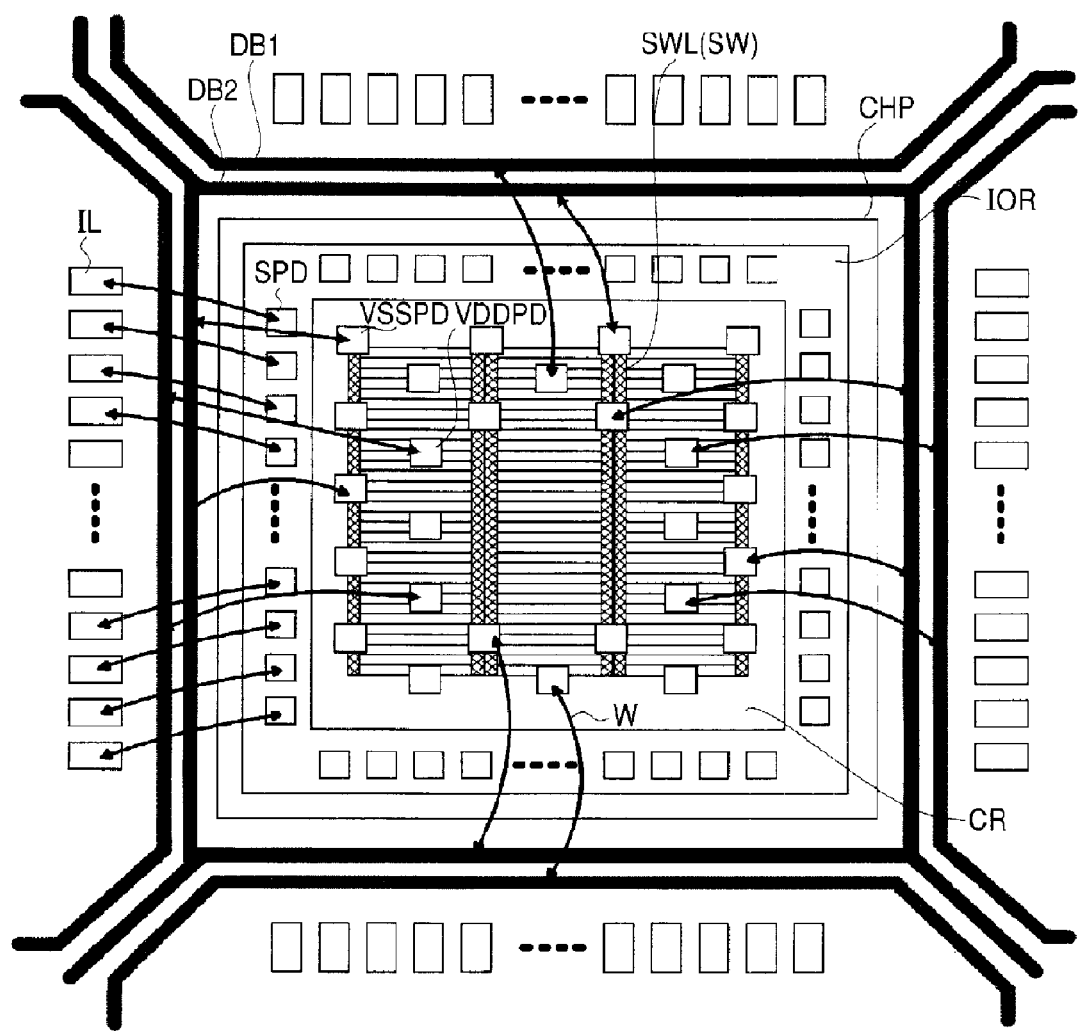
FIG. 53 is a drawing illustrating a modification to the semiconductor device illustrated in FIG. 51.

FIG. 53 illustrates a modification to the semiconductor device illustrated in FIG. 51. FIG. 53 and FIG. 51 are substantially identical with each other. A difference between FIG. 51 and FIG. 53 is as follows: in FIG. 51, the power supply buses DB1, DB2 are coupled with inner leads IL to supply VDD power supply potential and reference potential; and in FIG. 53, meanwhile, the power supply buses DB1, DB2 are coupled directly to external pins (not shown) to supply VDD power supply potential and reference potential. This arrangement that the power supply buses DB1, DB2 are coupled directly to external pins enables reduction in resistance.

As mentioned above, even when pads PD are also formed in a core region CR as in the ninth embodiment, the semiconductor chip CHP can be coupled to a mounting board by wire bonding as illustrated in FIG. 51 to FIG. 53. Examples of this mounting method include QFP (Quad Flat Package), QFN (Quad Flat non-leaded Package), and the like.

Up to this point, concrete description has been given based on the embodiments of the invention carried out by the present inventors. However, the invention is not limited to the above embodiments, and can be variously modified without departing from the subject matter of the invention, needless to add.

In the description of the above embodiments, cases where power switches SW are provided between reference wires VSS and wires VSSM, as illustrated in FIG. 2, are taken as examples. Even when the invention is so arranged that power switches SW are provided between power supply wires VDD and wires (hereafter, referred to as wire VDDM (not shown)), the same effect as of the above embodiments can be obtained. An example will be taken. Power switches SW are provided between power supply wires VDD and wires VDDM, and turn-on/off of the power switches SW are controlled. The supply of VDD potential to each functional block (internal circuit) formed in the core region and the interruption of this supply are thereby controlled. Each functional block can be thereby switched between operational state and non-active state. In the above embodiments, the supply of reference potential and the interruption of this supply are controlled by the power switches SW. The invention can also be applied to cases where the supply of VDD potential and the interruption of this supply are controlled by the power switches SW. For example, the description of the above embodiments has been given to the positional relation between reference pads VSSPD and power switch rows SWL. This positional relation between reference pads VSSPD and power switch rows SWL can be substituted by the relation between power supply pads VDDPD and power switch rows SWL.

This technology relates to semiconductor devices including a semiconductor chip so arranged that: the semiconductor chip has a core region and an input/output region formed outside the core region; in the core region, there are formed an operation part and a memory for holding data from the operation part; and in the input/output region, there is formed an input/output circuit for inputting/outputting data between the operation part or the memory formed in the core region and an external source. The semiconductor chip includes: (a) a reference wire for supplying reference potential to the operation part and the memory; (b) a first wire VDDM (fourth wire) for supplying a potential higher than reference potential to the operation part; (c) a second wire VDDM (fifth wire) for supplying a potential higher than reference potential to the memory; and (d) a VDD power supply wire (power supply wire) for supplying power supply potential. Further, it includes: (e) a power switch SW (third switch) for electrically coupling and decoupling the power supply wire and the first wire VDDM to and from each other; and (f) a power switch (fourth switch) for electrically coupling and decoupling the power supply wire and the second wire VDDM (fifth wire) to and from each other. In addition, it includes: (g) multiple power supply pads VDDPD (first pads) electrically coupled with the power supply wire; and (h) multiple reference pads VSSPD (second pads) electrically coupled with the reference wire. The semiconductor devices are characterized in that: the multiple power supply pads VDDPD (first pads) and the multiple reference pads VSSPD (second pads) are formed in the core region; and the power switch SW (third switch) and the power switch SW (fourth switch) are also formed in the core region. The positional relation between reference pads VSSPD and power switch rows SWL described with respect to the above embodiments can be applied to the positional relation between power supply pads VDDPD and power switch rows SWL described here.

As in the above embodiments, power switches SW (low-side switches) coupled between a reference pad VSSPD and a wire VSSM are generally formed of an n-type MISFET. Meanwhile, power switches SW (high-side switches) coupled between a power supply pad VDDPD and a wire VDDM are generally formed of a p-type MISFET. Since n-type MISFETs are higher in current driving force than p-type MISFETs, forming the power switches SW of n-type MISFETs can more reduce the area occupied by the power switches SW. Therefore, forming n-type MISFETs between a reference pad VSSPD and a wire VSSM as in the above embodiments brings the advantage that a semiconductor chip can be downsized.

N-type MISFETs may be used for high-side switches for size reduction. In this case, the logic for on/off control is the inverse of the case of p-type MISFETs. That is, the invention can be variously modified without departing from the subject matter of the invention, needless to add.

In the description of the above embodiments, SOCs are taken as examples. However, the invention is effective for the entire spectrum of semiconductor devices including microcomputers, nonvolatile semiconductor storage devices, and the like. Especially, it is effectively applicable to mobile devices of multi-function requiring power consumption reduction.

When the interruption of power supply to the analog circuit Alg2 is carried out by interrupting VCC power supply, it is essentially the interruption of power supply to a thick-film MISFET forming the analog circuit Alg2. (Examples of the above case includes cases where the following is carried out in the analog circuit Alg2 coupled between VCC potential and reference potential: the supply of reference potential and the interruption of this supply are carried out by power switches SW; or the supply of VCC potential and the interruption of this supply are carried out by power switches SW.) For this reason, the above operation is less effective than the interruption of a circuit in the core region CR comprised of a thin-film MISFET; however, the effect is obtained to some degree. More specific description will be given. Thick-film MISFETs are less in leakage current than thin-film MISFETs; however, a leakage current is produced even in thick-film MISFETs. Therefore, the power consumption of a semiconductor device can be reduced by interrupting the supply of reference potential (or VCC potential) to the analog circuit Alg2 not in operational state by power switches SW.

The power switches (n-type MISFETs) SW are for supplying reference potential to each functional block formed in the core region CR or interrupting this supply. For example, by driving the gate electrodes of these power switches (n-type MISFETs) SW with a potential higher than power supply potential supplied to each functional block, on-resistance can be reduced. Thus, a voltage drop due to the power switches SW can be reduced. As an example, it will be assumed that the operation part CPU, memory RAM, or the like is operated on VDD potential (1.2V) and reference potential (0V). In this case, on-resistance can be reduced by applying VCC potential (3.3V) to the gate electrodes of the power switches SW provided in the functional block for the operation part CPU, memory RAM, or the like. As an example, further, it will be assumed that a functional block for the analog circuit Alg2 or the like is operated on VCC potential (3.3V) and reference potential (0V). In this case, on-resistance can be reduced by applying a potential higher than VCC potential to the gate electrodes of the power switches SW provided in the functional block for the analog circuit Alg2 or the like to drive it. In this case, it is required to supply a potential higher than VCC potential. To cope with this, however, the arrangement described below may be adopted. That is, some analog circuits Alg2 can be driven by a potential (e.g., 2V or so) between VDD potential (1.2V) and VCC potential (3.3V). In this case, on-resistance can be reduced by applying VCC potential (3.3V) to the gate electrodes of the power switches SW. That is, the advantage that a potential higher than VCC potential (3.3V) need not be supplied is brought.

In the description of the above embodiments, cases where power switches SW are provided in pairs (at both ends of each functional block) have been taken as examples. This is intended to feed power from both sides of each functional block to reduce resistance. When each functional block (blocked region) is long and thin, for example, power switches SW may be disposed only on one side, needless to add. Even in this case, the effect can be obtained by disposing the reference pads VSSPD as in the above embodiments, needless to add.

In the above embodiments, VCC power supply potential for thick-film MISFETs and VDD power supply potentials for thin-film MISFETs are required as the power supply potential of the I/O region IOR. Therefore, pads for supplying both the potentials are also present over the I/O region IOR.

Signals that couple together blocked regions (individual functional blocks) become undefined when either functional block is blocked. To cope with this, placing a circuit for undefined propagation prevention (NAND circuit, etc.) in each functional block or taking other like means should be considered, needless to add.

Also, the invention can be applied to the following cases with respect to functional blocks, such as the operation part CPU and the memory RAM, that are operated on VDD potential and reference potential: cases where the functional block for the operation part CPU, the functional block for the memory RAM, and the like are respectively driven by different VDD potentials. In this case, a level shifter circuit or the like is required, for example, between the operation part CPU, the memory RAM, and the like, needless to add.

The invention can be widely applied to the manufacturing industry engaged in the manufacture of semiconductor devices.

What is claimed is:

1. A semiconductor device including a semiconductor chip having a core region and an input/output region formed outside the core region, so arranged that at least an operation part and a memory for holding data from the operation part are formed in the core region, and an input/output circuit for inputting/outputting data between the operation part or the memory formed in the core region and an external source is formed in the input/output region,
    wherein the semiconductor chip includes:
    (a) a first wire for supplying first power supply potential to the operation part and the memory;
    (b) a second wire for supplying a potential to the operation part;
    (c) a third wire for supplying a potential to the memory;
    (d) a fourth wire for supplying second power supply potential;
    (e) a first switch for electrically coupling and decoupling the second wire and the fourth wire to and from each other;
    (f) a second switch for electrically coupling and decoupling the third wire and the fourth wire to and from each other;
    (g) a plurality of first pads electrically coupled with the first wire; and
    (h) a plurality of second pads electrically coupled with the fourth wire, and
    wherein the first pads and the second pads are formed in the core region and the first switch and the second switch are also formed in the core region.

2. The semiconductor device according to claim 1,
    wherein control is carried out so that when the operation part is in operational state, the second wire and the fourth wire are electrically coupled to each other by the first switch so as to supply the second power supply potential to the second wire, and when the operation part is in non-active state, the second wire and the fourth wire are electrically decoupled from each other by the first switch so as not to supply the second power supply potential to the second wire, and
    wherein control is carried out so that when the memory is in operational state, the third wire and the fourth wire are electrically coupled to each other by the second switch so as to supply the second power supply potential to the third wire, and when the memory is in non-active state, the third wire and the fourth wire are electrically decoupled from each other by the second switch so as not to supply the second power supply potential to the third wire.

3. The semiconductor device according to claim 1,
    wherein a first switch row including a plurality of the first switches and the second pads or a second switch row including a plurality of the second switches and the second pads have areas planarly overlapping each other.

4. The semiconductor device according to claim 1,
wherein the distance between the first switch row including a plurality of the first switches and the second pads is not more than ¼ of the distance between the closest two of the second pads.

5. The semiconductor device according to claim 1,
wherein the distance between the second switch row including a plurality of the second switches and the second pads is not more than ¼ of the distance between the closest two of the second pads.

6. The semiconductor device according to claim 1,
wherein the first switch and the second switch are formed of an n-channel field effect transistor formed in a semiconductor substrate.

7. The semiconductor device according to claim 1,
wherein the operation part is formed in a rectangular operation part formation region formed in the core region, and
wherein in a pair of boundary regions defining the operation part formation region, there are formed a pair of first switch rows including the first switches and a pair of the second pads respectively planarly overlapping the pair of first switch rows and respectively electrically coupled to the pair of first switch rows.

8. The semiconductor device according to claim 7,
wherein the first pads are formed in the operation part formation region and formed in positions at equal distances from the pair of second pads.

9. The semiconductor device according to claim 1,
wherein a plurality of third pads are formed in the input/output region, and
wherein the third pads and the second pads are electrically coupled together.

10. The semiconductor device according to claim 1,
wherein a plurality of third pads are formed in the input/output region, and
wherein the third pads and the first pads are electrically coupled together.

11. The semiconductor device according to claim 1,
wherein a protection element is coupled between the first wire and the second wire and between the first wire and the third wire, and the protection elements are formed in the core region.

12. The semiconductor device according to claim 11,
wherein the protection elements are diodes.

13. The semiconductor device according to claim 1,
wherein the second wire is comprised of a global wire and a local wire, and
wherein the first switch is comprised of a local switch coupled between the local wire and the global wire and a global switch coupled between the global wire and the fourth wire.

14. The semiconductor device according to claim 13,
wherein the local switch and the global switch are formed of an n-channel field effect transistor, and
wherein the film thickness of the gate insulating film of the n-channel field effect transistor forming the local switch is smaller than the film thickness of the gate insulating film of the n-channel field effect transistor forming the global switch.

15. The semiconductor device according to claim 1,
wherein the first pads and the second pads formed in the core region are formed as bump electrodes.

16. The semiconductor device according to claim 1, comprising a mounting board for mounting the semiconductor chip,
wherein in the mounting board, a pair of power supply buses are formed so that the semiconductor chip mounted over the mounting board is encircled therewith, and
wherein one of the pair of power supply buses is coupled with the first pads using a wire, and the other of the pair of power supply buses is coupled with the second pads using a wire.

17. The semiconductor device according to claim 1,
wherein an input/output circuit is also formed in the core region.

18. The semiconductor device according to claim 1,
wherein an input/output circuit using a power supply potential higher than a power supply potential used in the operation part and the memory is also formed in the core region.

19. The semiconductor device according to claim 1,
wherein aside from the first pads and the second pads, a plurality of signal pads are formed in the core region.

20. The semiconductor device according to claim 19,
wherein the core region is comprised of a central core region and a peripheral core region positioned outside the central core region,
wherein the first pads and the second pads are formed in the central core region, and
wherein the signal pads are formed in the peripheral core region.

* * * * *